US008956736B2

(12) United States Patent
Matsunami et al.

(10) Patent No.: US 8,956,736 B2
(45) Date of Patent: Feb. 17, 2015

(54) ORGANIC ELECTROLUMINESCENT DEVICE AND DISPLAY APPARATUS

(75) Inventors: Shigeyuki Matsunami, Kanagawa (JP); Masayuki Kurotaki, Kanagawa (JP); Toshihiro Fukuda, Kanagawa (JP); Yasunori Kijima, Tokyo (JP); Akifumi Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 1210 days.

(21) Appl. No.: 11/954,531

(22) Filed: Dec. 12, 2007

(65) Prior Publication Data

US 2009/0039769 A1    Feb. 12, 2009

(30) Foreign Application Priority Data

Dec. 22, 2006  (JP) ................................. 2006-346064
Jun. 8, 2007   (JP) ................................. 2007-152329

(51) Int. Cl.
*H01J 1/63*   (2006.01)
*H01L 51/00*  (2006.01)
*H01L 51/50*  (2006.01)

(52) U.S. Cl.
CPC .......... *H01L 51/0056* (2013.01); *H01L 51/006* (2013.01); *H01L 51/50* (2013.01); *H01L 51/5048* (2013.01); *H01L 51/0054* (2013.01); *H01L 51/0059* (2013.01); *H01L 51/0067* (2013.01); *H01L 51/008* (2013.01); *H01L 51/0081* (2013.01); *Y10S 428/917* (2013.01)
USPC ......... 428/690; 428/917; 428/411.1; 313/504

(58) Field of Classification Search
USPC ...................................................... 428/690
See application file for complete search history.

(56) References Cited

U.S. PATENT DOCUMENTS

| 7,579,773 B2 * | 8/2009 | Forrest et al. ................. 313/504 |
| 2004/0209118 A1 * | 10/2004 | Seo et al. ...................... 428/690 |
| 2005/0057150 A1 * | 3/2005 | Kim et al. ..................... 313/504 |
| 2006/0019116 A1 * | 1/2006 | Conley et al. ................. 428/690 |
| 2006/0105198 A1 * | 5/2006 | Spindler et al. .............. 428/690 |
| 2006/0175966 A1 * | 8/2006 | Yamada et al. ............... 313/506 |

FOREIGN PATENT DOCUMENTS

| JP | 2000-026334 | | 1/2000 | |
| JP | 2003-055652 | | 2/2003 | |
| JP | 2004-134396 | | 4/2004 | |
| JP | 2004-214201 | | 7/2004 | |
| JP | 2004-311420 | | 11/2004 | |
| JP | 2004/339064 | * | 12/2004 | ............ C07C 211/57 |
| JP | 2004-339064 A | * | 12/2004 | ............ C07C 211/57 |
| JP | 2006-302506 | | 11/2006 | |
| WO | 2005091684 | | 9/2005 | |

OTHER PUBLICATIONS

Machine English translation of JP 2004-339064 A.*
Japanese Official Action issued on Apr. 21, 2009 in connection with Japanese Patent Application No. 2007-152329.

* cited by examiner

*Primary Examiner* — J. L. Yang
(74) *Attorney, Agent, or Firm* — Dentons US LLP

(57) ABSTRACT

An organic electroluminescent device for emitting red light is disclosed, including: an anode; a cathode; and an organic layer including a light emitting layer provided between the anode and the cathode, wherein the light-emitting layer contains a red light-emitting guest material and a host material composed of a polycyclic aromatic hydrocarbon compound having a skeleton with a 4 to 7 membered ring, and a photosensitizing layer containing a light-emitting guest material which generates blue light is provided adjacent to the light-emitting layer.

13 Claims, 12 Drawing Sheets

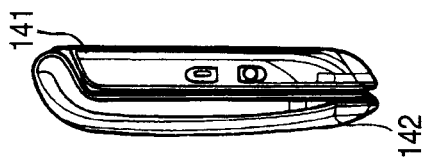
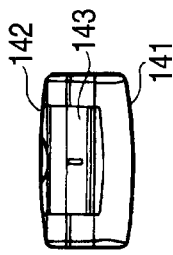
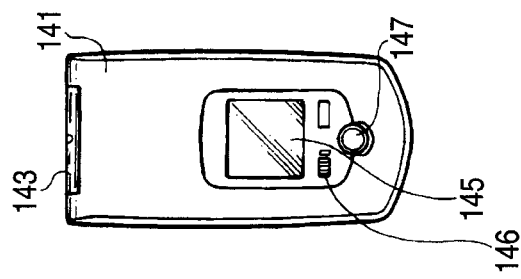
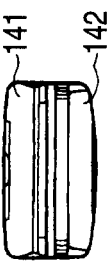
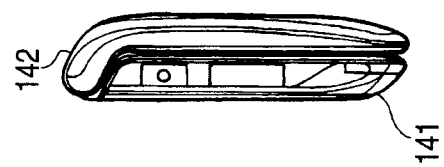
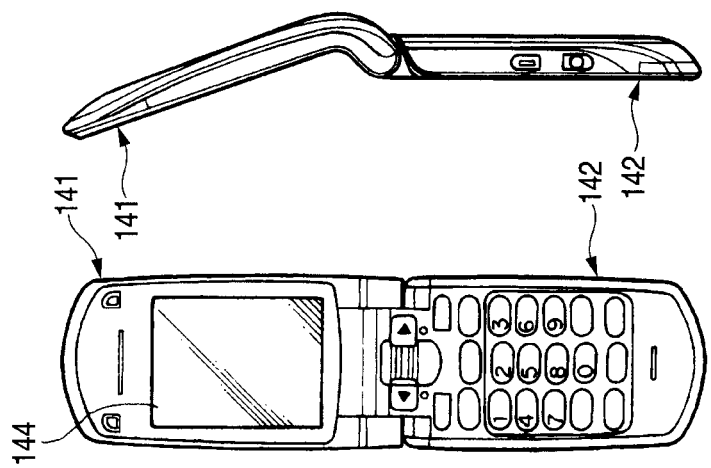
FIG. 12A FIG. 12B FIG. 12C FIG. 12D FIG. 12E FIG. 12F FIG. 12G

ORGANIC ELECTROLUMINESCENT DEVICE AND DISPLAY APPARATUS

CROSS REFERENCES TO RELATED APPLICATIONS

The present invention contains subjects related to Japanese Patent Applications JP 2006-346064 and JP 2007-152329 filed in the Japan Patent Office on Dec. 22, 2006 and Jun. 8, 2007, respectively, the entire contents of which being incorporated herein by reference.

BACKGROUND OF THE INVENTION

1. Field of the Invention

The present invention relates to an organic electroluminescent device and a display apparatus. In particular, the present invention relates to an organic electroluminescent device for emitting red light and a display apparatus using the same.

2. Description of the Related Art

In recent years, a display apparatus using an organic electroluminescent device (so-called "organic EL device") is watched as a lightweight flat panel type display apparatus with high efficiency.

The organic electroluminescent device which configures such a display apparatus is provided on a transparent substrate composed of, for example, a glass and is prepared by stacking an anode composed of ITO (indium tin oxide: transparent electrode), an organic layer and a cathode in this order from the substrate side. The organic layer has a configuration in which a hole injection layer, a hole transport layer and an electron transporting light-emitting layer are stacked in this order from the anode side. In the thus configured organic electroluminescent device, an electron injected from the cathode and a hole injected from the anode are recombined in the light-emitting layer, and light which is generated during this recombination is extracted from the substrate side via the anode.

In addition to an organic electroluminescent device having the foregoing configuration, the organic electroluminescent device also includes a so-called top emission type which is configured by stacking a cathode, an organic layer and an anode in this order from a substrate side and in which by further configuring an electrode positioned in an upper portion (an upper electrode as the cathode or anode) by a transparent material, light is extracted from the upper electrode side on an opposite side to the substrate. In particular, in a display apparatus of an active matrix type which is prepared by providing a thin film transistor (TFT) on a substrate, a so-called top emission structure in which an organic electroluminescent device of a top emission type is provided on the substrate having TFT formed thereon is advantageous in view of enhancing an aperture ratio of a light-emitting portion.

Now, in the case of taking into consideration practical implementation of an organic EL display, not only an enhancement of light extraction by widening the aperture of an organic electroluminescent device but an enhancement of luminous efficiency of the organic electroluminescent device is necessary. Then, various materials and layer configurations for the purpose of improving the luminous efficiency have been investigated.

For example, so far as a red light-emitting device is concerned, there has been proposed a configuration in which a naphthacene derivative (including rubrene derivatives) is used as a dopant material with respect to a new red light-emitting material in place of a pyran derivative represented by DCJTB which has hither to been known (see, for example, JP-A-2000-26334 and JP-A-2003-55652 (especially paragraphs [0353] to [0357] and Table 11).

JP-A-2003-55652 also proposes a configuration for obtaining white emission by stacking a second light-emitting layer containing a penylene derivative and an anthracene derivative on a first light-emitting layer using a rubrene derivative as a dopant material.

Furthermore, there is proposed a configuration for obtaining white emission by doping a rubrene derivative on an electron transport layer or a hole transport layer which is disposed adjacent to a blue light-emitting layer (see JP-A-2004-134396).

SUMMARY OF THE INVENTION

In the foregoing display apparatus, in order to perform full-color display, organic electroluminescent devices of respective colors which undergo emission of the three primary colors (red, green and blue) are aligned and used, or a white light-emitting organic electroluminescent device and color filters or color conversion layers of respective colors are combined and used. Of these, from the viewpoint of light extraction efficiency of light-emitting light, the configuration using organic electroluminescent devices which undergo emission of the respective colors is advantageous.

However, in the emission of the red light-emitting device using the foregoing naphthacene derivative (rubrene derivative), the current efficiency is about 6.7 cd/A, and the light-emitting color was concerned with orange emission rather than red emission.

Then, it is desirable to provide an organic electroluminescent device for emitting red light having sufficiently satisfactory luminous efficiency and color purity and a display apparatus using the same.

An organic electroluminescent device according to an embodiment of the present invention is an organic electroluminescent device for emitting red light including: an anode; a cathode; and an organic layer including a light emitting layer provided between the anode and the cathode. This light-emitting layer contains a red light-emitting guest material and a host material composed of a polycyclic aromatic hydrocarbon compound having a skeleton with a 4 to 7 membered ring. Also, a photosensitizing layer containing a light-emitting guest material which generates blue light is provided adjacent to this light-emitting layer.

As described in detail in the Examples as described later, it has been noted that in the thus configured organic electroluminescent device, not only the current efficiency increases as compared with the configuration not provided with the photosensitizing layer, but only red light generated in the light-emitting layer is extracted from the device without being influenced by the photosensitizing layer containing the light-emitting material.

Also, according to an embodiment of the present invention, a display apparatus having a plural number of organic electroluminescent devices having the foregoing configuration aligned and provided on a substrate is provided.

In such a display apparatus, as described previously, since the display apparatus using an organic electroluminescent device with high brightness and color purity as a red light-emitting device is configured, it is possible to realize full-color display with high color reproducibility by combining it with other green light-emitting device and blue light-emitting device.

In accordance with the organic electroluminescent device according to an embodiment of the present invention as described previously, it is possible to attain an enhancement of the luminous efficiency of red light while keeping color purity.

Also, in accordance with the display apparatus according to an embodiment of the present invention, it is possible to realize full-color display with high color reproducibility by configuring a pixel through a set of a green light-emitting device and a blue light-emitting device as well as an organic electroluminescent device which becomes a red light-emitting device with high color purity and luminous efficiency as described previously.

BRIEF DESCRIPTION OF THE DRAWINGS

FIG. 9 is a view showing a digital camera to which an embodiment according to the present invention is applied, in which

FIGS. 12A to 12G are views showing a portable terminal unit, for example, a portable handset, to which an embodiment according to the present invention is applied, wherein FIG. 12A is a front view in an opened state; FIG. 12B is a side view thereof; FIG. 12C is a front view in a closed state; FIG. 12D is a left side view; FIG. 12E is a right side view; FIG. 12F is a top view; and FIG. 12G is a bottom view.

DETAILED DESCRIPTION OF THE PREFERRED EMBODIMENTS

Embodiments of the present invention are hereunder described in detail with reference to the accompanying drawings of an organic electroluminescent device and a display apparatus using the same by turns.

<<Organic Electroluminescent Device-1>>

Figure 1:
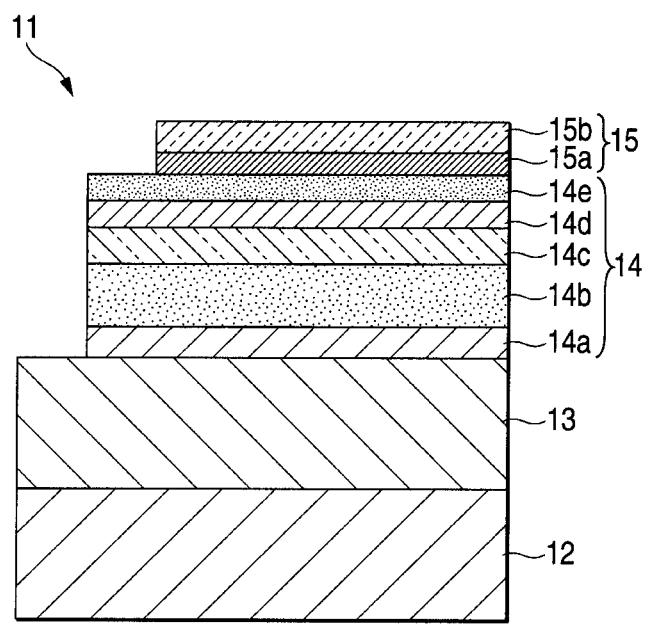
FIG. 1 is a cross-sectional view of an organic electroluminescent device according to an embodiment of the present invention.

FIG. 1 is a cross-sectional view schematically showing an organic electroluminescent device according to an embodiment of the present invention. An organic electroluminescent device 11 as illustrated in FIG. 1 is a stack of an anode 13, an organic layer 14 and a cathode 15 in this order on a substrate 12. Of these, the organic layer 14 is a stack of, for example, a hole injection layer 14a, a hole transport layer 14b, a light-emitting layer 14c, a photosensitizing layer 14d and an electron transport layer 14e in this order from the side of the anode 13.

In an embodiment according to the present invention, characteristic features reside in a configuration of the light-emitting layer 14c and a configuration of the photosensitizing layer 14d provided in contact therewith. On the assumption that the organic electroluminescent device 11 having such a stack configuration is configured as a device of a top emission type for extracting light from an opposite side to the substrate 12, details of each of the layers in this case are hereunder described in turn from the side of the substrate 12.

<Substrate>

The substrate 12 is a support in which the organic electroluminescent device 11 is aligned and formed on a side of the principal surface thereof. The substrate 12 may be made of a known material, and examples thereof include quartz, glass, metal foils and resin-made films or sheets. Of these, quartz and glass are preferable. In the case of a resin-made material, examples of the quality of the material include methacrylic resins represented by polymethyl methacrylate (PMMA); polyesters, for example, polyethylene terephthalate (PET) polyethylene naphthalate (PEN) and polybutylene naphthalate (PBN); and polycarbonate resins. It is important to employ a stack structure (multilayer structure) or surface treatment for controlling water permeability or gas permeability.

<Anode>

In order to efficiently inject a hole, an electrode material having a large work function from a vacuum level is used as the anode 13. Examples therein include metals (for example, aluminum (Al) chromium (Cr), molybdenum (Mo) tungsten (W), copper (Cu) silver (Ag) and gold (AU)) and alloys thereof; oxides of such a metal or alloy; an alloy of tin oxide ($SnO_2$) and antimony (Sb); ITO (indium tin oxide); InZnO (indium zinc oxide); an alloy of zinc oxide (ZnO) and aluminum (Al); and oxides of such a metal or alloy. These materials are used singly or in a mixed state.

The anode 13 may have a stack structure of a first layer with excellent light reflection properties having thereon a second layer having light transmittance and having a large work function.

The first layer is composed of an alloy containing aluminum as a main component. A sub-component thereof may be one containing at least one element having a relatively smaller work function than aluminum as the main component. Such a sub-component is preferably a lanthanoid series element. Though the work function of the lanthanoid series element is not large, when such an element is contained, not only the stability of the anode is enhanced, but hole injection properties of the anode are satisfied. In addition to the lanthanoid series element, an element, for example, silicon (Si) and copper (Cu) may be contained as the sub-component.

With respect to the content of the sub-component in the aluminum alloy layer which configures the first layer, for example, in the case of Nd, Ni, Ti, etc. for stabilizing aluminum, the content is preferably not more than about 10 wt % in total. Thus, it is possible to stably keep the aluminum alloy layer in a manufacturing process of an organic electroluminescent device while maintaining a refractive index of the aluminum alloy layer. Furthermore, it is possible to obtain working precision and chemical stability. Also, it is possible to improve the conductivity of the anode 13 and the adhesion to the substrate 12.

As the second layer, there can be exemplified a layer composed of at least one member of an oxide of an aluminum alloy, an oxide of molybdenum, an oxygen of zirconium, an oxide of chromium and an oxide of tantalum. Here, for example, in the case where the second layer is a layer composed of an oxide of an aluminum alloy (inclusive of a spontaneously oxidized film) containing a lanthanoid series element as a sub-component, because of a high transmittance of an oxide of the lanthanoid series element, the transmittance of the second layer containing this is good. For that reason, it is possible to maintain a high refractive index on the surface of the first layer. Furthermore, the second layer may be a transparent conductive layer of ITO (indium tin oxide), IZO (indium zinc oxide) or the like. Such a conductive layer is able to improve an electron injection characteristic of the anode 13.

In the anode 13, a conductive layer may be provided on a side thereof coming into contact with the substrate 12 for the purpose of enhancing the adhesion between the anode 13 and the substrate 12. Examples of such a conductive layer include a transparent conductive layer of ITO, IZO or the like.

When the drive mode of a display apparatus which includes this organic electroluminescent device 11 is an active matrix mode, the anode 13 is subjected to patterning for every pixel and provided in a state that it is connected to a driving thin film transistor provided on the substrate 12. In that case, configuration is made in such a manner that an insulating film (illustration of which is omitted) is provided on the anode 13 and that the surface of the anode 13 of each pixel is exposed from an aperture portion of this insulating film.

<Hole Injection Layer>

The hole injection layer 14a is provided for the purpose of enhancing the hole injection efficiency into the light-emitting layer 14c. Examples of a material of the hole injection layer 14a which can be used include heterocyclic conjugated monomers, oligomers or polymers of, for example, polysilane based compounds, vinylcarbazole based compounds, thiophene based compounds and aniline based compounds as well as benzin, styrylamine, triphenylamine, porphyrin, triphenylene, azatriphenylene, tetracyanoquinodimethane, triazole, imidazole, oxadiazole, polyarylalkanes, phenylenediamine, arylamines, oxazole, fullerene, anthracene, fluorenone, hydrazine, stilbene and derivatives thereof.

More specific examples of the material of the hole injection layer 14a include α-naphthylphenylphenylenediamine, porphyrin, metallic tetraphenylporphyrin, metallic naphthalocyanine, C60, C70, hexacyanoazatriphenylene, 7,7,8,8-tetracyanoquinodimethane (TCNQ), 7,7,8,8-tetra-cyano-2,3,5,6-tetra fluoroquinodimethane (F4-TCNQ), tetra-cyano-4,4,4-tris(3-methylphenylphenylamino)triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(p-phenylenevinylene), poly(thiophene), poly(thiophenevinylene) and poly(2,2'-thienylpyrrole). However, it should not be construed that the invention is limited thereto.

<Hole Transport Layer>

Similar to the hole injection layer 14a, the hole transport layer 14b is provided for the purpose of enhancing the hole injection efficiency into the light-emitting layer 14c. The hole transport layer 14b includes a material selected among the same materials as in the foregoing hole injection layer 14a.

<Light-Emitting Layer>

The light-emitting layer 14c is a region where a hole injected from the side of the anode 13 and an electron injected from the side of the cathode 15 are recombined at the time of applying a voltage to the anode 13 and the cathode 15. In the present embodiment, the configuration of this light-emitting layer 14c is one of the characteristic features. Namely, the light-emitting layer 14c uses a polycyclic aromatic hydrocarbon compound having a skeleton with a 4 to 7 membered ring as a host material, and this host material is doped with a red light-emitting guest material, whereby red light is generated.

Of these, the host material which configures the light-emitting layer 14c is a polycyclic aromatic hydrocarbon compound having a skeleton with a 4 to 7 membered ring and is selected among pyrene, benzopyrene, chrysene, naphthacene, benzonaphthacene, dibenzonaphthacene, perylene and coronene.

The host material which configures the light-emitting layer 14c is a polycyclic aromatic hydrocarbon compound having a skeleton with a 4 to 7 membered ring and is selected among pyrene, benzopyrene, chrysene, naphthacene, benzonaphthacene, dibenzonaphthacene, perylene and coronene.

Above all, it is preferred to use a naphthacene derivative represented by the following general formula (1) as the host material.

General Formula (1)

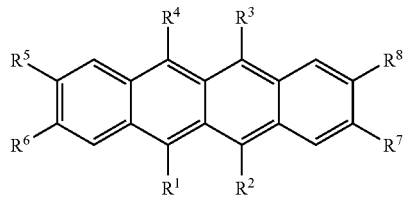

In the general formula (1), $R^1$ to $R^8$ each independently represents hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

Examples of the aryl group represented by $R^1$ to $R^8$ in the general formula (1) include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, an m-tolyl group, a p-tolyl group and a p-t-butylphenyl group.

Examples of the heterocyclic group represented by $R^1$ to $R^8$ include 5-membered or 6-membered aromatic heterocyclic groups containing O, N or S as a hetero atom and fused polycyclic aromatic heterocyclic groups having from 2 to 20 carbon atoms. Examples of aromatic heterocyclic groups and fused polycyclic aromatic heterocyclic groups include a thienyl group, a furyl group, a pyrrolyl group, a pyridyl group, a quinolyl group, a quinoxalyl group, an imidazopyridyl group and a benzothiazole group. Representative examples thereof include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 1-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthrydinyl group, a 2-phenanthrydinyl group, a 3-phenanthrydinyl group, a 4-phenanthrydinyl group, a 6-phenanthrydinyl group, a 7-phenanthrydinyl group, an 8-phenanthrydinyl group, a 9-phenanthrydinyl group, a 10-phenanthrydinyl group, a 1-acridinyl group, a 2-acridinyl group, a 3-acridinyl group, a 4-acridinyl group and a 9-acridinyl group.

As the amino group represented by $R^1$ to $R^8$, all of an alkylamino group, an arylamino group and an aralkylamino group are useful. It is preferable that these amino groups are an aliphatic group having from 1 to 6 carbon atoms in total and/or have from 1 to 4 aromatic carbon rings. Examples of such an amino group include a dimethylamino group, a diethylamino group, a dibutylamino group, a diphenylamino group, a ditolylamino group, a bisbiphenylylamino group and a dinaphthylamino group.

Two or more kinds of the foregoing substituents may form a fused ring, and these substituents may further have a substituent.

The naphthacene derivative represented by the foregoing general formula (1) is especially preferably a rubrene derivative represented by the following general formula (1a)

General Formula (1a)

In the general formula (1a), $R^{11}$ to $R^{15}$, $R^{21}$ to $R^{25}$, $R^{31}$ to $R^{35}$ and $R^{41}$ to $R^{45}$ each independently represents a hydrogen atom, an aryl group, a heterocyclic group, an amino group, an aryloxy group, an alkyl group or an alkenyl group. However, it is preferable that $R^{11}$, to $R^{15}$, $R^{21}$ to $R^{25}$, $R^{31}$ to $R^{35}$ and $R^{41}$ to $R^{45}$ are the same, respectively.

In the general formula (1a), $R^5$ to $R^8$ each independently represents a hydrogen atom, an optionally substituted aryl group or an optionally substituted alkyl group or alkenyl group.

In a preferred embodiment of the general formula (1a) the aryl group, the heterocyclic group and the amino group may be the same as those in $R^1$ to $R^8$ in the general formula (1). When $R^{11}$ to $R^{15}$, $R^{21}$ to $R^{25}$, $R^{31}$ to $R^{35}$ and $R^{41}$ to $R^{45}$ each represents an amino group, the amino group is an alkylamino group, an arylamino group or an aralkylamino group. It is preferable that these amino groups are an aliphatic group having from 1 to 6 carbon atoms in total or have from 1 to 4 aromatic carbon rings. Examples of such an amino group include a dimethylamino group, a diethylamino group, a dibutylamino group, a diphenylamino group, a ditolylamino group and a bisbiphenylylamino group.

As more specific other examples of the naphthacene derivative which is suitably used as the host material of the light-emitting layer 14c, there is exemplified rubrene of the following Compound (1)-1 which is one of the rubrene derivatives of the general formula (1a). Besides, the following Compounds (1)-2 to (1)-4 are exemplified.

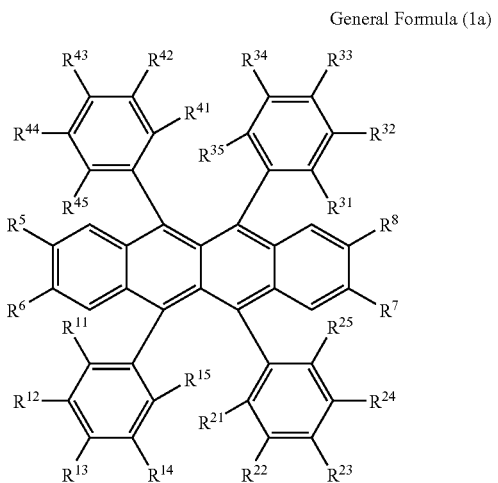

-continued

Compound (1)-4

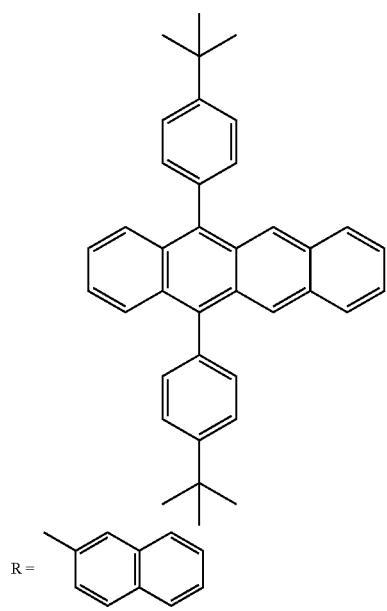

Also, a perylene derivative of the general formula (5) a diketopyrrolopyrrole derivative of the general formula (6) a pyromethene derivative of the general formula (7), a pyran derivative of the general formula (8) or a styryl derivative of the general formula (9) as described below is used as the red light-emitting guest material which configures the light-emitting layer 14c. Details of the red light-emitting guest material are hereunder described.

—Perylene Derivative—

For example, a compound represented by the following general formula (5) (diindeno[1,2,3-cd]perylene derivative) is used as the red light-emitting guest material.

General Formula (5)

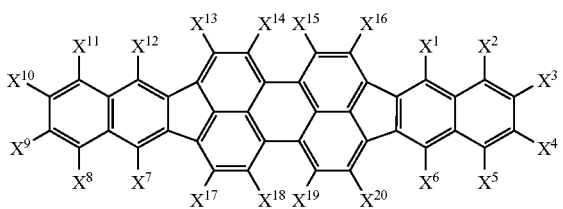

In the general formula (5), $X^1$ to $X^{20}$ each independently represents hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

Examples of the aryl group represented by $X^1$ to $X^{20}$ in the general formula (5) include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, an m-tolyl group, a p-tolyl group and a p-t-butylphenyl group.

Examples of the heterocyclic group represented by $X^1$ to $X^2$ include 5-membered or 6-membered aromatic heterocyclic groups containing O, N or S as a hetero atom and fused polycyclic aromatic heterocyclic groups having from 2 to 20 carbon atoms. Examples of such aromatic heterocyclic groups and fused polycyclic aromatic heterocyclic groups include a thienyl group, a furyl group, a pyrrolyl group, a pyridyl group, a quinolyl group, a quinoxalyl group, an imidazopyridyl group and a benzothiazolyl group. Representative examples include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 1-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthrydinyl group, a 2-phenanthrydinyl group, a 3-phenanthrydinyl group, a 4-phenanthrydinyl group, a 6-phenanthrydinyl group, a 7-phenanthrydinyl group, an 8-phenanthrydinyl group, a 9-phenanthrydinyl group, a 10-phenanthrydinyl group, a 1-acridinyl group, a 2-acridinyl group, a 3-acridinyl group, a 4-acridinyl group and a 9-acridinyl group.

As the amino group represented by $X^1$ to $X^{20}$, all of an alkylamino group, an arylamino group and an aralkylamino group are useful. It is preferable that these amino groups are an aliphatic group having from 1 to 6 carbon atoms in total and/or have from 1 to 4 aromatic carbon rings. Examples of such an amino group include a dimethylamino group, a diethylamino group, a dibutylamino group, a diphenylamino group, a ditolylamino group, a bisbiphenylylamino group and a dinaphthylamino group.

Two or more kinds of the foregoing substituents may form a fused ring, and these substituents may further have a substituent.

Specific examples of the diindeno[1,2,3-cd]perylene derivative which is suitably used as the red light-emitting guest material in the light-emitting layer 14c include the following Compound (5)-1 to (5)-8. However, it should be construed that the invention is not limited thereto at all.

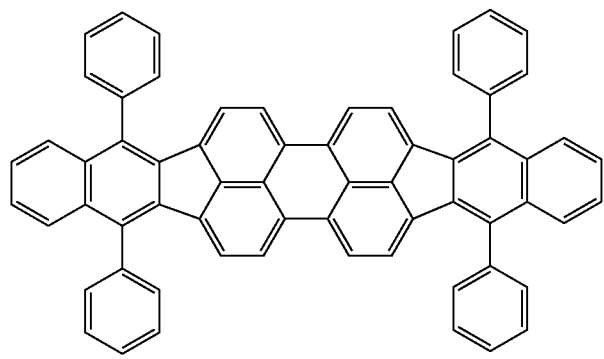
Compound (5)-1
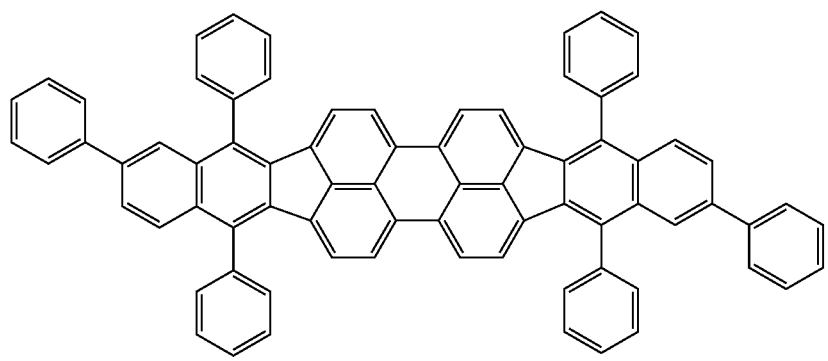
Compound (5)-2
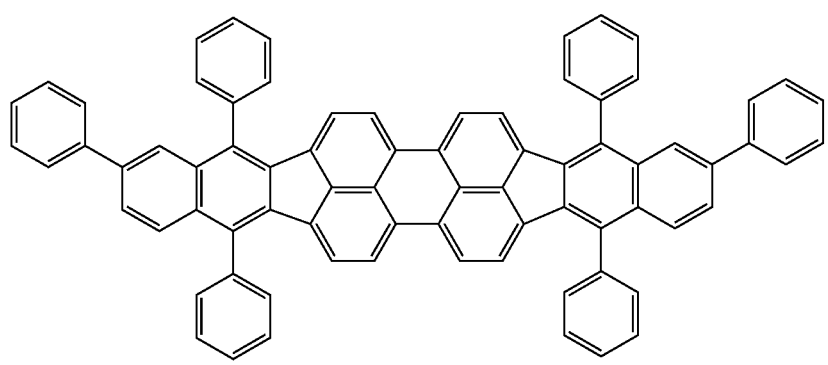
Compound (5)-3
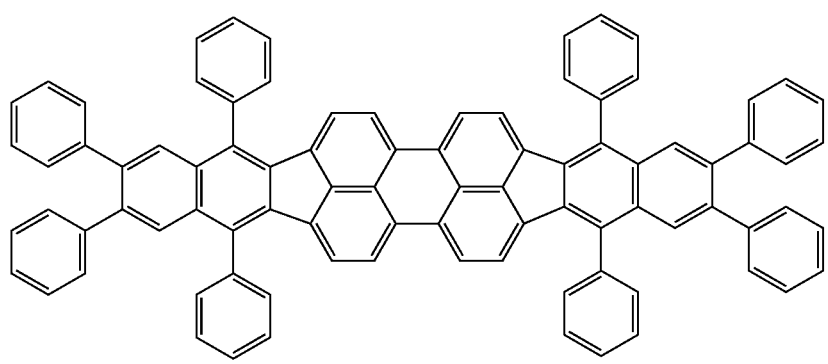
Compound (5)-4

Compound (5)-5
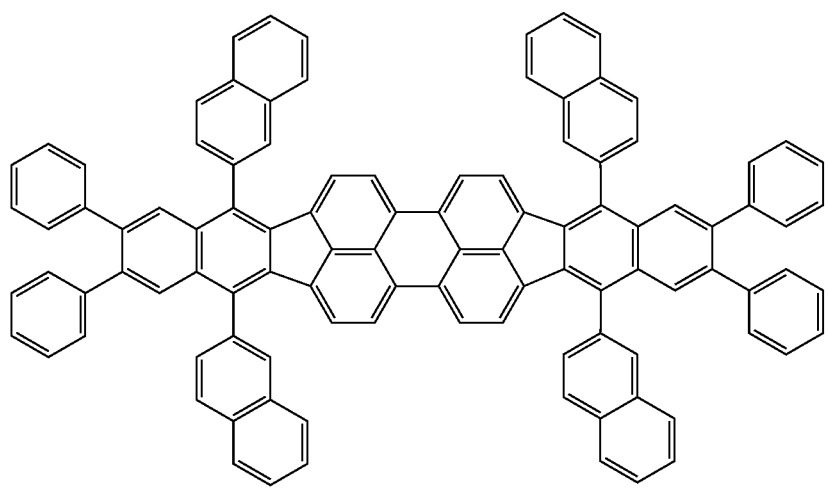
Compound (5)-6
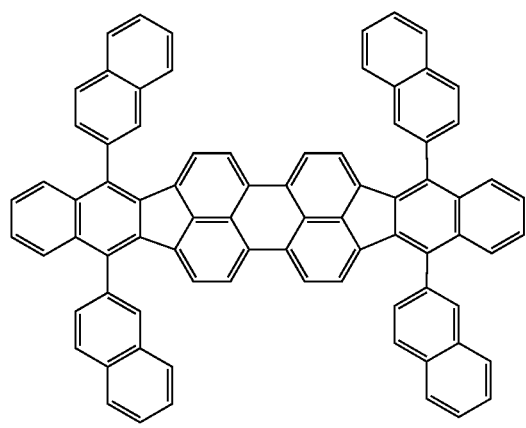
Compound (5)-7
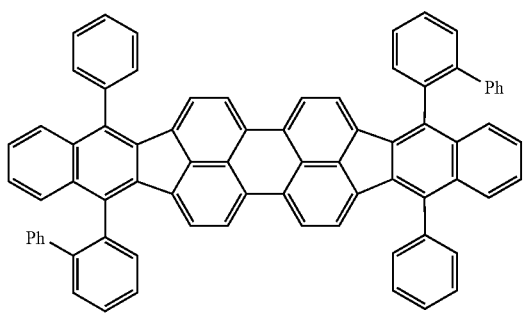
Compound (5)-8
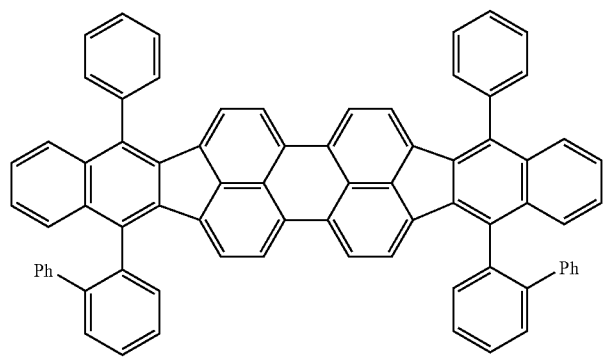

—Diketopyrrolopyrrole Derivative—

For example, a compound represented by the following general formula (6) (diketopyrrolopyrrole derivative) is used as the red light-emitting guest material.

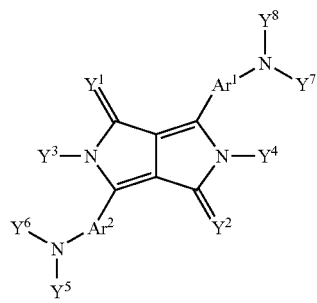

General Formula (6)

In the general formula (6), $Y^1$ and $Y^2$ each independently represents an oxygen atom or a substituted or unsubstituted imino group. Also, $Y^3$ to $Y^8$ each independently represents hydrogen, a halogen, a substituted or unsubstituted alkyl group having not more than 20 carbon atoms, a substituted or unsubstituted alkenyl group having not more than 20 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

Also, in the general formula (6), $Ar^1$ and $Ar^2$ each represents a divalent group selected among a substituted or unsubstituted aromatic hydrocarbon group and a substituted or unsubstituted aromatic heterocyclic group.

In the general formula (6), the substituted or unsubstituted aryl group represented by $Y^3$ to $Y^8$, the heterocyclic group represented by $Y^3$ to $Y^8$ and the amino group represented by $Y^3$ to $Y^8$ are the same as those in the perylene derivative represented by the general formula (5). It is also the same that two or more kinds of the foregoing substituents may form a fused ring, and these substituents may further have a substituent.

Specific examples of the diketopyrrolopyrrole derivative which is suitably used as the red light-emitting guest material in the light-emitting layer 14c include the following Compound (6)-1 to (6)-14. However, it should be construed that the invention is not limited thereto at all.

Compound (6)-1

Compound (6)-2

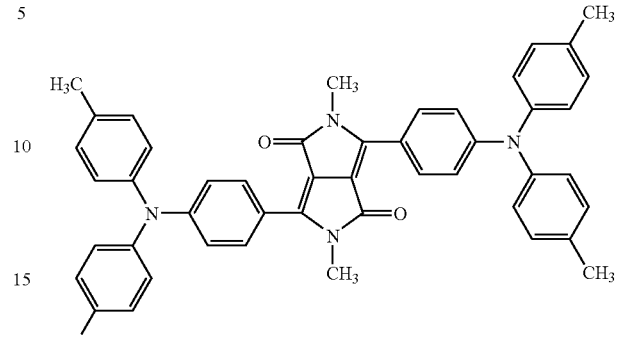

Compound (6)-3

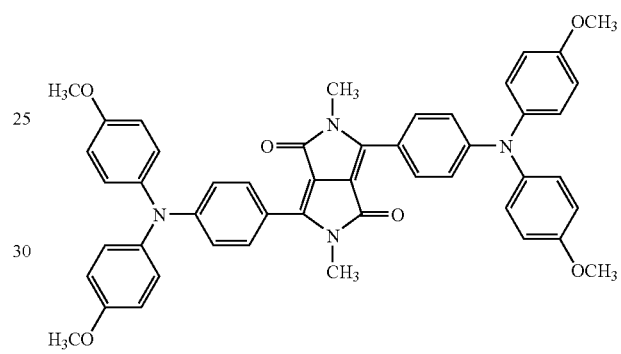

Compound (6)-4

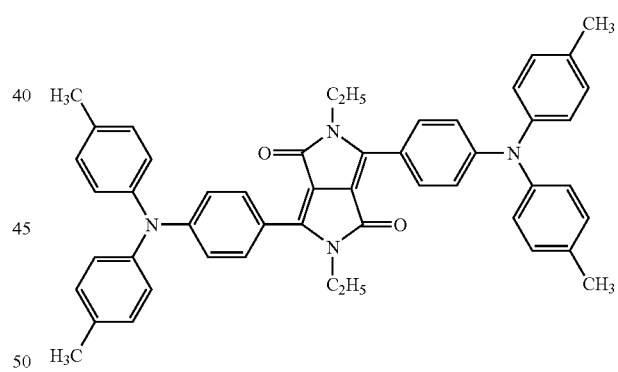

Compound (6)-5

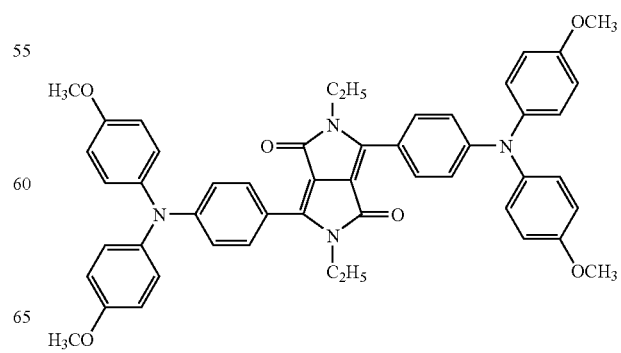

-continued

Compound (6)-6
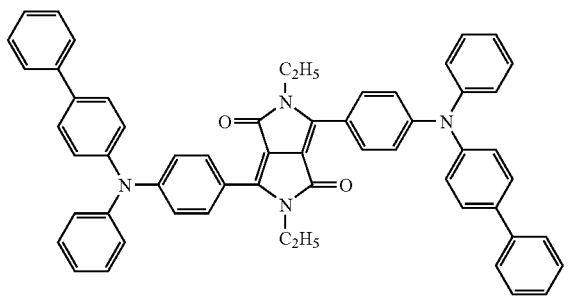

Compound (6)-7
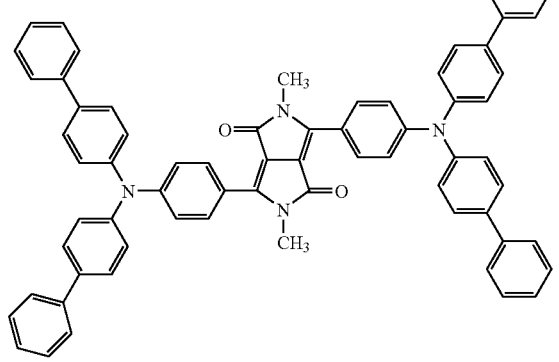

Compound (6)-8
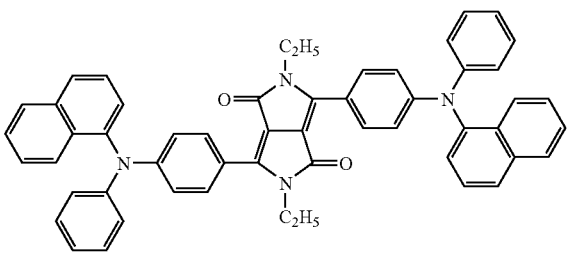

Compound (6)-9
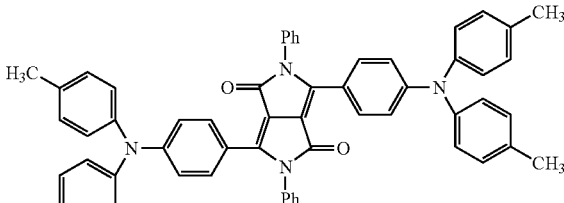

Compound (6)-10
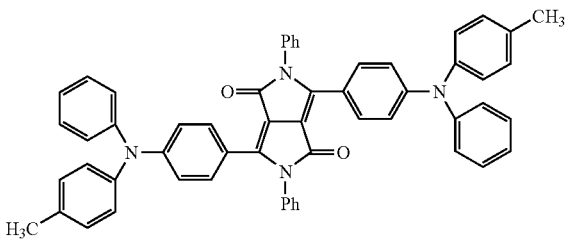

-continued

Compound (6)-11
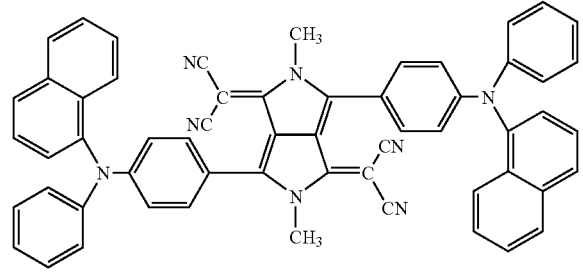

Compound (6)-12
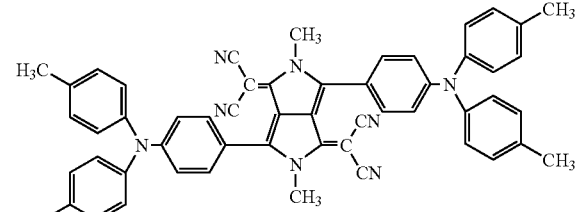

Compound (6)-13
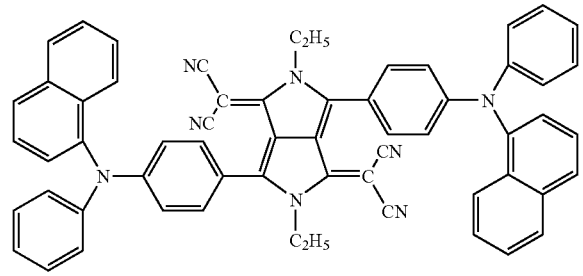

Compound (6)-14
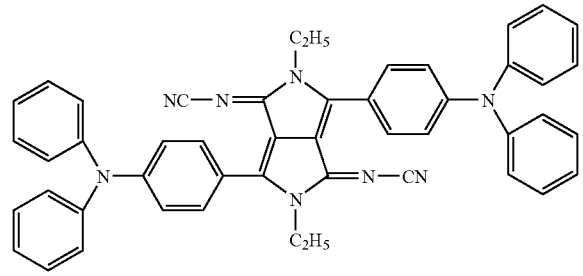

—Pyromethene Derivative—

For example, a compound represented by the following general formula (7) (pyromethene derivative) is used as the red light-emitting guest material.

General Formula (7)
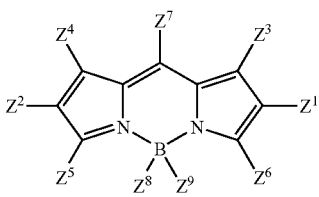

In the general formula (7), $Z^1$ to $Z^9$ each independently represents hydrogen, a halogen, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

In the general formula (7), the substituted or unsubstituted aryl group represented by $Z^1$ to $Z^9$, the heterocyclic group represented by $Z^1$ to $Z^2$ and the amino group represented by $Z^1$ to $Z^9$ are the same as those in the perylene derivative represented by the general formula (5). It is also the same that two or more kinds of the foregoing substituents may form a fused ring, and these substituents may further have a substituent.

Specific examples of the pyromethene derivative which is suitably used as the red light-emitting guest material in the light-emitting layer 14c include the following Compound to (7)-69. However, it should be construed that the invention is not limited thereto at all.

Compound (7)-1

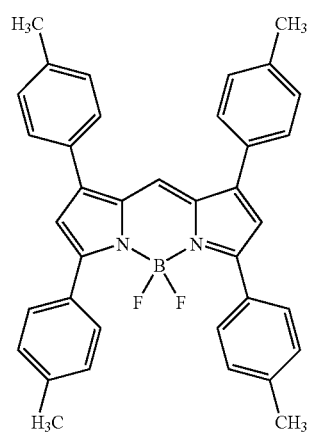

Compound (7)-2

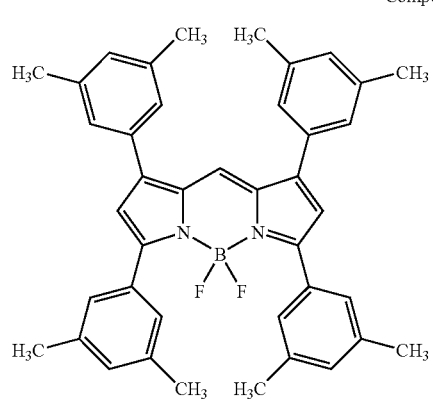

Compound (7)-3

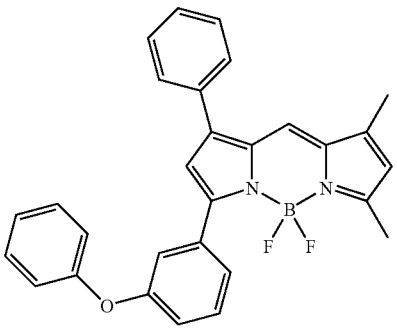

Compound (7)-4

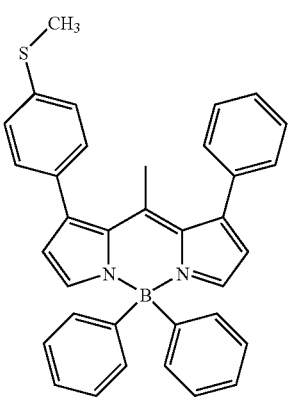

Compound (7)-5

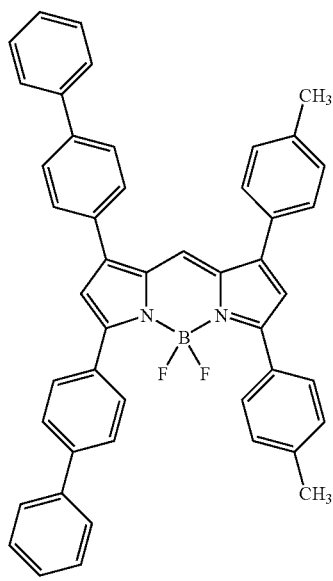

Compound (7)-6
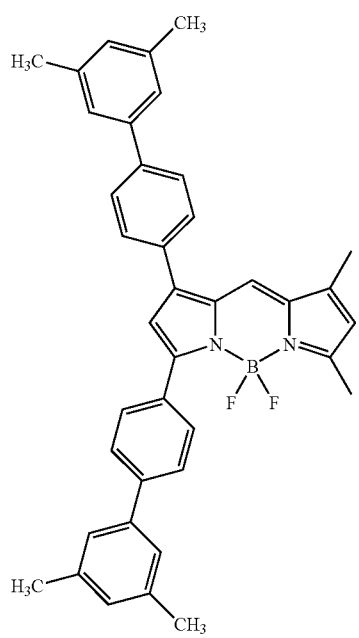
Compound (7)-7
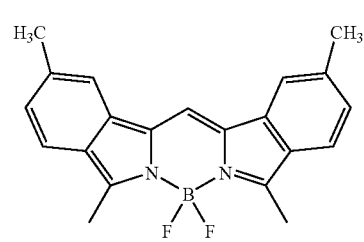
Compound (7)-8
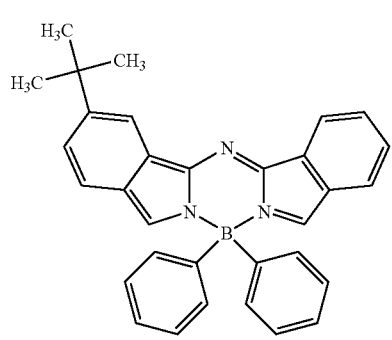
Compound (7)-9
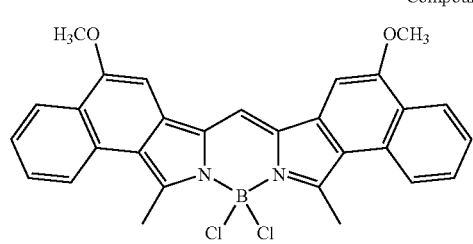
Compound (7)-10
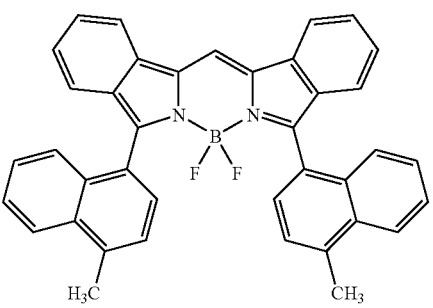
Compound (7)-11
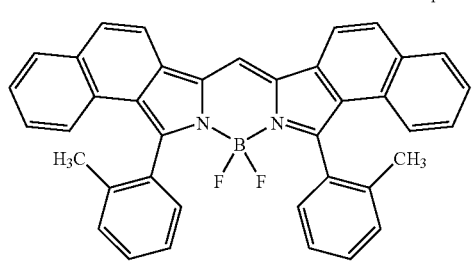
Compound (7)-12
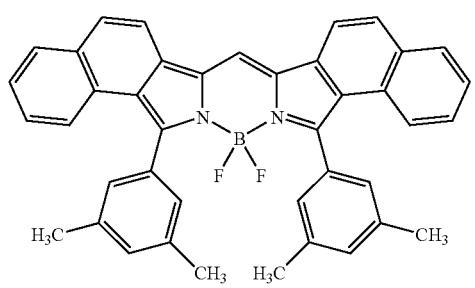
Compound (7)-13
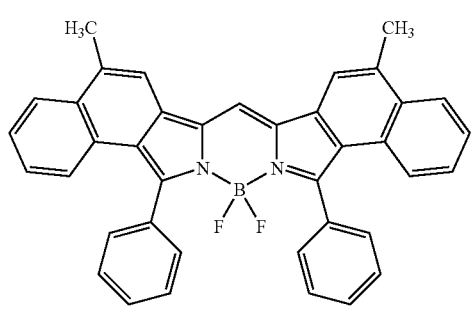
Compound (7)-14
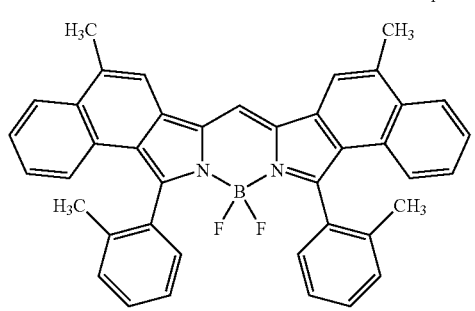

Compound (7)-15
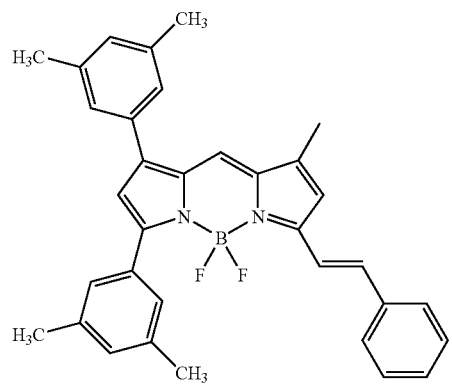
Compound (7)-16
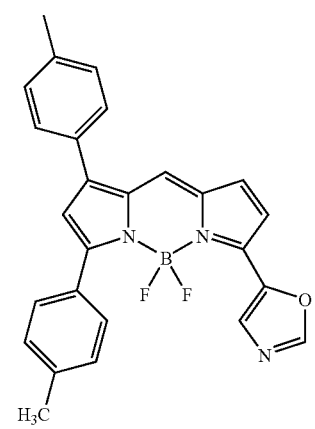
Compound (7)-17
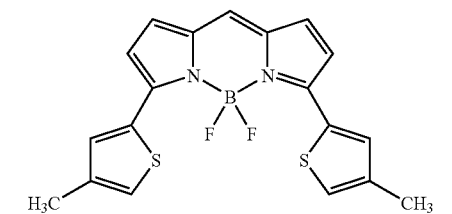
Compound (7)-18
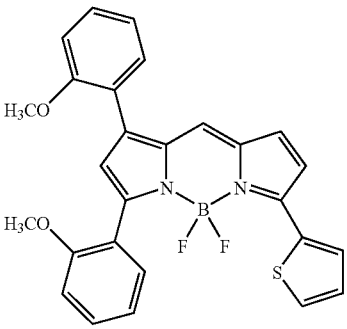
Compound (7)-19
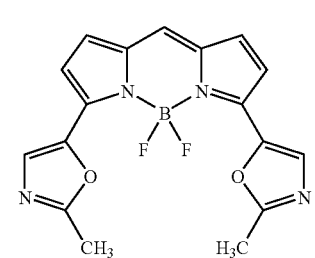
Compound (7)-20
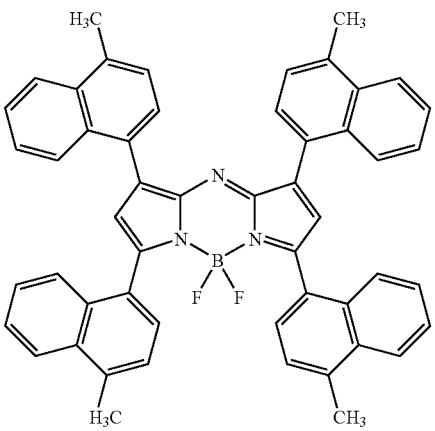
Compound (7)-21
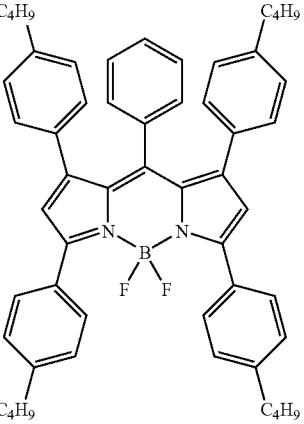
Compound (7)-22
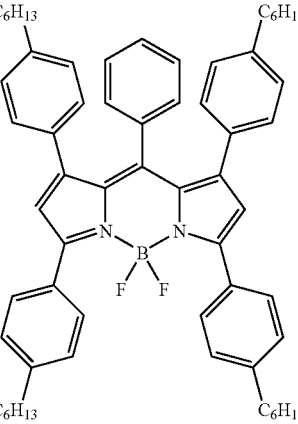
Compound (7)-23
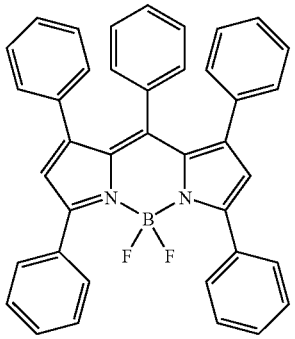

-continued
Compound (7)-24
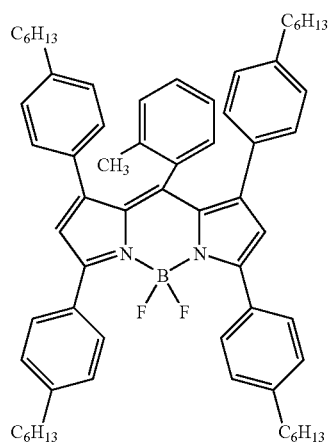
Compound (7)-25
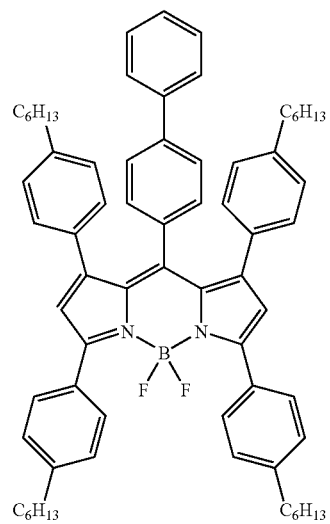
Compound (7)-26
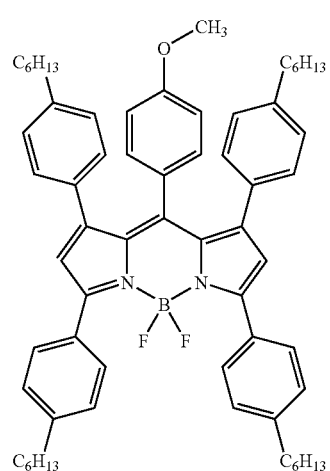
-continued
Compound (7)-27
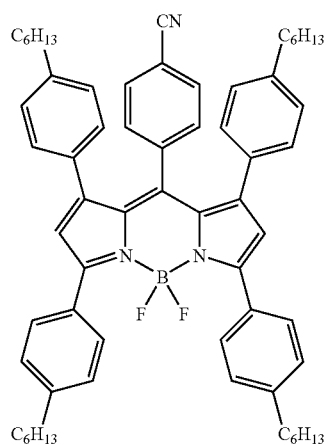
Compound (7)-28
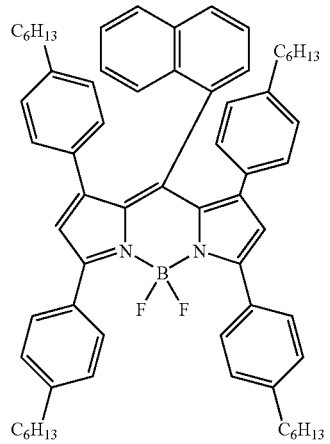
Compound (7)-29
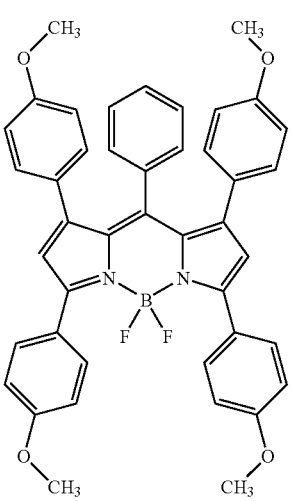

Compound (7)-30
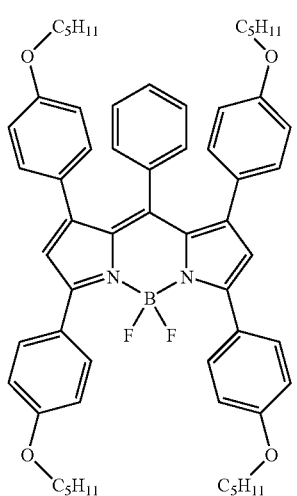
Compound (7)-31
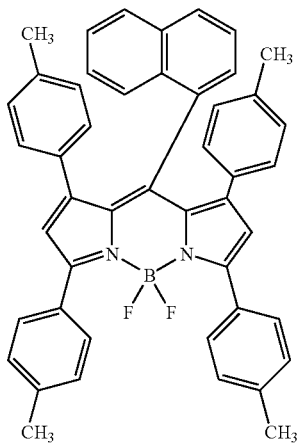
Compound (7)-32
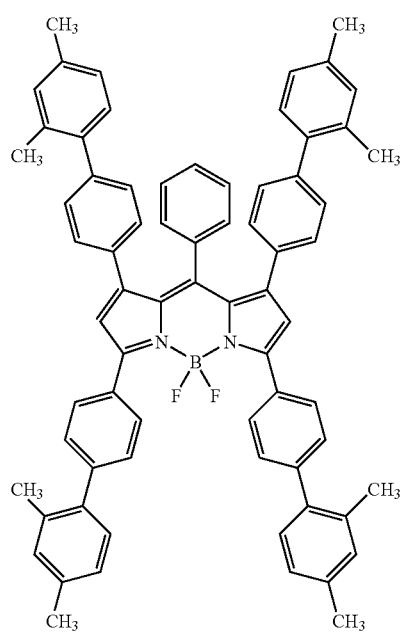
Compound (7)-33
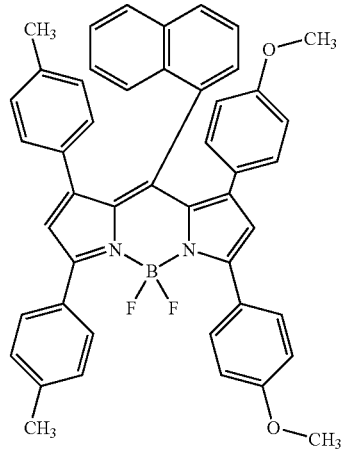
Compound (7)-34
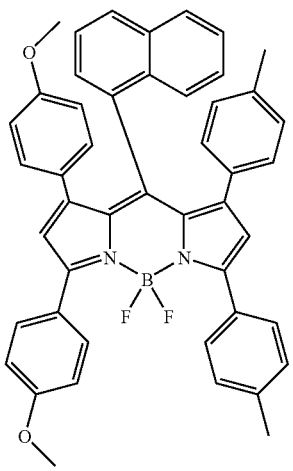
Compound (7)-35
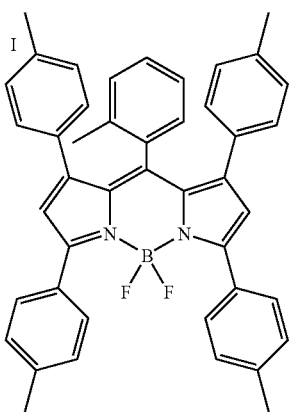

Compound (7)-36
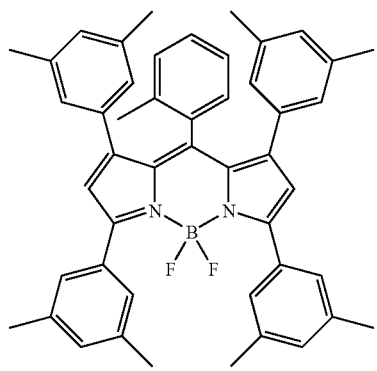
Compound (7)-37
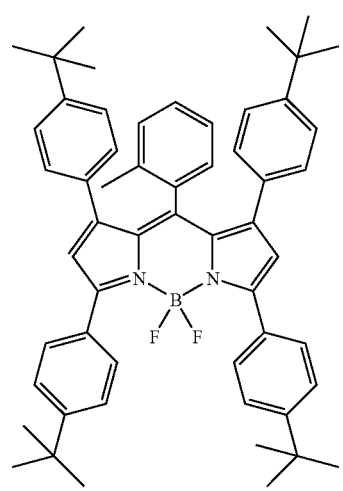
Compound (7)-38
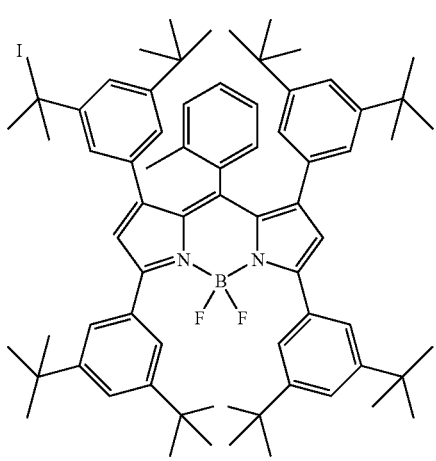
Compound (7)-39
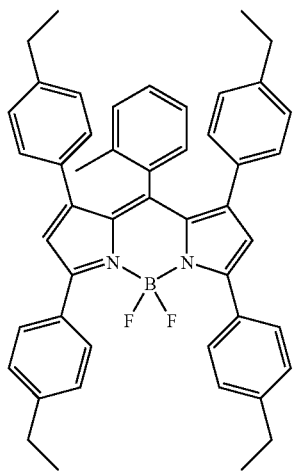
Compound (7)-40
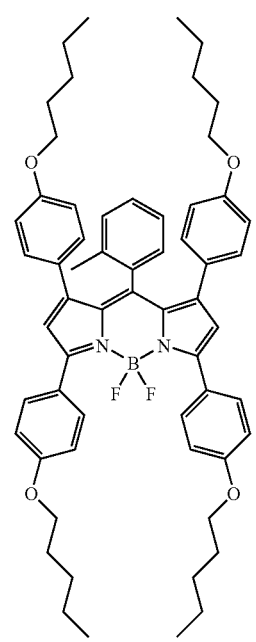
Compound (7)-41
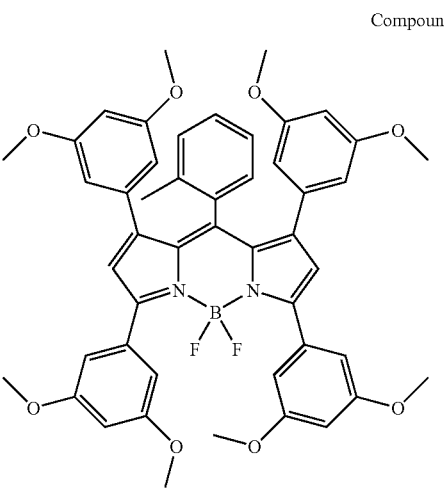

Compound (7)-42
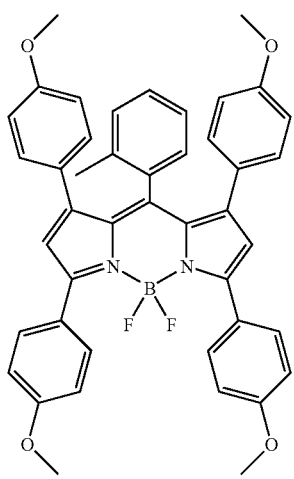
Compound (7)-43
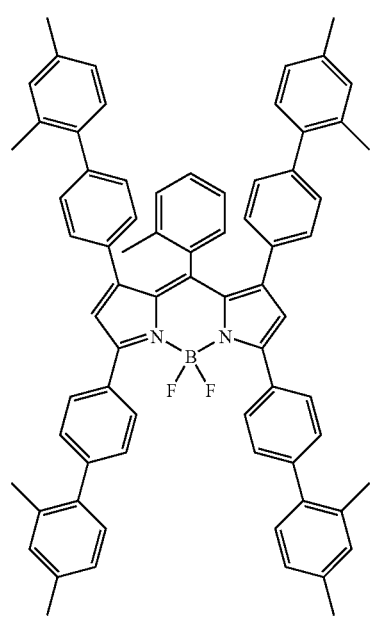
Compound (7)-44
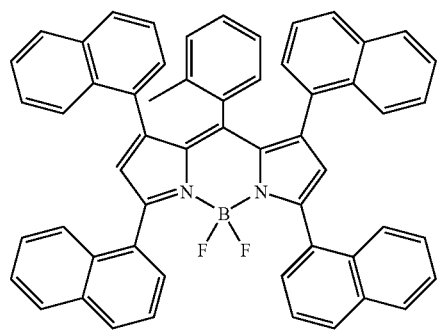
Compound (7)-45
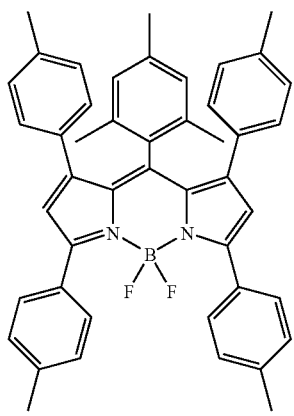
Compound (7)-46
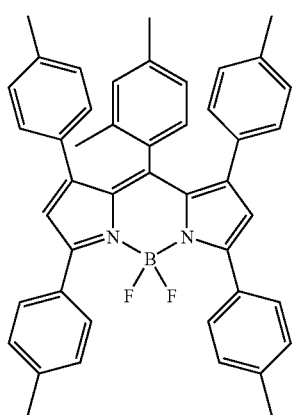
Compound (7)-47
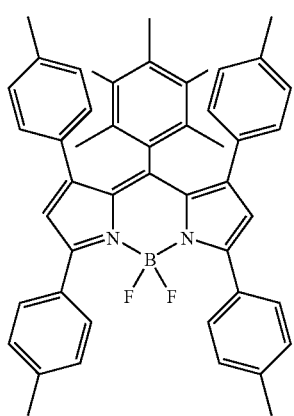

Compound (7)-48
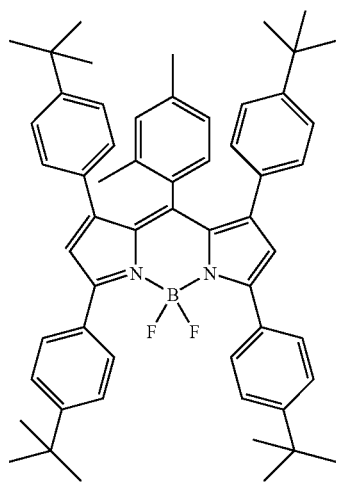
Compound (7)-49
Compound (7)-50
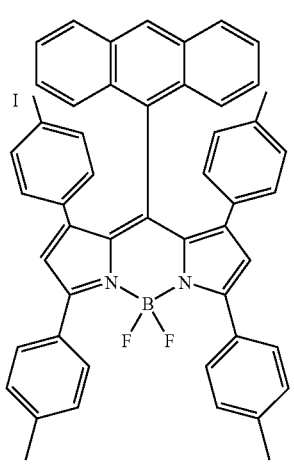
Compound (7)-51
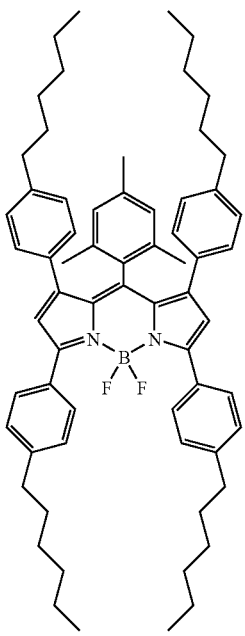
Compound (7)-52
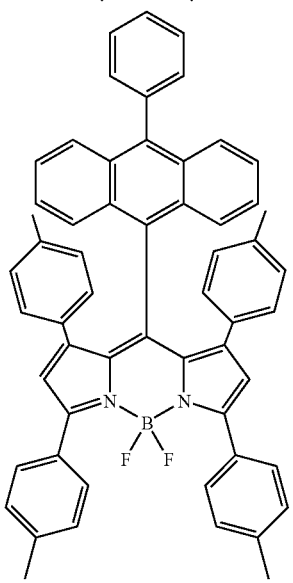
Compound (7)-53
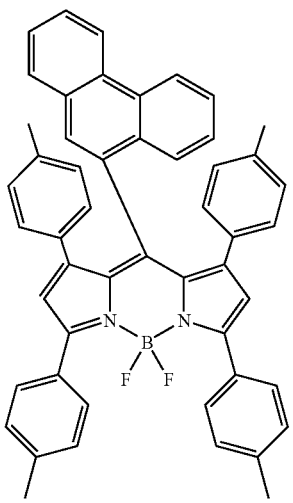

Compound (7)-54
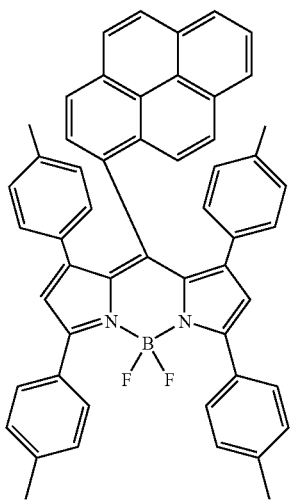
Compound (7)-57
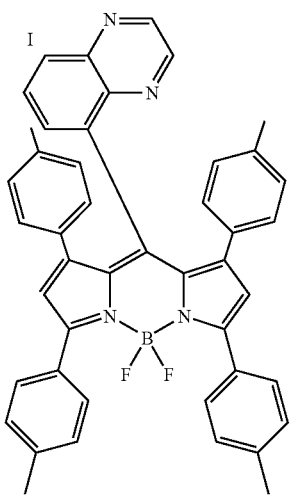
Compound (7)-55
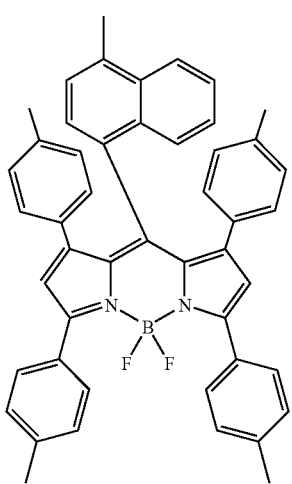
Compound (7)-58
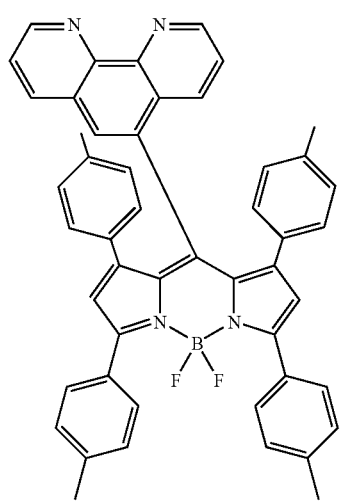
Compound (7)-56
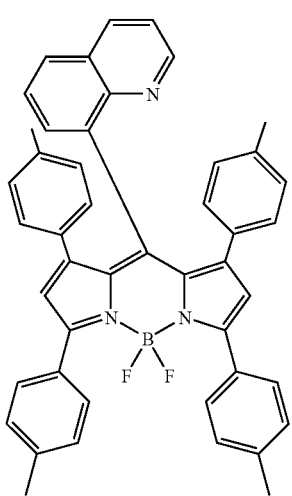
Compound (7)-59
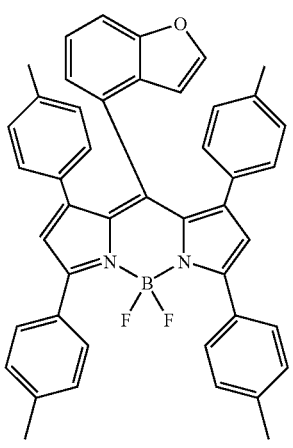

Compound (7)-60
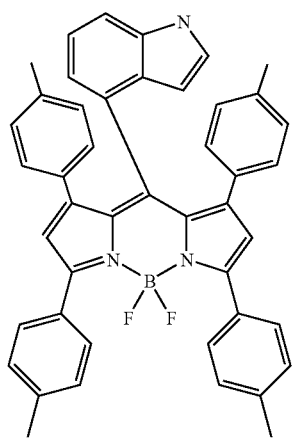
Compound (7)-61
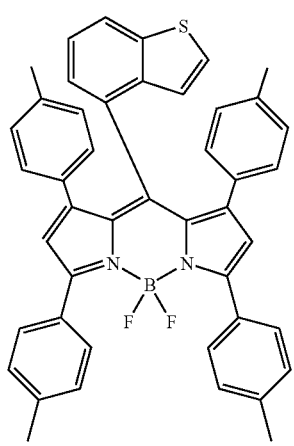
Compound (7)-62
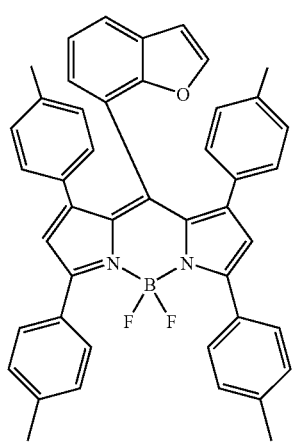
Compound (7)-63
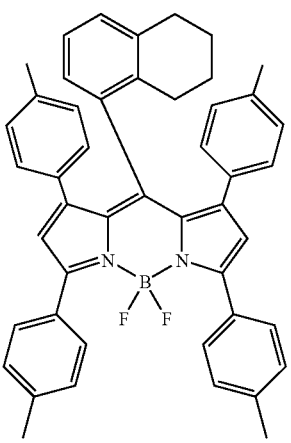
Compound (7)-64
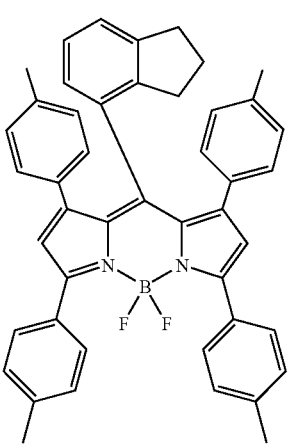
Compound (7)-65
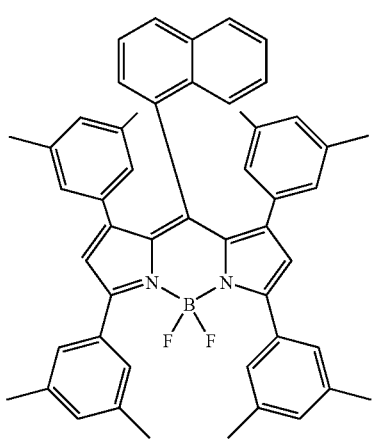

Compound (7)-66

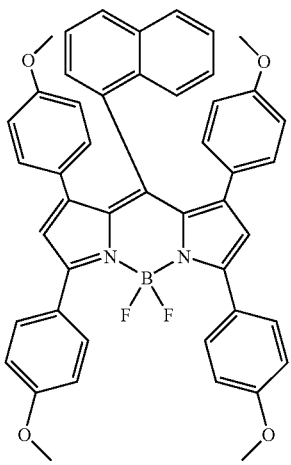

Compound (7)-67

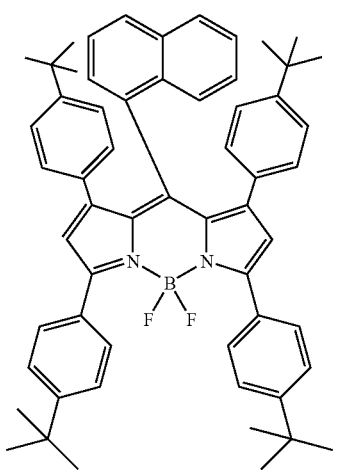

Compound (7)-68

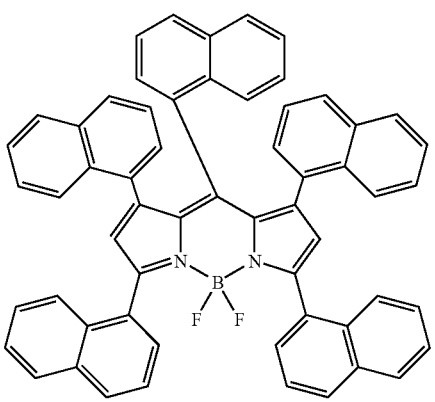

Compound (7)-69

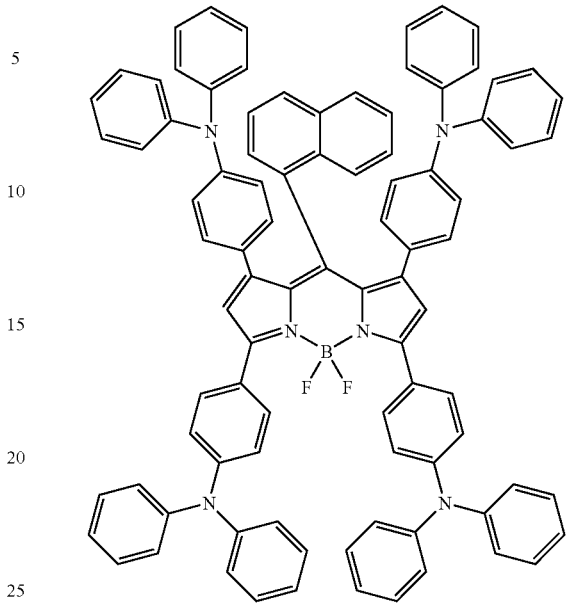

—Pyran Derivative—

For example, a compound represented by the following general formula (8) (pyran derivative) is used as the red light-emitting guest material.

General Formula (8)

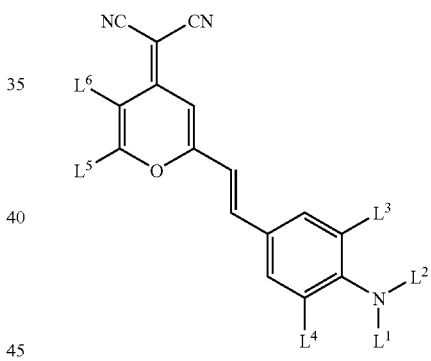

In the general formula (8), $L^1$ to $L^6$ each independently represents hydrogen, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms. Also, $L^1$ and $L^4$ or $L^2$ and $L^3$ may take a cyclic structure through a hydrocarbon.

In the general formula (8), the substituted or unsubstituted aryl group represented by $L^1$ to $L^6$ the heterocyclic group represented by $L^1$ to $L^6$ and the amino group represented by $L^1$ to $L^6$ are the same as those in the perylene derivative represented by the general formula (5). $L^1$ and $L^4$ or $L^2$ and $L^3$ may take a cyclic structure through a hydrocarbon. Besides, two or more kinds of the foregoing substituents may form a fused ring, and these substituents may further have a substituent.

Specific examples of the pyran derivative which is suitably used as the red light-emitting guest material in the light-emitting layer 14c include the following Compound (8)-1 to (8)-7. However, it should be construed that the invention is not limited there to at all.

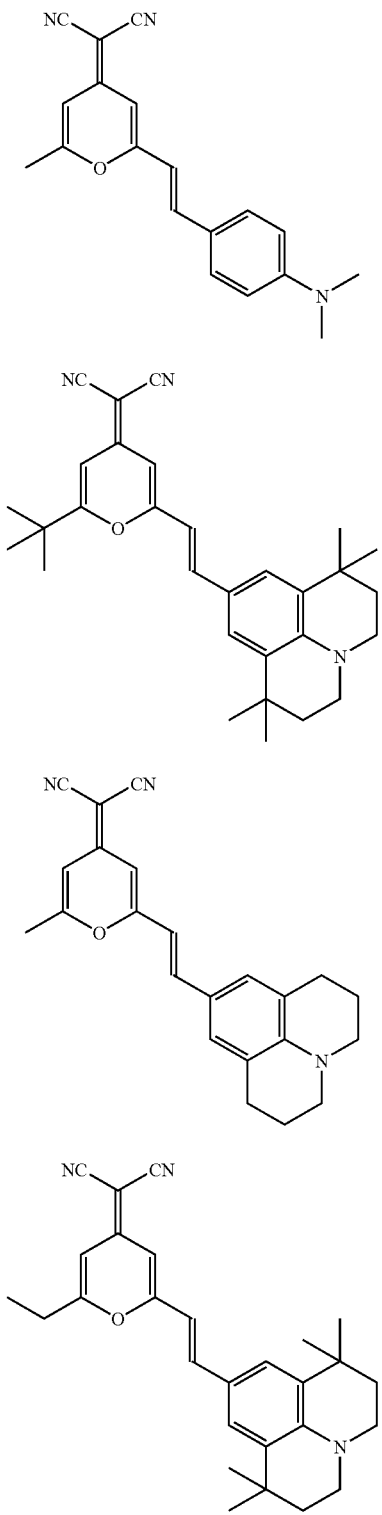

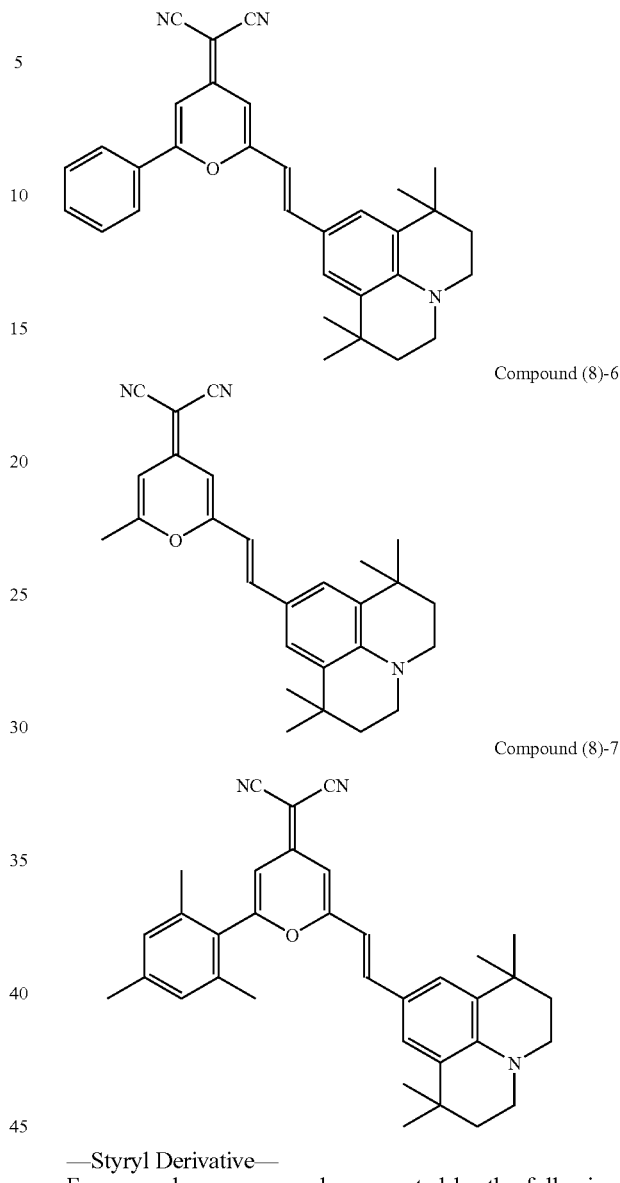

—Styryl Derivative—

For example, a compound represented by the following general formula (9) (styryl derivative) is used as the red light-emitting guest material.

General Formula (9)

$$T^3\!\!-\!\!N\!-\!T^4\!-\!\underset{H}{C}\!=\!\underset{H}{C}\!-\!T^1$$
$$T^2$$

In the general formula (9) $T^1$ to $T^3$ each represents a substituted or unsubstituted aryl group having not more than 30 carbon atoms or a substituted or unsubstituted heterocyclic group having not more than 30 carbon atoms. Also, $T^4$ represents a substituted or unsubstituted phenylene site which may have a cyclic structure together with $T^2$ and $T^3$.

In the general formula (9), the substituted or unsubstituted aryl group represented by $T^1$ to $T^3$ and the heterocyclic group represented by $T^1$ to $T^3$ are the same as those in the perylene derivative represented by the general formula (5).

Two or more kinds of the foregoing substituents may form a fused ring, and these substituents may further have a substituent. In that case, examples of a group which is substituted on each of $T^1$ to $T^4$ include hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group and an amino group. Besides, as the amino group, all of an alkylamino group, an arylamino group and an aralkylamino group are useful. It is preferable that these amino groups are an aliphatic group having from 1 to 6 carbon atoms in total and/or have from 1 to 4 aromatic carbon rings. Examples of such an amino group include a dimethylamino group, a diethylamino group, a dibutylamino group, a diphenylamino group, a ditolylamino group, a bisbiphenylylamino group and a dinaphthylamino group.

Specific examples of the styryl derivative which is suitably used as the red light-emitting guest material in the light-emitting layer 14c include the following Compound (9)-1 to (9)-35. However, it should be construed that the invention is not limited thereto at all.

Compound (9)-1

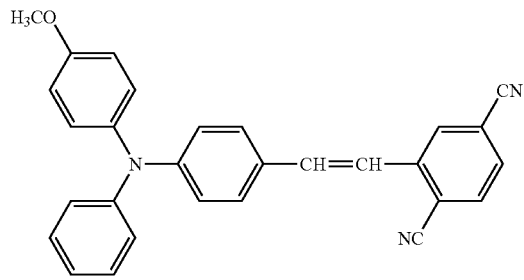

Compound (9)-2

Compound (9)-3

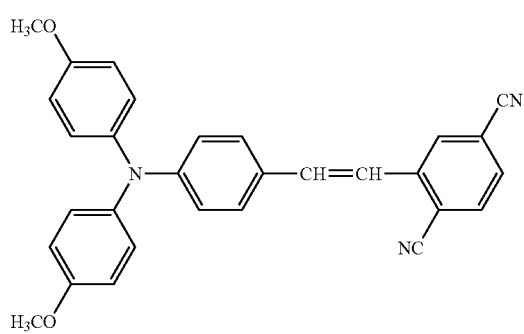

Compound (9)-4

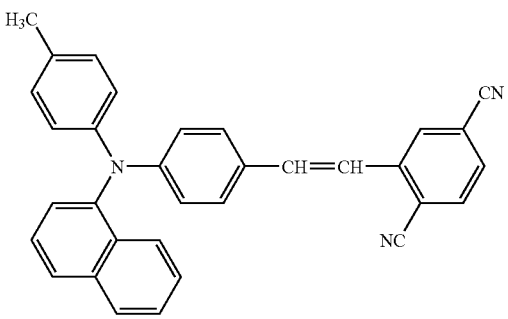

Compound (9)-5

Compound (9)-6

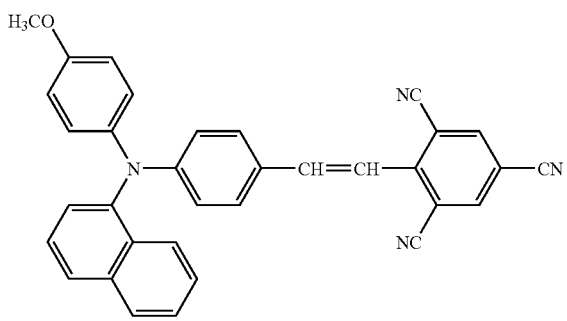

Compound (9)-7

Compound (9)-8

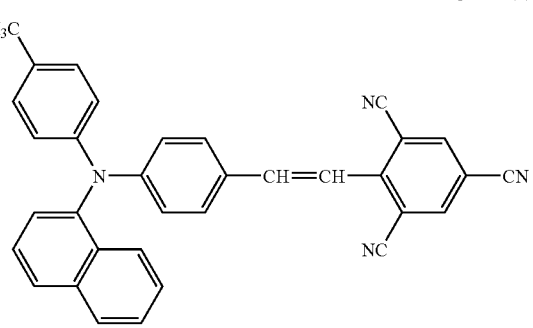

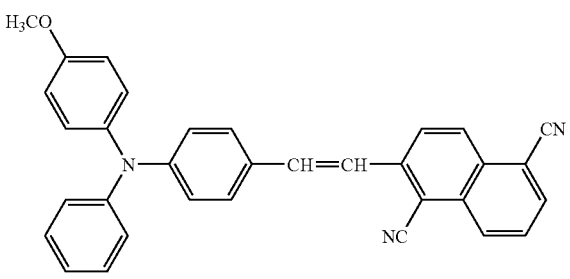

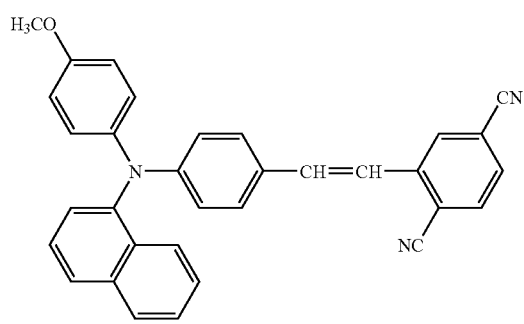

Compound (9)-9
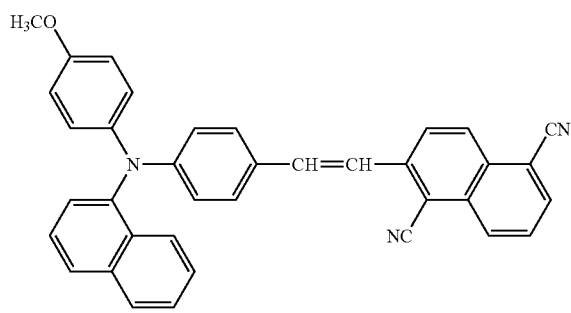
Compound (9)-10
Compound (9)-11
Compound (9)-12
Compound (9)-13
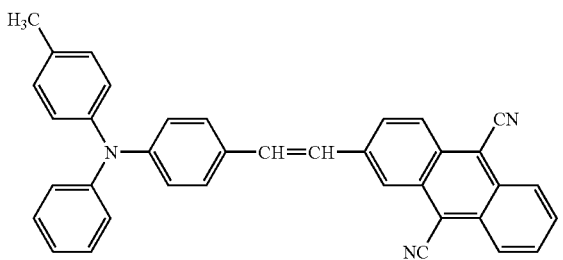
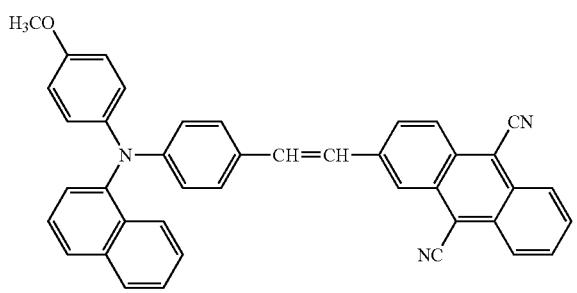
Compound (9)-14
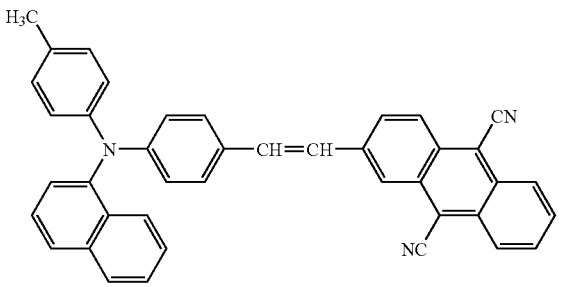
Compound (9)-15
Compound (9)-16
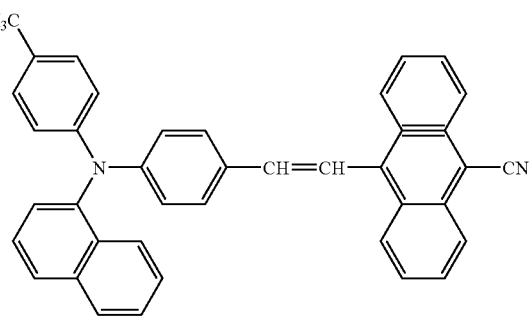
Compound (9)-17

Compound (9)-18
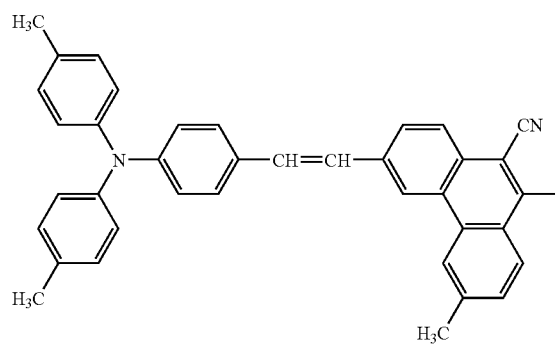
Compound (9)-22
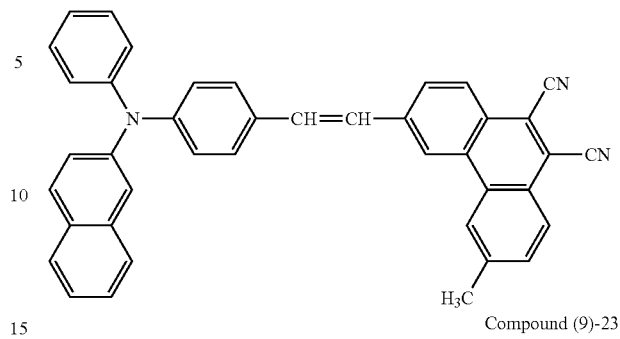
Compound (9)-19
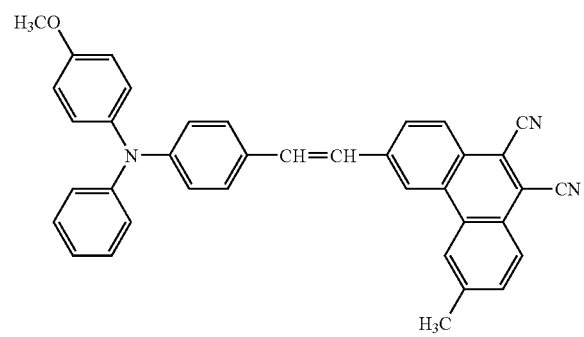
Compound (9)-23
Compound (9)-20
Compound (9)-24
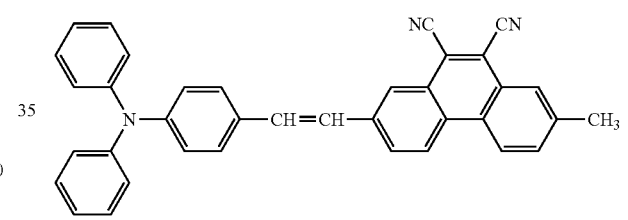
Compound (9)-25
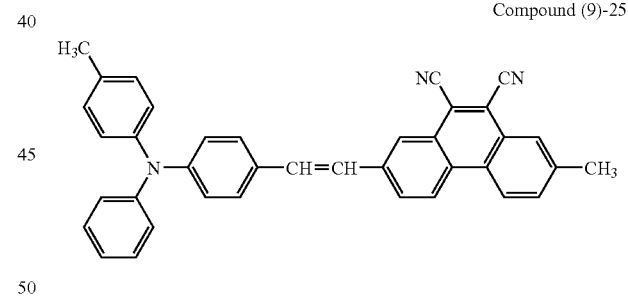
Compound (9)-21
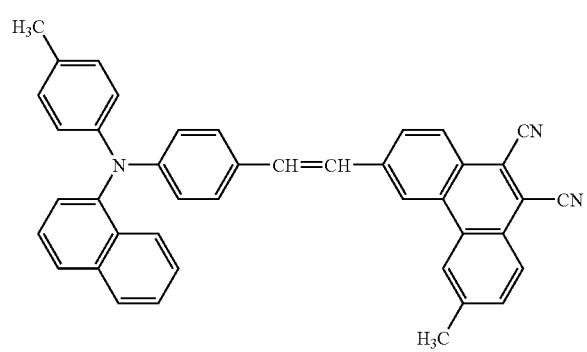
Compound (9)-26
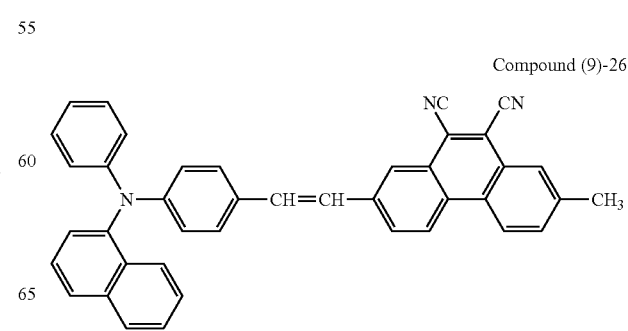
The perylene derivative of the general formula (5), the diketopyrrolopyrrole derivative of the general formula (6) the pyromethene complex of the general formula (7), the pyran Compound (9)-27

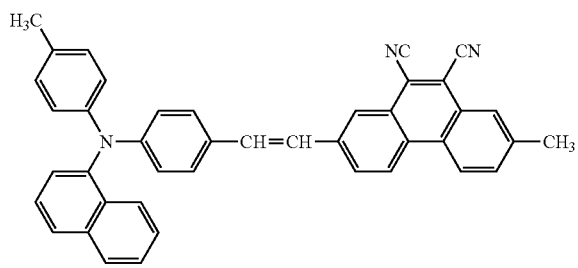

Compound (9)-28

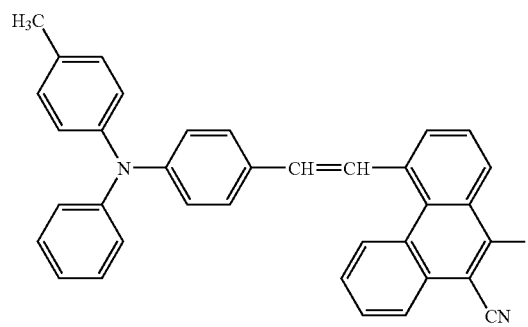

Compound (9)-29

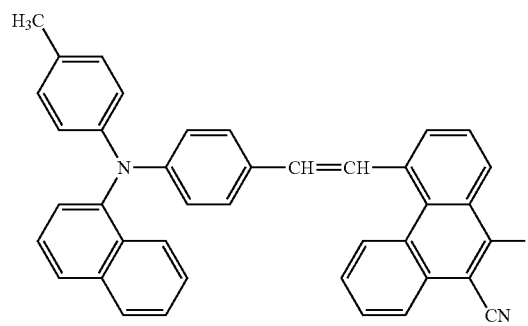

Compound (9)-30

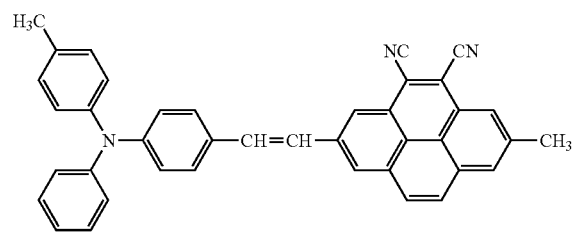

Compound (9)-31

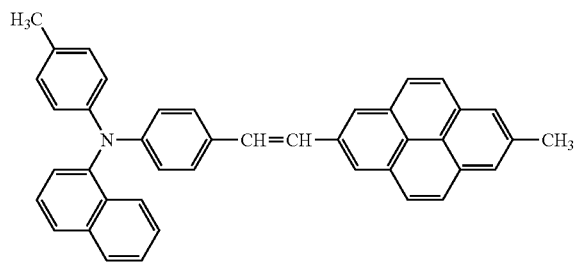

Compound (9)-32

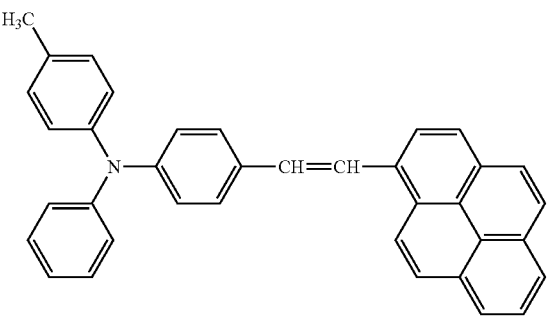

Compound (9)-33

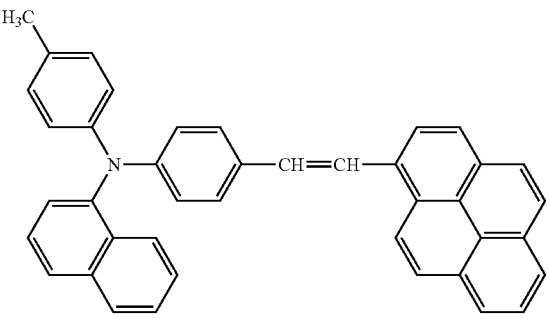

Compound (9)-34

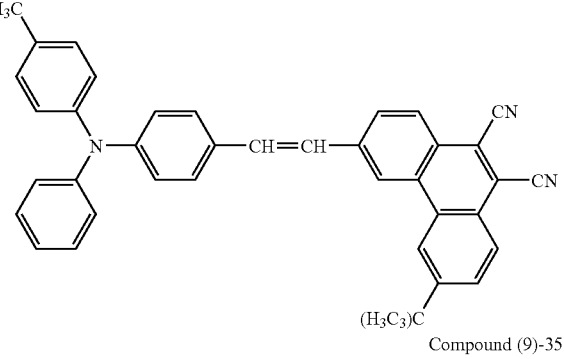

Compound (9)-35

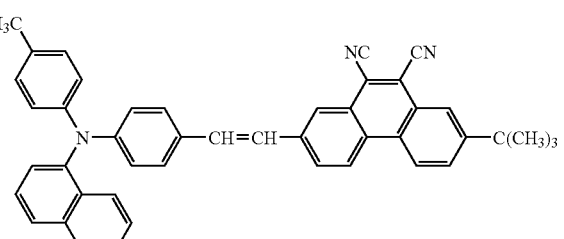

derivative of the general formula (8) or the styryl derivative of the general formula (9) as described below, each of which is used as the red light-emitting guest material in the light-emitting layer 14c, has a molecular weight of preferably not more than 2,000, more preferably not more than 1,500, and especially preferably not more than 1,000. This is because as a reason for this, there may be fear that when the molecular weight is excessively high, the vapor deposition properties become deteriorated in preparing a device by means of vapor deposition.

<Photosensitizing layer>

The photosensitizing layer 14d is a layer for transferring energy to the light-emitting layer 14c and enhancing the luminous efficiency in the light-emitting layer 14c. In the present embodiment, it is another characteristic feature that the photosensitizing layer 14d is provided in contact with the light-emitting layer 14c. In the photosensitizing layer 14d, a light-emitting guest material for generating emission in a blue region is doped on a host material.

As the light-emitting guest material, materials with high luminous efficiency, for example, low-molecular weight fluorescent dyes and fluorescent high-molecular compounds and organic light-emitting materials, for example, metal complexes are useful.

The blue light-emitting guest material as referred to herein is a compound whose wavelength range of emission has a peak in the range of from about 400 nm to 490 nm. As such a compound, organic substances, for example, naphthalene derivatives, anthracene derivatives, naphthacene derivatives, styrylamine derivatives and bis(azinyl)methene boron complex are useful. Above all, it is preferable that the compound is selected among aminonaphthalene derivatives, aminoanthracene derivatives, aminochrysene derivatives, aminopyrene derivatives, styrylamine derivatives and bis(azinyl) methene boron complexes.

Also, the host material of the photosensitizing layer 14d is an organic material composed of an aromatic hydrocarbon derivative having 6 or more carbon atoms and not more than 60 carbon atoms or a combination thereof. Specific examples of the organic material which can be used include naphthalene derivatives, indene derivatives, phenanthrene derivatives, pyrene derivatives, naphthacene derivatives, triphenylene derivatives, anthracene derivatives, perylene derivatives, picene derivatives, fluoranthene derivatives, acephenanthrylene derivatives, pentaphene derivatives, pentacene derivatives, coronene derivatives, butadiene derivatives, stilbene derivatives, tris(8-quinolinolato)aluminum complexes and bis(benzoquinolilato)beryllium complexes.

As the foregoing host material, a host material capable of revealing the highest luminous efficiency is selected and used for every light-emitting guest material.

It is important that the photosensitizing layer 14d having such a configuration is provided in contact with the light-emitting layer 14c. For that reason, the light photosensitizing layer 14d is not limited to be provided between the light-emitting layer 14c and the cathode 15 but may be provided in contact with the light-emitting layer 14c and between the light-emitting layer 14c and the anode 13.

<Electron Transport Layer>

The electron transport layer 14e is provided for the purpose of transporting an electron to be injected from the cathode 15 into the light-emitting layer 14c. Examples of a material of the electron transport layer 14e include quinoline, perylene, phenanthroline, bisstyryl, pyrazine, triazole, oxazole, oxadiazole and fluorenone and derivatives or metal complexes thereof. Specific examples thereof include tris(8-hydroxyquinoline)aluminum (abbreviated as "Alq3") anthracene, naphthalene, phenanthrene, pyrene, anthracene, perylene, butadiene, coumarin, acridine, stilbene, 1,10-phenanthroline and derivatives or metal complexes thereof.

The organic layer 14 is not limited to such a layer structure. It would be better that at least the light-emitting layer 14c and the photosensitizing layer 14d coming into contact therewith are provided. Besides, a stack structure can be chosen as the need arises.

The light-emitting layer 14c may be provided as a hole transporting light-emitting layer, an electron transporting light-emitting layer or both charge transporting light-emitting layers in the organic electroluminescent device 11. Each of the layers which configure the organic layer 14, for example, the hole injection layer 14a, the hole transport layer 14b, the light-emitting layer 14c, the photosensitizing layer 14d and the electron transport layer 14e may be a stack structure composed of plural layers.

<Cathode>

Next, the cathode 15 which is provided on the organic layer 14 having the foregoing configuration may be configured by a two-layer structure, for example, a stack of a first layer 15a and a second layer 15b from the side of the organic layer 14.

The first layer 15a includes a material having a small work function and having good light transmittance. Examples of the material which can be used include lithium oxide ($Li_2O$) which is an oxide of lithium (Li), cesium carbonate ($Cs_2CO_3$) which is a composite oxide of cesium (Cs) and a mixture of these oxide and composite oxide. The first layer 15a is not limited to these materials. For example, alkaline earth metals (for example, calcium (Ca) and barium (Ba)), alkali metals (for example, lithium and cesium), metals having a small work function (for example, indium (In) and magnesium (Mg)), and oxides or composite oxides and fluorides of these metals and the like may be used singly. Also, mixtures or alloys of these metals, oxides or composite oxides and fluorides may be used by enhancing the stability.

The second layer 15b is configured by a thin film using a layer having light transmittance, for example, MgAg. The second layer 15b may be a mixed layer further containing an organic light-emitting material, for example, alumiquinoline complexes, styrylamine derivatives and phthalocyanine derivatives. In that case, the cathode 15 may further have a layer having light transmittance, which is made of, for example, MgAg, separately as a third layer.

When the drive mode of a display apparatus configured by using this organic electroluminescent device 11 is an active matrix mode, the cathode 15 is formed in a solid film form on the substrate 12 in an insulated state from the anode 13 by the organic layer 14 and the foregoing insulating film (illustration of which is omitted) and used as a common electrode of the respective pixels.

The cathode 15 is not limited to the foregoing stack structure. Needless to say, optimum combination and stack structure may be taken depending upon the structure of the device to be prepared. For example, the configuration of the cathode 15 of the foregoing embodiment is of a separated function type of respective layers of the electrode, namely a stack structure where an inorganic layer (first layer 15a) for promoting the electron injection into the organic layer 14 and an inorganic layer (second layer 15b) for taking charge of the electrode are separated. However, the inorganic layer for promoting the electron injection into the organic layer 14 may also serve as the inorganic layer for taking charge of the electrode. These layers may be configured as a single-layer structure. Also, a stack structure where a transparent electrode such as ITO is formed on this single-layer structure may be taken.

Though the current to be applied to the organic electroluminescent device 11 having the foregoing configuration is in general a direct current, a pulse current or an alternating current may be employed. A current value and a voltage value are not particularly limited within the range where the device is not broken. Taking into consideration consumed electric power and life of the organic electroluminescent device, it is desirable that the organic electroluminescent device efficiently undergoes emission with low electric energy as far as possible.

When the organic electroluminescent device 11 is of a cavity structure, the cathode 15 includes a semi-transmitting and semi-reflecting material. Light-emitting light which has been multiply resonated between the light-reflecting surface on the side of the anode 13 and the light-reflecting surface on the side of the cathode 15 is extracted from the side of the cathode 15. In that case, an optical distance between the light-reflecting surface on the side of the anode 13 and the light-reflecting surface on the side of the cathode 15 is regulated by a wavelength of light to be extracted, and the thickness of each layer is set up so as to meet this optical distance. In the organic electroluminescent device of such a top emission type, by positively employing this cavity structure, it is possible to improve the light extraction efficiency into the outside or to control the emission spectrum.

Furthermore, while illustration is omitted, it is preferable that the organic electroluminescent device 11 having the foregoing configuration is used in a state that it is covered by a passivation layer for the purpose of preventing the deterioration of the organic material to be caused due to moisture, oxygen and the like in the air. As the passivation film, for example, a silicon nitride (representatively $Si_3N_4$) film, a silicon oxide (representatively $SiO_2$) film, a silicon nitride oxide ($SiN_xO_y$, composition ratio: x>y) film, a silicon oxide nitride ($SiO_xN_y$, composition ratio: x>y) film, a thin film containing carbon as a main component, for example, DLC (diamond-like carbon), a CN (carbon nanotube) film and the like are useful. It is preferable that such a film is of a single-layer or stacked configuration. Above all, a passivation layer composed of a nitride is preferably used because it has a minute film quality and has an extremely high blocking effect against moisture, oxygen and other impurities which adversely affect the organic electroluminescent device 11.

In the foregoing embodiment, the present invention has been described in detail while exemplifying the case where the organic electroluminescent device is of a top emission type. However, the organic electroluminescent device according to the present invention is not limited to the application to the top emission type but is widely applicable to a configuration in which an organic layer containing at least a light-emitting layer is interposed between an anode and a cathode. Accordingly, the organic electroluminescent device according to the present invention is also applicable to one having a configuration in which a cathode, an organic layer and an anode are stacked in this order from a substrate side; and one of a bottom emission type having a configuration in which an electrode positioning on a substrate side (lower electrode as a cathode or an anode) is composed of a transparent material and an electrode positioning at an opposite side to the substrate (upper electrode as a cathode or an anode) is composed of a reflecting material, thereby extracting light only from the lower electrode side.

Furthermore, it would be better that the organic electroluminescent device of an embodiment according to the present invention is a device formed of a pair of electrodes (an anode and a cathode) and an organic layer interposed between the electrodes. For that reason, the present invention is not limited to the organic electroluminescent device configured of only a pair of electrodes and an organic layer but does not exclude an organic electroluminescent device having a configuration in which other configuration elements (for example, an inorganic compound layer and an inorganic component) coexist so far as the effects of an embodiment according to the present invention are not impaired.

As described in detail in the Examples as described later, in the thus configured organic electroluminescent device 11, it was confirmed that the current efficiency increases as compared with a device in which the photosensitizing layer 14d is not provided.

Moreover, while a structure where the photosensitizing layer 14d which undergoes blue emission is stacked on the red light-emitting layer 14c is taken, even when an electric field is applied, red emission can be attained without causing color mixing due to the emission from the photosensitizing layer 14d. It is thought that this is caused due to the matter that in the photosensitizing layer 14d, though a hole which has penetrated through the red light-emitting layer 14c and an electron which has been injected via the electron transport layer 14e are recombined, energy to be released by this recombination acts so as to excite an electron of the host material configuring the adjacent red light-emitting layer 14c, thereby contributing to the emission in the red light-emitting layer 14c. The generation of such a phenomenon can be analogized from a phenomenon in which as demonstrated in the Comparative Examples against the Examples as described later, when the photosensitizing layer 14d is configured of only a host material, the desired red light-emitting layer does not substantially undergo emission.

According to the organic electroluminescent device 11 having the forgoing configuration, it is possible to attain an enhancement of luminous efficiency of red light while keeping color purity.

Also, it is possible to attain an enhancement of brightness life of the organic electroluminescent device 11 and a reduction of consumed electric power by such a great improvement of the luminous efficiency.

<<Organic Electroluminescent Device-2>>

Figure 2:
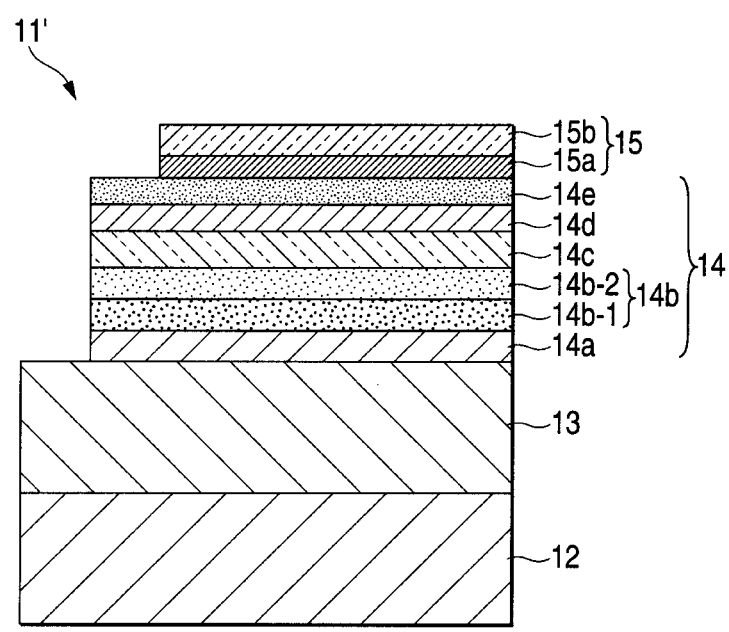
FIG. 2 is a cross-sectional view showing another example of an organic electroluminescent device according to an embodiment of the present invention.

FIG. 2 is a cross-sectional view schematically showing another example of an organic electroluminescent device according to an embodiment of the present invention. A difference of an organic electroluminescent device 11' as illustrated in FIG. 2 from the organic electroluminescent device 11 as described while referring to FIG. 1 resides in the configuration of the hole transport layer 14b, and other configuration is the same. Next, the configuration of the hole transport layer 14b in the organic electroluminescent device 11' is described.

<Hole Transport Layer>

Similar to the hole injection layer 14a, the hole transport layer 14b is provided for the purpose of enhancing the hole injection efficiency into the light-emitting layer 14c. In particular, the hole transport layer 14b as referred to herein is of a stack structure composed of different materials from each other. That is, the hole transport layer 14b has a stack structure composed of at least a first hole transport layer 14b-1 on a side of the hole injection layer 14b and a second hole transport layer 14b-2 adjacent to the light-emitting layer 14c.

Of these, the first hole transport layer 14b-1 includes a material selected among the same materials as in the foregoing hole injection layer 14a. The first hole transport layer 14b-1 per se may have a stack structure.

The second hole transport layer 14b-2 is a layer which is provided in contact with the light-emitting layer 14c and includes a material different from the material which configures the first hole transport layer 14b-1. Examples of the material which configures the second hole transport layer 14b-2 include a triarylamine derivative represented by the following general formula (2), a fluorene derivative represented by the following general formula (3) and a carbazole derivative represented by the following general formula (4). The material which configures the second hole transport layer 14b-2 is hereunder described in detail.

—Triarylamine Derivative—

For example, a triarylamine derivative represented by the following general formula (2) is used as the material which configures the second hole transport layer 14b-2.

General Formula (2)

In the general formula (2), $A^1$ to $A^3$ each independently represents an aryl group or a heterocyclic group, each of which may be unsubstituted or substituted. Also, plural rings of $A^1$ to $A^3$ may be connected via a conjugated bond to form an extensional structure, provided that the total carbon atom number is preferably not more than 30. Examples of a substituent which is substituted on such an aryl group or heterocyclic group include hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group and a substituted or unsubstituted amino group having not more than 30 carbon atoms.

Specific examples of the triarylamine derivative include the following Compound (2)-1 to (2)-48.

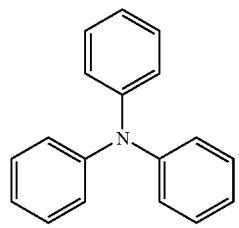

Compound (2)-1

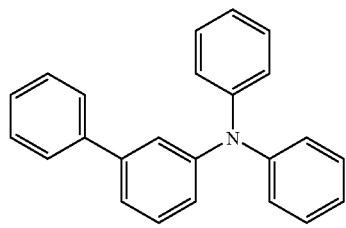

Compound (2)-2

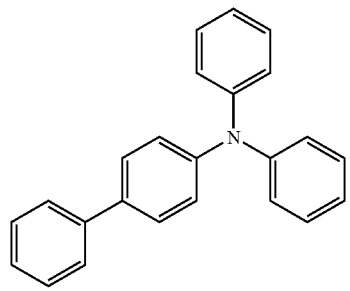

Compound (2)-3

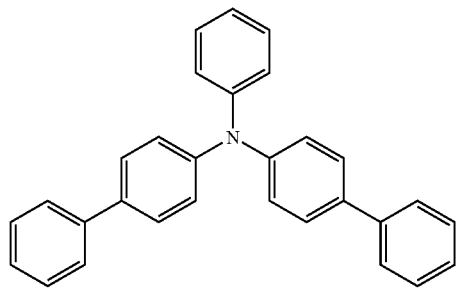

Compound (2)-4

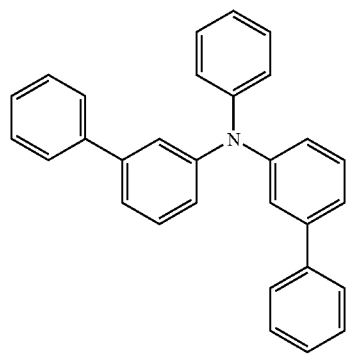

Compound (2)-5

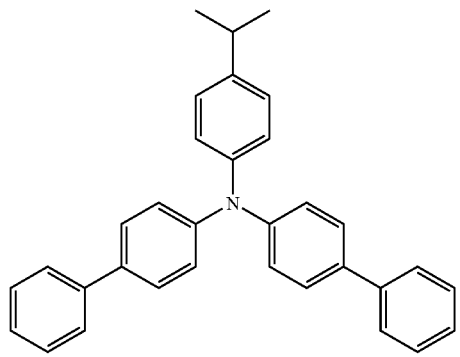

Compound (2)-6

-continued
Compound (2)-7
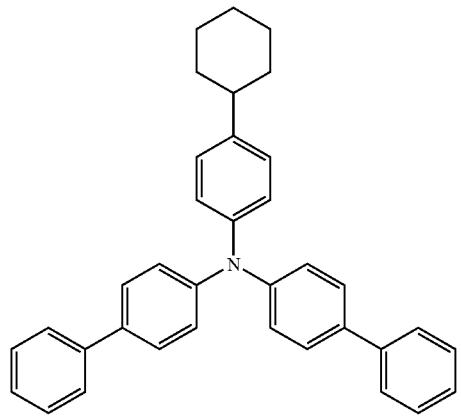
Compound (2)-8
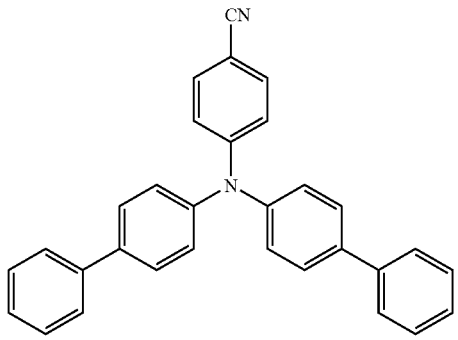
Compound (2)-9
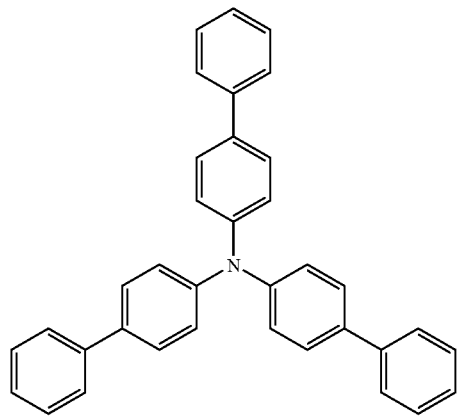
Compound (2)-10
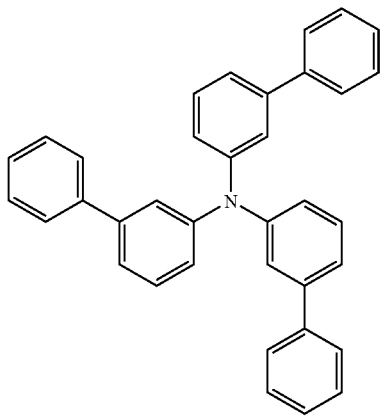
Compound (2)-11
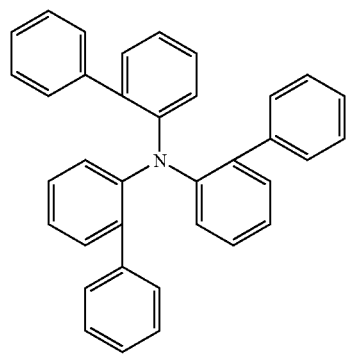
Compound (2)-12
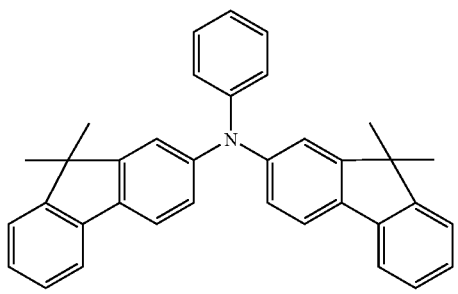

-continued
Compound (2)-13
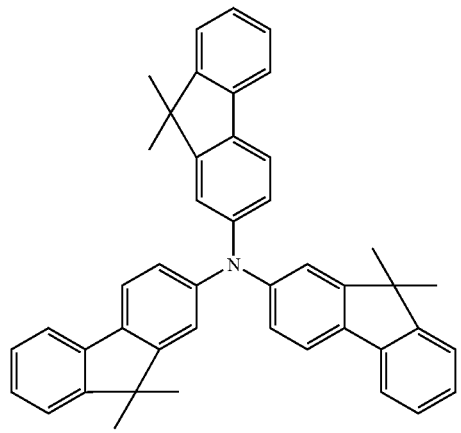
Compound (2)-14
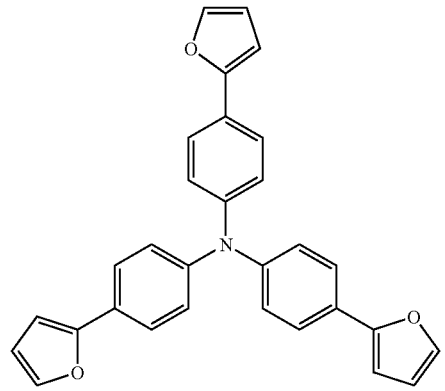
Compound (2)-15
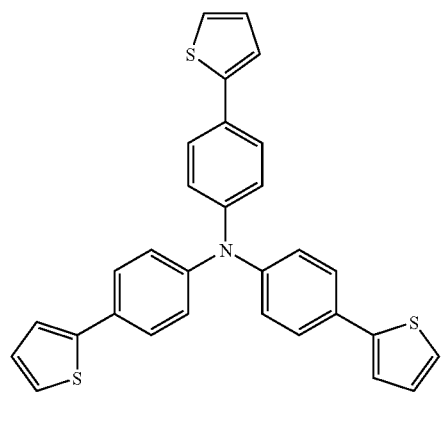
Compound (2)-16
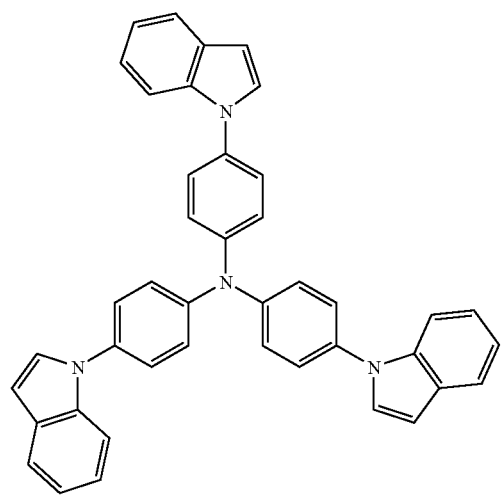
Compound (2)-17
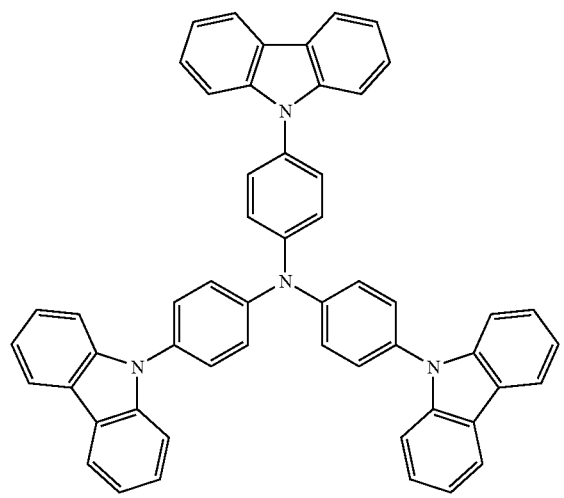
Compound (2)-18
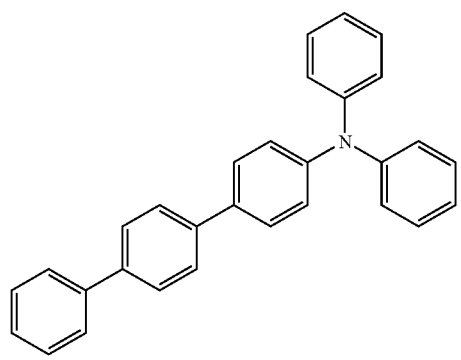

-continued
Compound (2)-19
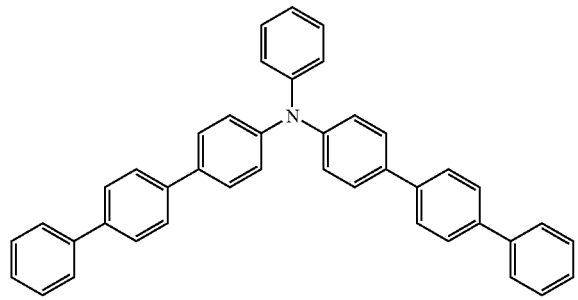
Compound (2)-20
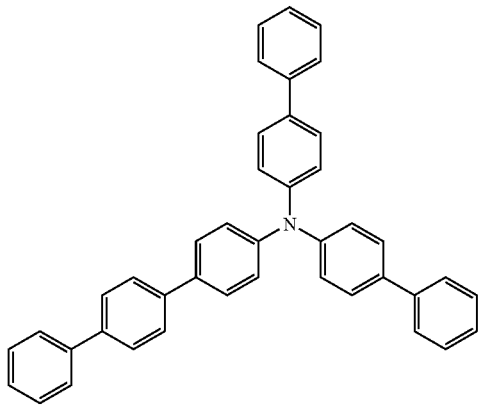
Compound (2)-21
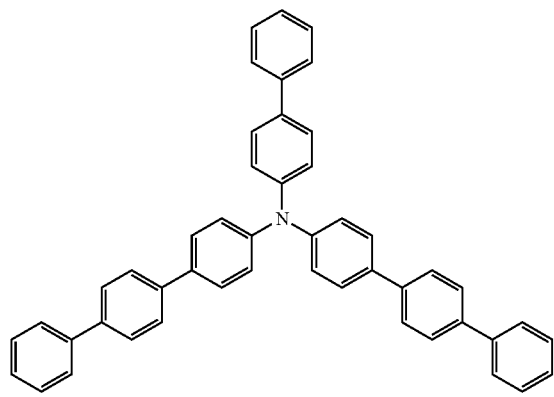
Compound (2)-22
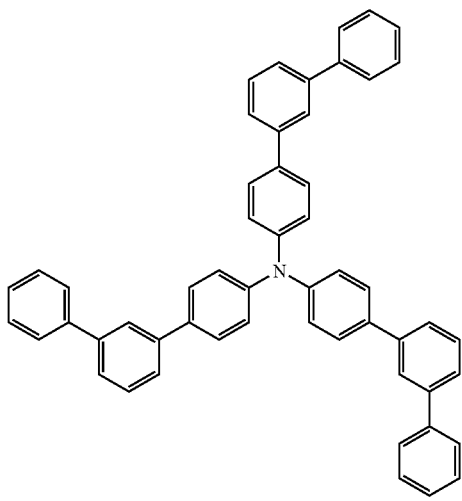
Compound (2)-23
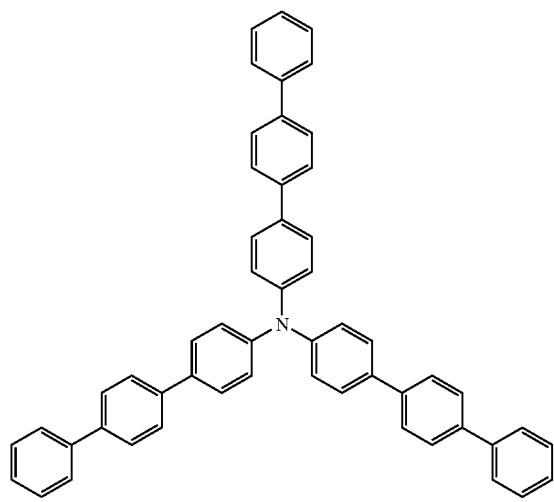
Compound (2)-24
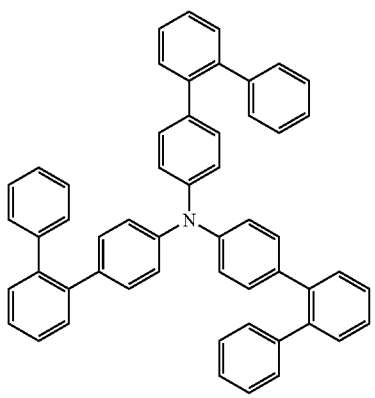

-continued
Compound (2)-25
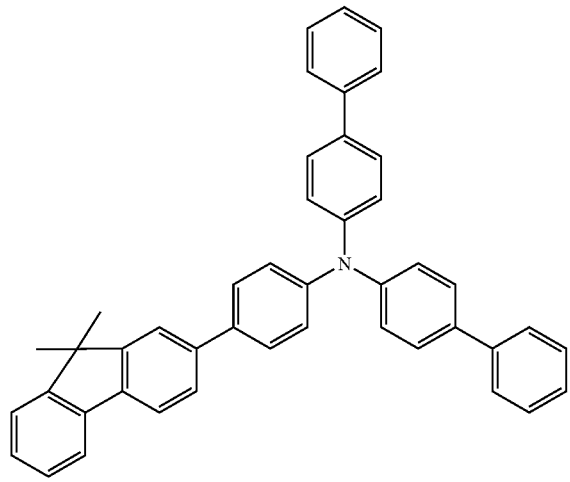
Compound (2)-26
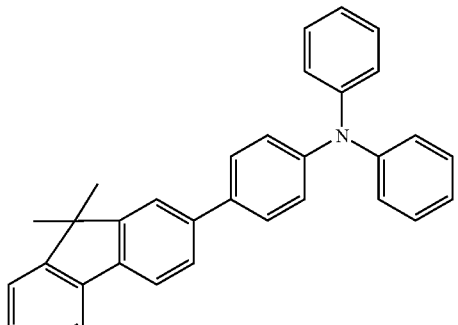
Compound (2)-27
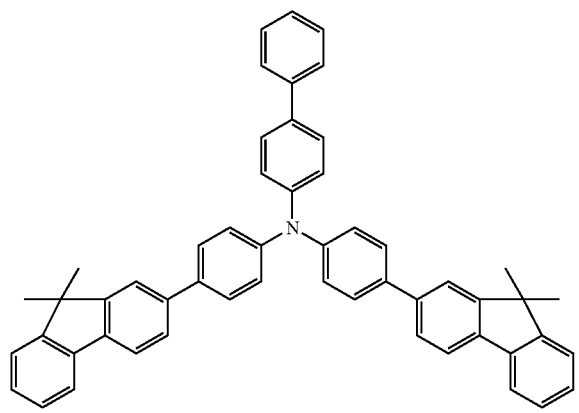
Compound (2)-28
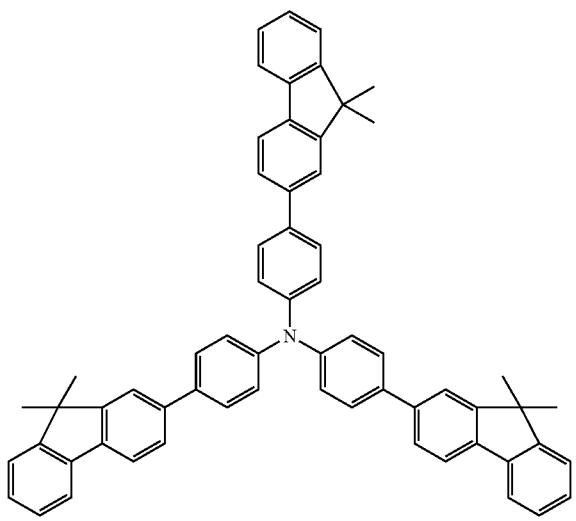
Compound (2)-29
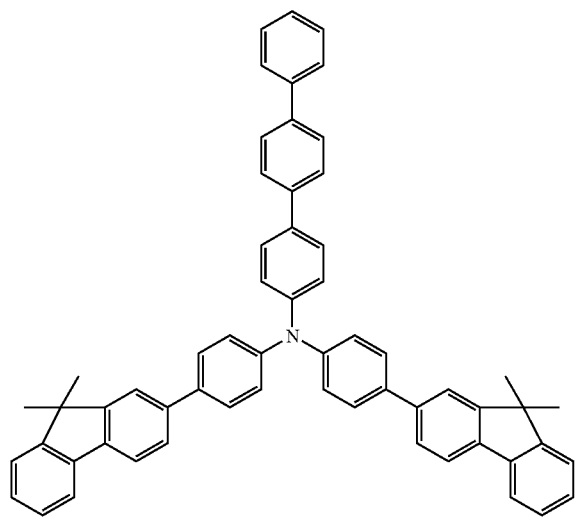
Compound (2)-30
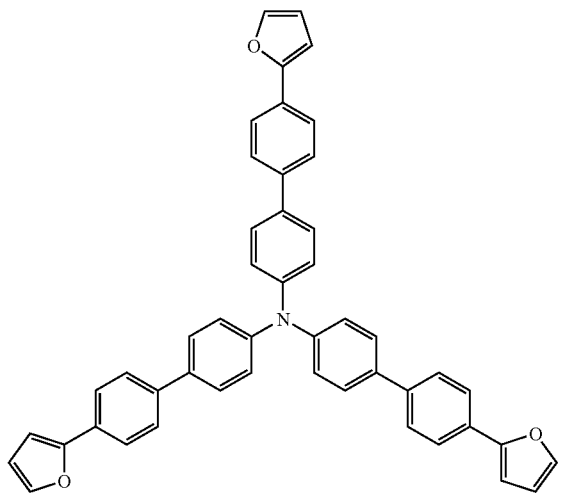

-continued
Compound (2)-31
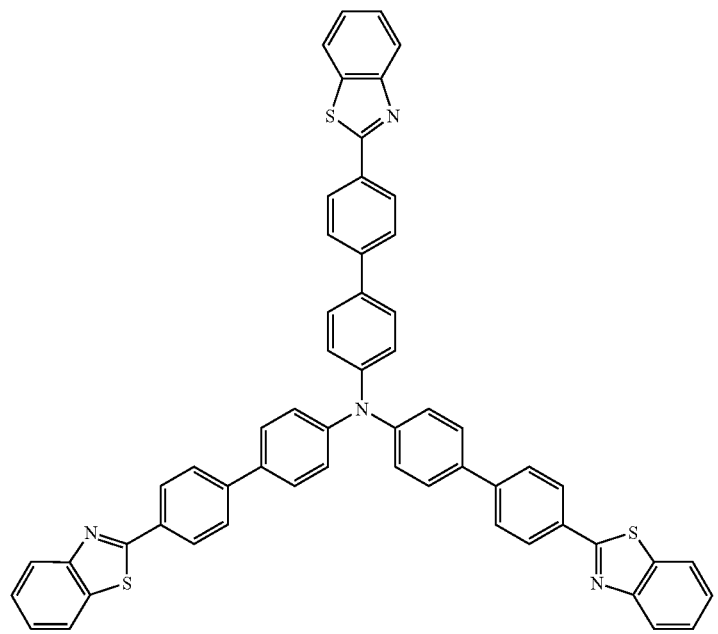
Compound (2)-32
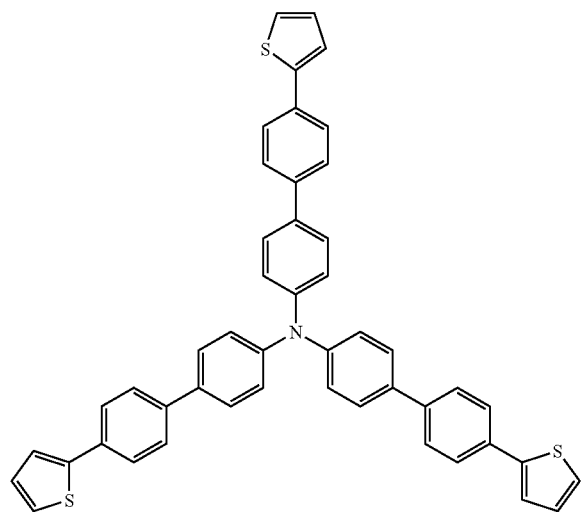
Compound (2)-33
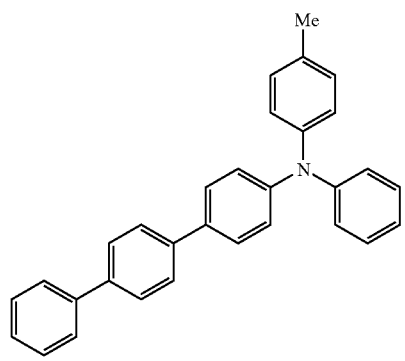
Compound (2)-34
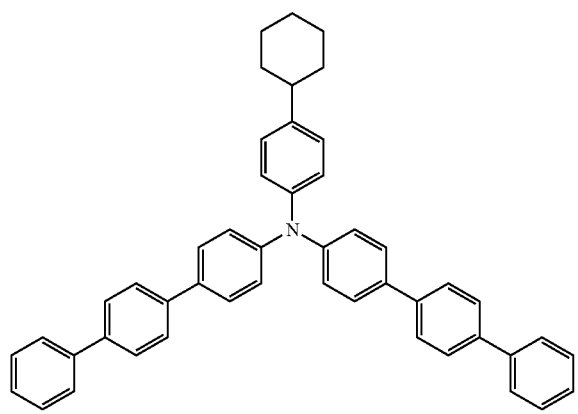
Compound (2)-35
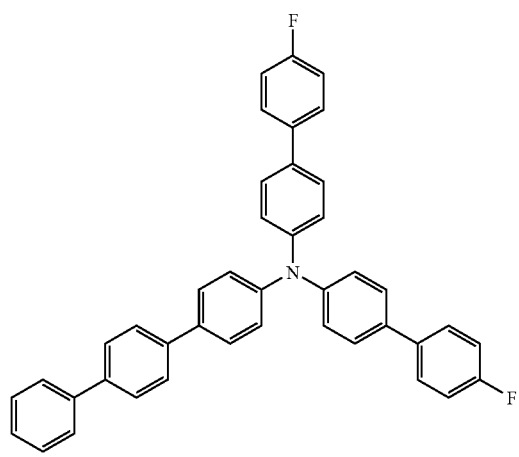

-continued
Compound (2)-36
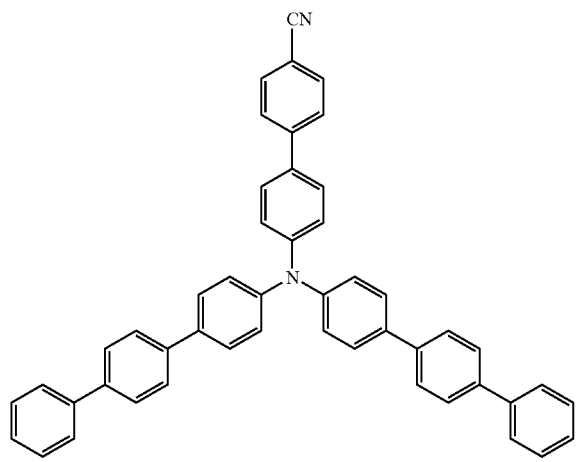
Compound (2)-37
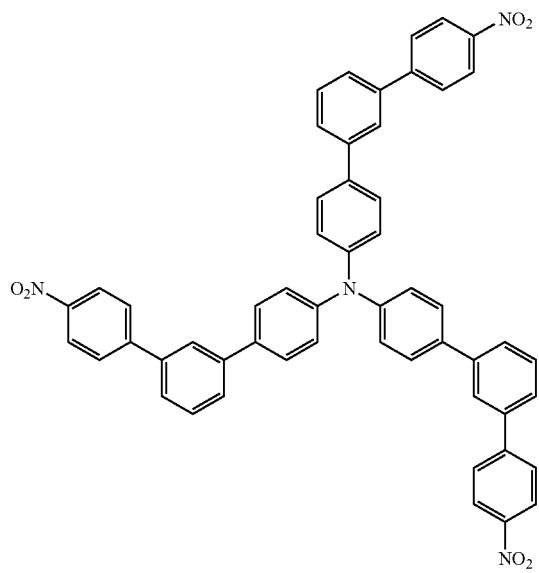
Compound (2)-38
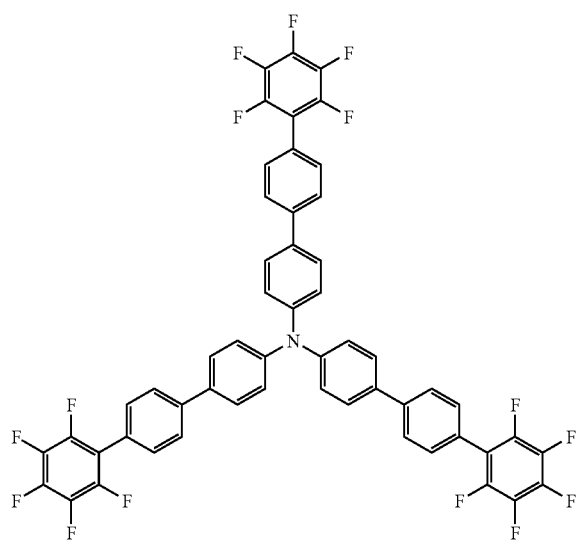
Compound (2)-39
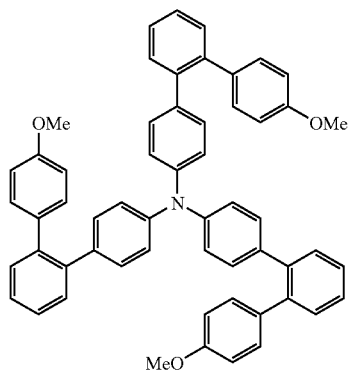
Compound (2)-40
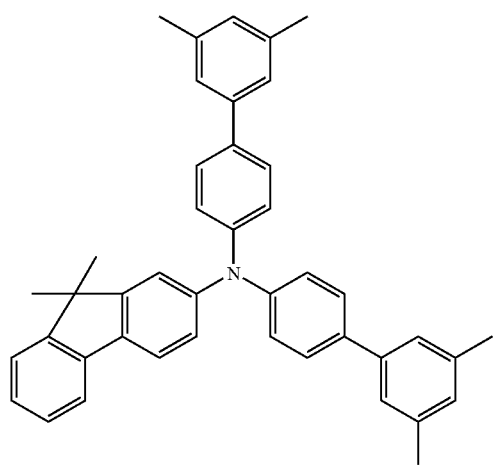
Compound (2)-41
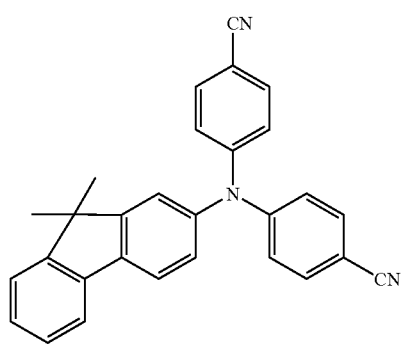

Compound (2)-42
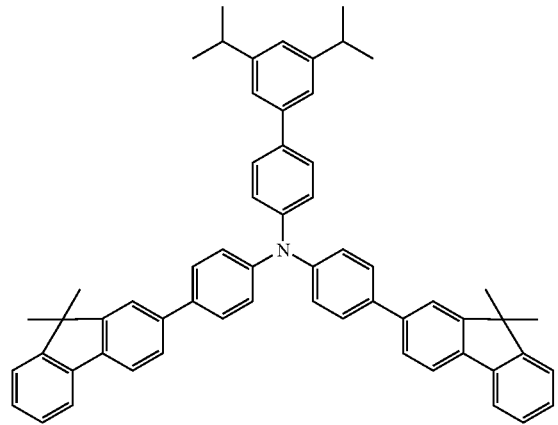
Compound (2)-43
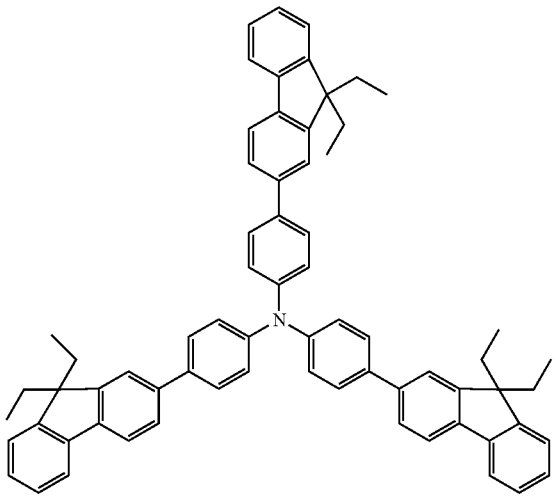
Compound (2)-44
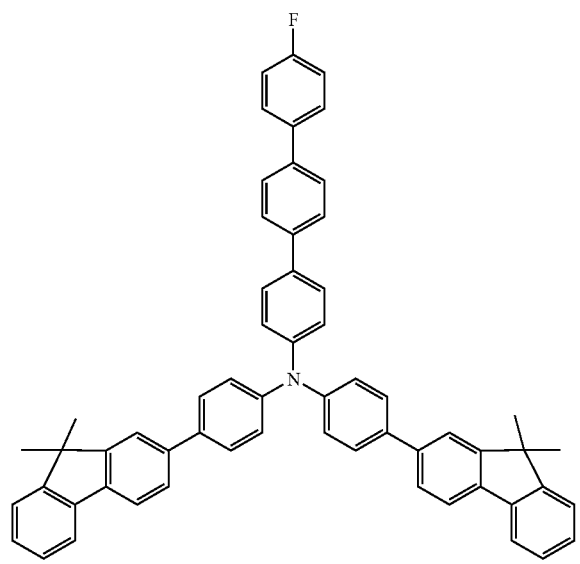
Compound (2)-45
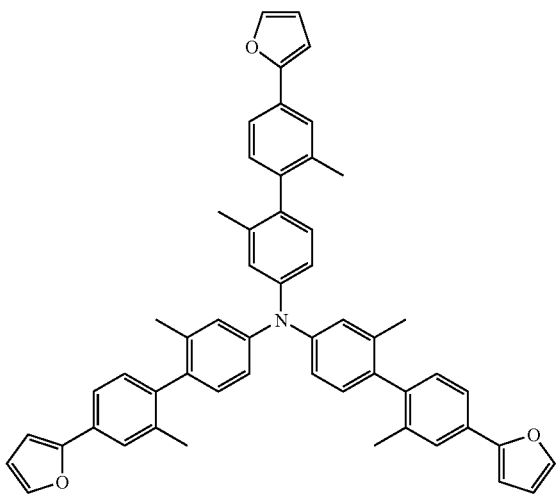

Compound (2)-46

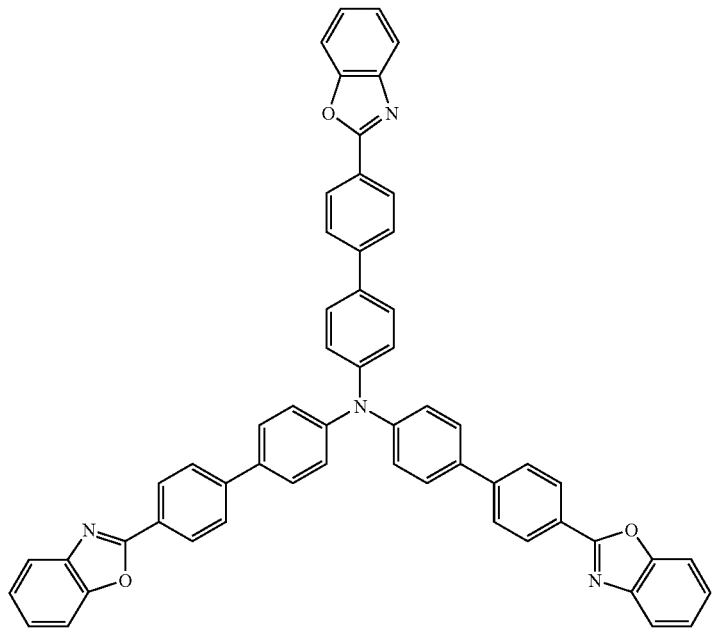

Compound (2)-47

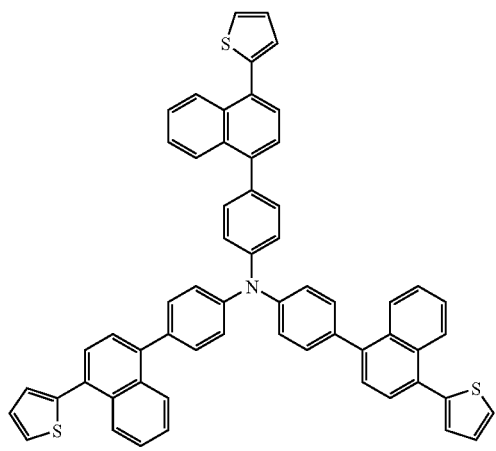

Compound (2)-48

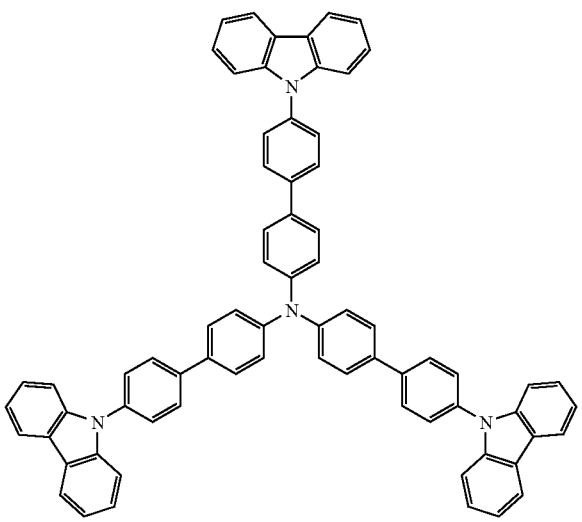

—Fluorene Derivative—

For example, a pyrrolidyl skeleton-containing fluorene derivative represented by the following general formula (3) is used as the material which configures the second hole transport layer 14*b*-2.

General Formula (3)

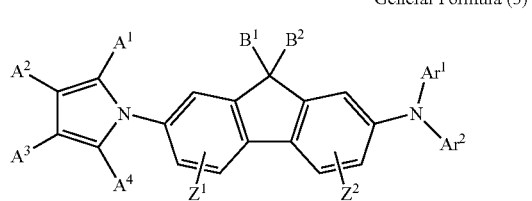

In the general formula (3), $A^1$ to $A^4$ which are bonded to the pyrrolidyl skeleton and $Z^1$ and $Z^2$ which are bonded to the fluorene skeleton each independently represents hydrogen, a halogen, a hydroxyl group, a carbonyl group, a carbonyl ester group, an alkyl group, an alkenyl group, an alkoxyl group, a cyano group, a nitro group or an amino group. Of these, each of the carbonyl group, the carbonyl ester group, the alkyl group, the alkenyl group and the alkoxyl group may be further substituted with other substituent and has not more than 20 carbon atoms. Also, the amino group may be further substituted with other substituent and has not more than 30 carbon atoms.

$A^1$ to $A^4$ which are bonded to the pyrrolidyl skeleton may constitute a cyclic structure in a site adjacent to each other.

Here, specific examples of a pyrrolidyl skeleton moiety are given below.

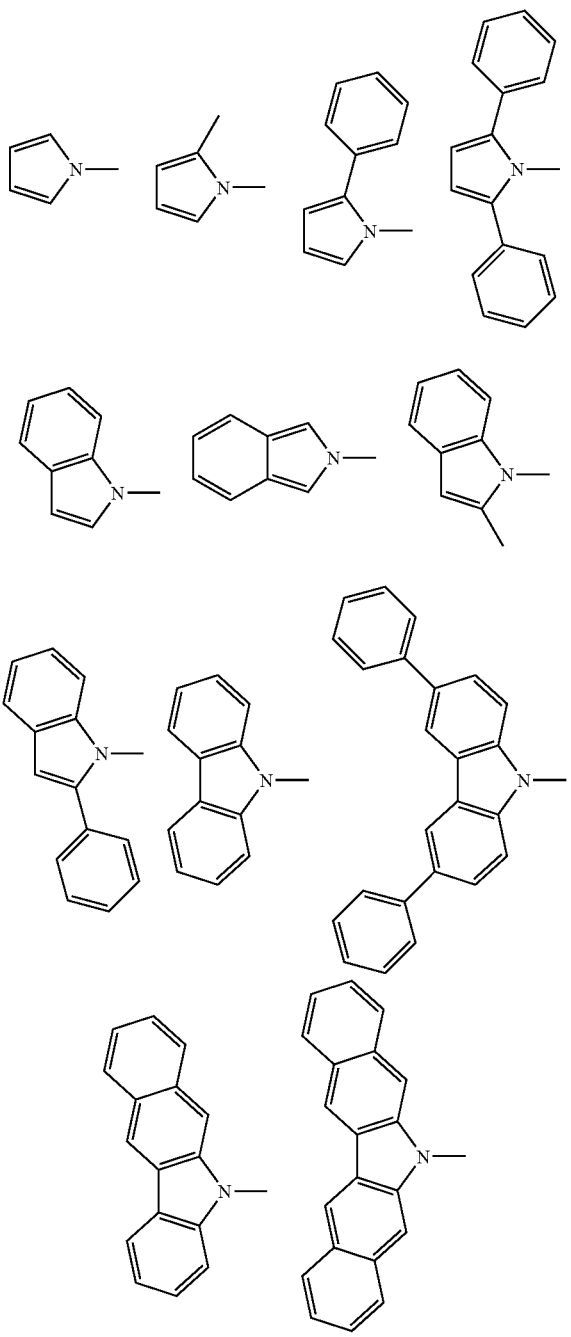

In the general formula (3), $Ar^1$ and $Ar^2$ each independently represents an aryl group or a heterocyclic group. Though such an aryl group or heterocyclic group may be subjected to single substitution or multiple substitution with a halogen, an alkyl group, an alkoxy group or an aryl group, it is an aryl group having from 6 to 20 carbon atoms in total (carbocyclic aromatic group) or a heterocyclic group having from 3 to 20 carbon atoms in total (heterocyclic aromatic group).

$Ar^1$ and $Ar^2$ are each preferably an aryl group having from to 20 carbon atoms in total which may be unsubstituted or subjected to single substitution or multiple substitution with a halogen, an alkyl group having from 1 to 14 carbon atoms, an alkoxy group having from 1 to 14 carbon atoms or an aryl group having from 6 to 10 carbon atoms.

$Ar^1$ and $Ar^2$ are each more preferably an aryl group having from 6 to 16 carbon atoms in total which may be unsubstituted or subjected to single substitution or multiple substitution with a halogen, an alkyl group having from 1 to 4 carbon atoms, an alkoxy group having from 1 to 4 carbon atoms or an aryl group having from 6 to 10 carbon atoms.

In the general formula (3), $B^1$ and $B^2$ each represents hydrogen, an alkyl group, an aryl group or a heterocyclic group. Of these, the alkyl group may be linear, branched or cyclic. The aryl group may be a substituted or unsubstituted aryl group having not more than 20 carbon atoms. The heterocyclic group may be a heterocyclic group having not more than 20 carbon atoms.

Specific examples of the substituted or unsubstituted aryl group which constitutes the general formula (3) include a phenyl group, a 1-naphthyl group, a 2-naphthyl group, a 2-anthryl group, a 9-anthryl group, a 4-quinolyl group, a 4-pyridyl group, a 3-pyridyl group, a 2-pyridyl group, a 3-furyl group, a 2-furyl group, a 3-thienyl group, a 2-thienyl group, a 2-oxazolyl group, a 2-thiazolyl group, a 2-benzoxazolyl group, a 2-benzothiazolyl group and a 2-benzimidazolyl group. However, it should not be construed that the invention is limited thereto.

Specific examples of the alkyl group which constitutes the general formula (3) include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a cyclopentyl group, an n-hexyl group, a 2-ethylbutyl group, a 3,3-dimethylbutyl group, a cyclohexyl group, an n-heptyl group, a cyclohexylmethyl group, an n-octyl group, a tert-octyl group, a 2-ethylhexyl group, an n-nonyl group, an n-decyl group, an n-dodecyl group, an n-tetradecyl group and an n-hexadecyl group. However, it should not be construed that the invention is limited thereto.

Specific examples of the fluorene derivative include the following Compounds (3)-1 to (3)-20.

Compound (3)-1

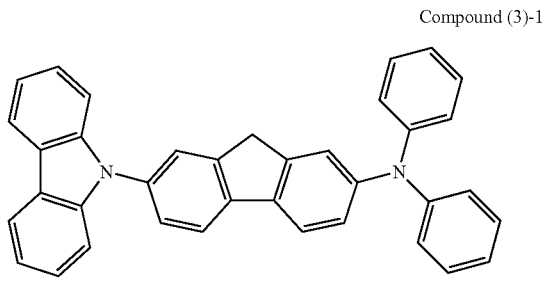

Compound (3)-2

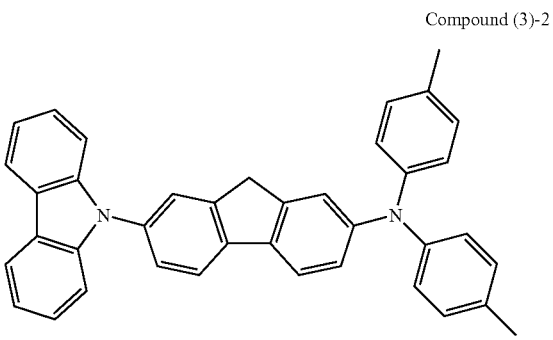

Compound (3)-3
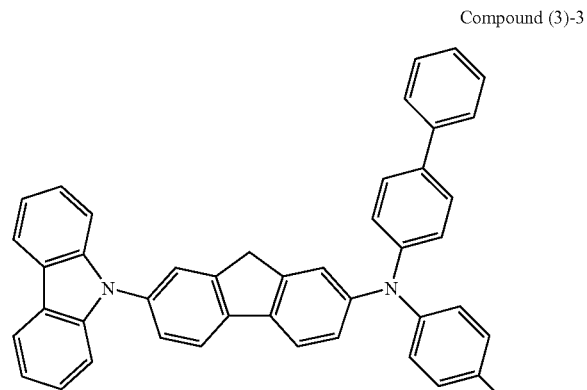
Compound (3)-4
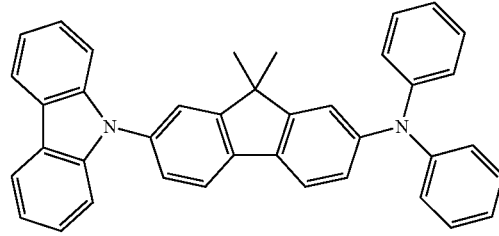
Compound (3)-5
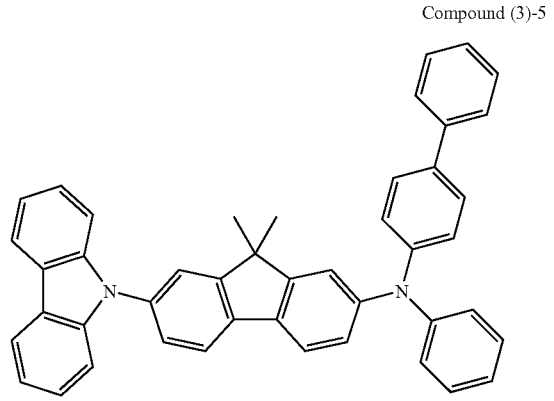
Compound (3)-6
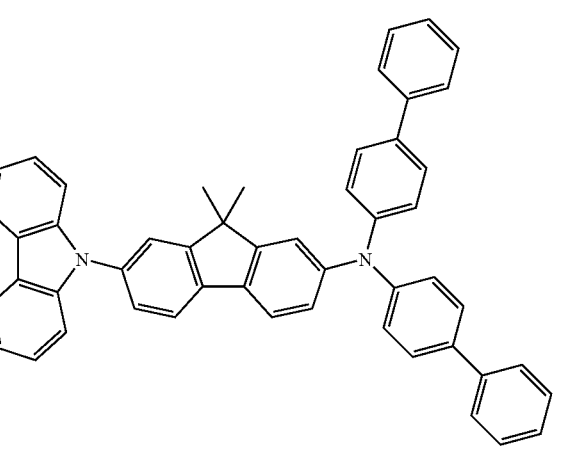
Compound (3)-7
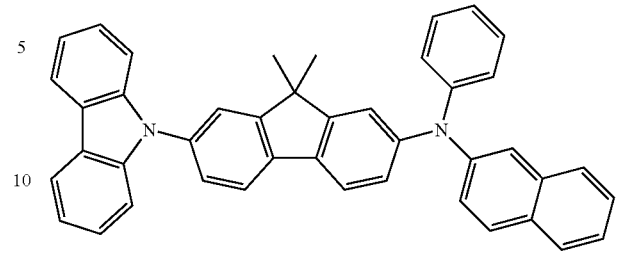
Compound (3)-8
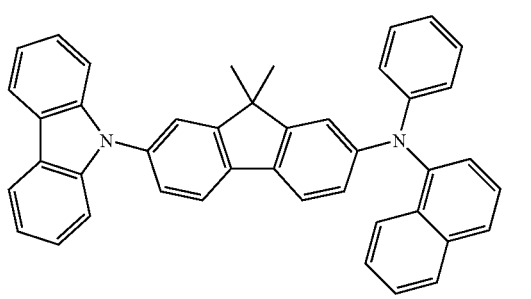
Compound (3)-9
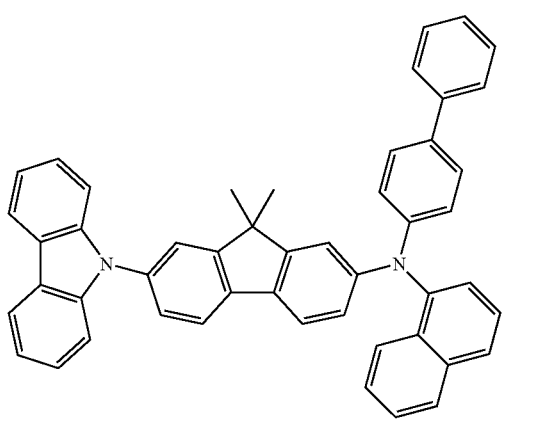
Compound (3)-10
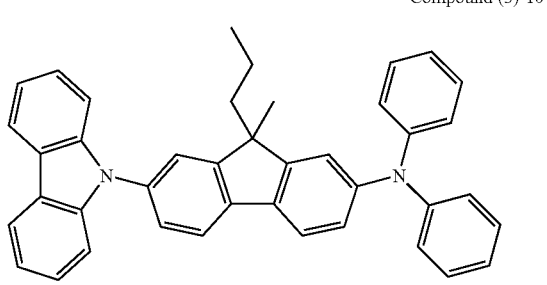
Compound (3)-11
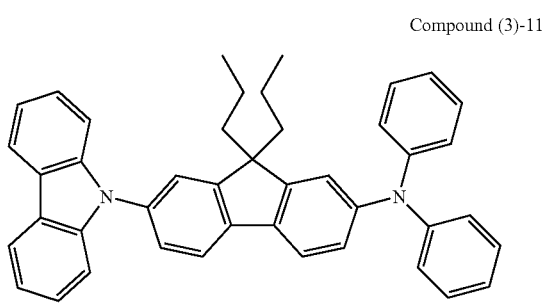

Compound (3)-12
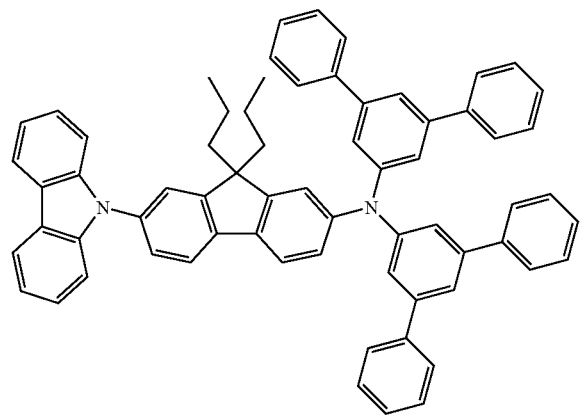
Compound (3)-13
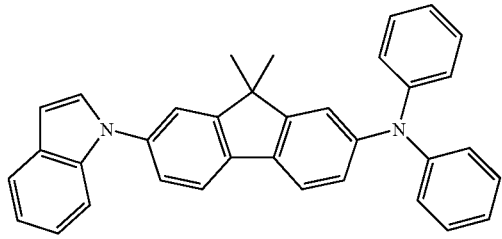
Compound (3)-14
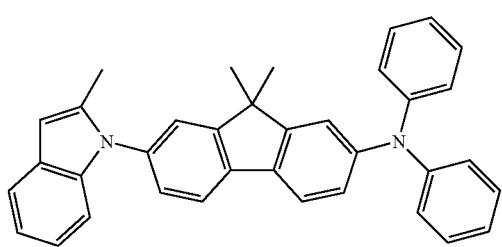
Compound (3)-15
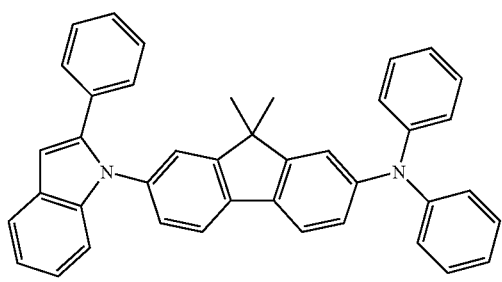
Compound (3)-16
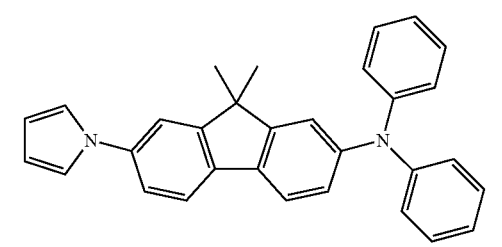
Compound (3)-17
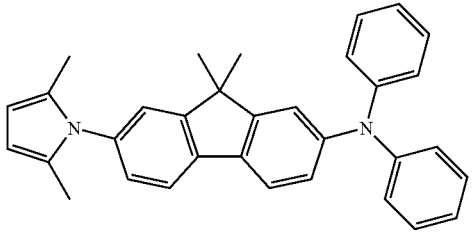
Compound (3)-18
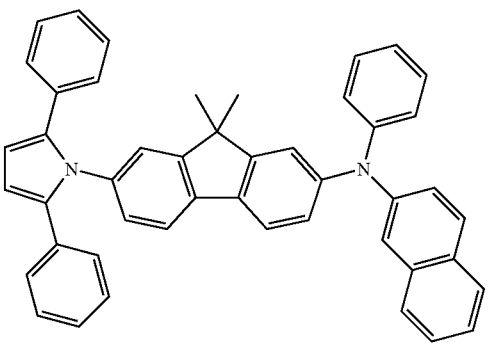
Compound (3)-19
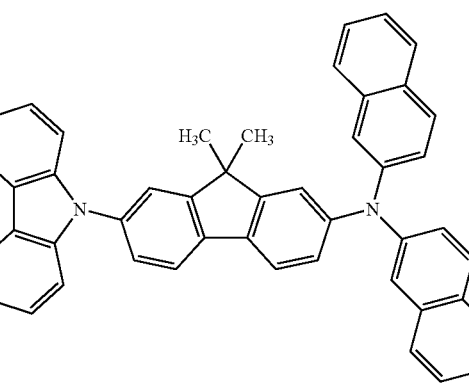
Compound (3)-20
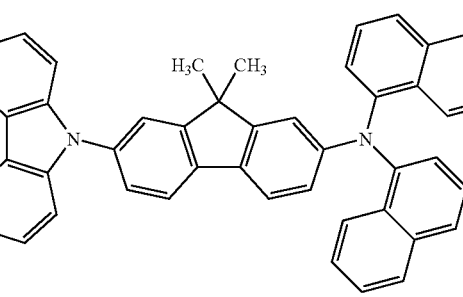
—Carbazole Derivative—
For example, a carbazole derivative represented by the following general formula (4) is used as the material which configures the second hole transport layer 14b-2.

General Formula (4)

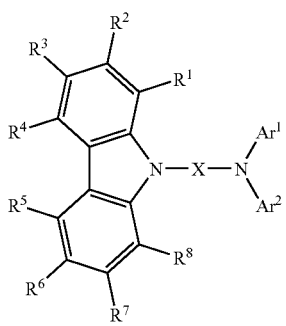

In the general formula (4), $Ar^1$ and $Ar^2$ each independently represents an aryl group or a heterocyclic group, each of which may have a substituent.

Examples of the aryl group represented by $Ar^1$ and $Ar^2$ include groups composed of a monocycle or a bi- to penta-fused ring of a benzene ring. Specific examples thereof include a phenyl group, a naphthyl group, an anthryl group, a phenanthryl group, a pyrenyl group and a perylenyl group. Examples of the heterocyclic group include groups composed of a monocycle or a bi- to penta-fused ring of a 5-membered ring or a 6-membered ring. Specific examples thereof include a pyridyl group, a triazinyl group, a pyrazinyl group, a quinoxalinyl group and a thienyl group.

Examples of a substituent which can be substituted on such an aryl group or heterocyclic group include an alkyl group (for example, linear or branched alkyl groups having from 1 to 6 carbon atoms, such as a methyl group and an ethyl group); an alkenyl group (for example, linear or branched alkenyl groups having from 1 to 6 carbon atoms, such as a vinyl group and an allyl group); an alkoxycarbonyl group (for example, linear or branched alkoxycarbonyl groups having from 1 to 6 carbon atoms, such as a methoxycarbonyl group and an ethoxycarbonyl group); an alkoxy group (for example, linear or branched alkoxy groups having from 1 to 6 carbon atoms, such as a methoxy group and an ethoxy group); an aryloxy group (for example, aryloxy groups having from 6 to 10 carbon atoms, such as a phenoxy group and a naphthoxy group); an aralkyloxy group (for example, aryloxy groups having from 7 to 13 carbon atoms, such as a benzyloxy group); a secondary or tertiary amino group (for example, linear or branched alkyl group-containing dialkylamino groups having from 2 to 20 carbon atoms, such as a diethylamino group and a diisopropylamino group; diarylamino groups such as a diphenylamino group and a phenylnaphthylamino group; and arylalkylamino groups having from 7 to 20 carbon atoms, such as a methylphenylamino group); a halogen atom (for example, a fluorine atom, a chlorine atom, a bromine atom and an iodine atom); an aromatic hydrocarbon cyclic group (for example, aromatic hydrocarbon cyclic groups having 6 to 10 carbon atoms, such as a phenyl group and a naphthyl group); and an aromatic heterocyclic group (for example, aromatic heterocyclic groups composed of a monocycle or a bi-fused ring of a 5-membered ring or a 6-membered ring, such as a thienyl group and a pyridyl group).

Of these, an alkyl group, an alkoxy group, an alkylamino group, an arylamino group, an arylalkylamino group, a halogen atom, an aryl group (aromatic hydrocarbon cyclic group) and a heterocyclic group (aromatic heterocyclic group) are preferable; and an alkyl group, an alkoxy group and an arylamino group are especially preferable.

When $Ar^1$ and $Ar^2$ are each of a structure containing three or more aromatic groups connected to each other via two or more direct bonds, for example, a terphenyl group, there is a possibility that the hole transport ability which an arylamino group represented by $—NAr^1Ar^2$ has is reduced. Accordingly, in order that characteristics of the compound according to an embodiment of the present invention may not be impaired, it is important that all of Ar1 and Ar2 are a group in which three or more aryl groups or heterocyclic groups are not directly bonded or not bonded in series via a short chain connecting group.

In the general formula (4), $R^1$ to $R^8$ each independently represents hydrogen, a halogen, an alkyl group, an aralkyl group, an alkenyl group, a cyano group, an amino group, an acyl group, an alkoxycarbonyl group, a carboxyl group, an alkoxy group, an aryloxy group, an alkylsulfonyl group, a hydroxyl group, an amide group, an aryl group or a heterocyclic group and may constitute a cyclic structure in a site adjacent to each other. Also, if possible, $R^1$ to $R^8$ may be each further substituted with other substituent.

Specific examples of $R^1$ to $R^8$ include a halogen (for example, a fluorine atom, a chlorine atom, a bromine atom and an iodine atom); an alkyl group (for example, linear or branched alkyl groups having from 1 to 6 carbon atoms, such as a methyl group and an ethyl group; and cycloalkyl groups having from 5 to 8 carbon atoms, such as a cyclopentyl group and a cyclohexyl group); an aralkyl group (for example, aralkyl groups having from 7 to 13 carbon atoms, such as a benzyl group and a phenethyl group); an alkenyl group (for example, linear or branched alkenyl groups having from 2 to 7 carbon atoms, such as a vinyl group and an allyl group); a cyano group; an amino group, and especially a tertiary amino group (for example, linear or branched alkyl group-containing dialkylamino groups having from 2 to 20 carbon atoms, such as a diethylamino group and a diisopropylamino group; diarylamino groups such as a diphenylamino group and a phenylnaphthylamino group; and arylalkylamino groups having from 7 to 20 carbon atoms, such as a methylphenylamino group); an acyl group (for example, linear, branched or cyclic hydrocarbon group moiety-containing acyl groups having from 1 to 20 carbon atoms, such as an acetyl group, a propionyl group, a benzoyl group and a naphthoyl group); an alkoxycarbonyl group (for example, linear or branched alkoxycarbonyl groups having from 2 to 7 carbon atoms, such as a methoxycarbonyl group and an ethoxycarbonyl group); a carboxyl group; an alkoxy group (for example, linear or branched alkoxy groups having from 1 to 6 carbon atoms, such as a methoxy group and an ethoxy group); an aryloxy group (for example, aryloxy groups having from 6 to 10 carbon atoms, such as a phenoxy group and a benzyloxy group); an alkylsulfonyl group (for example, alkylsulfonyl groups having from 1 to 6 carbon atoms, such as a methylsulfonyl group, an ethylsulfonyl group, a propylsulfonyl group, a butylsulfonyl group and a hexylsulfonyl group); a hydroxyl group; an amide group (for example, alkylamide groups having from 2 to 7 carbon atoms, such as a methylamide group, a dimethylamide group and a diethylamide group; and arylamide groups such as a benzylamide group and a dibenzylamide group); an aryl group (for example, aromatic hydrocarbon ring groups composed of a monocycle or a bi- to tetra-fused ring of a benzene ring, such as a phenyl group, a naphthyl group, an anthryl group, a phenanthryl group and a pyrenyl group); and a heterocyclic group (for example, aromatic heterocyclic groups composed of a monocycle or a bi- to tri-fused ring of a 5-membered ring or a 6-membered ring, such as a carbazolyl group, a pyridyl group, a triazyl group, a pyrazyl group, a quinoxalyl group and a thienyl group).

$R^1$ to $R^8$ are more preferably a hydrogen atom, a halogen atom, an alkyl group, an alkoxy group, an aryl group (aromatic hydrocarbon ring group) or a heterocyclic group (aromatic heterocyclic group).

The foregoing groups as exemplified above for $R^1$ to $R^8$ may further have a substituent. Examples of such a substituent include a halogen atom (for example, a fluorine atom, a chlorine atom, a bromine atom and an iodine atom); an alkyl group (for example, linear or branched alkyl groups having from 1 to 6 carbon atoms, such as a methyl group and an ethyl group); an alkenyl group (for example, linear or branched alkenyl groups having from 1 to 6 carbon atoms, such as a vinyl group and an allyl group); an alkoxycarbonyl group (for example, linear or branched alkoxycarbonyl groups having from 1 to 6 carbon atoms, such as a methoxycarbonyl group and an ethoxycarbonyl group); an alkoxy group (for example, linear or branched alkoxy groups having from 1 to 6 carbon atoms, such as a methoxy group and an ethoxy group); an aryloxy group (for example, aryloxy groups having from 6 to 10 carbon atoms, such as a phenoxy group and a naphthoxy group); a dialkylamino group (for example, linear or branched alkyl group-containing dialkylamino groups having from 2 to 20 carbon atoms, such as a diethylamino group and a diisopropylamino group); a diarylamino group (for example, diarylamino groups such as a diphenylamino group and a phenylnaphthylamino group); an aromatic hydrocarbon ring group (for example, aromatic hydrocarbon ring groups such as a phenyl group); an aromatic heterocyclic group (for example, aromatic heterocyclic groups composed of a monocycle of a 5-membered ring or a 6-membered ring, such as a thienyl group and a pyridyl group); an acyl group (for example, linear or branched acyl groups having from 1 to 6 carbon atoms, such as an acetyl group and a propionyl group); a haloalkyl group (for example, linear or branched haloalkyl groups having from 1 to 6 carbon atoms, such as a trifluoromethyl group); and a cyano group. Of these, a halogen atom, an alkoxy group and an aromatic hydrocarbon ring group are more preferable.

Adjacent groups of $R^1$ to $R^8$ may be taken together to form a ring to be fused on an N-carbazolyl group. The ring formed when adjacent groups of $R^1$ to $R^8$ are taken together is in general a 5-membered ring to 8-membered ring, preferably a 5-membered ring or a 6-membered ring, and more preferably a 6-membered ring. This ring may be an aromatic ring or a non-aromatic ring and is preferably an aromatic ring. Furthermore, this ring may be an aromatic hydrocarbon ring or an aromatic heterocyclic ring and is preferably an aromatic hydrocarbon ring.

In the N-carbazolyl group of the general formula (1) the following can be exemplified as an example in which any one of $R^1$ to $R^8$ is bonded to form a fused ring to be bonded to the N-carbazolyl group.

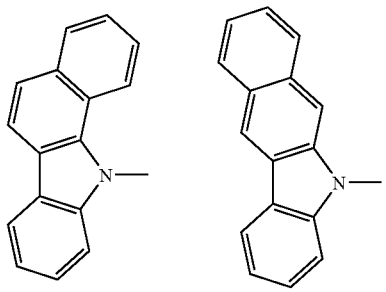

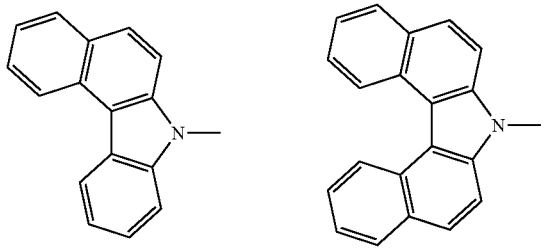

A structure where $R^1$ to $R^8$ are all a hydrogen atom (namely the N-carbazolyl group is unsubstituted) or a structure where one or more of $R^1$ to $R^8$ are any one of a methyl group, a phenyl group or a methoxy group, with the remainder being a hydrogen atom is especially preferable.

In the general formula (4), X represents a divalent aromatic ring group. It would be better that X is, for example, a connecting group having from 1 to 4 arylene groups or divalent heterocyclic groups bonded therein, which may be further substituted.

Such a connecting group X is represented by —$Ar^3$—, —$Ar^4$—$Ar^5$—, —$Ar^6$—$Ar^7$—$Ar^8$— or —$Ar^9$—$Ar^{10}$—$Ar^{11}$—$Ar^{12}$—.

$Ar^3$, $Ar^4$, $Ar^5$, $Ar^6$, $Ar^8$, $Ar^9$ and $Ar^{12}$ each of which constitutes an end portion of the connecting group X each represents a divalent group composed of a monocycle or a bi- to penta-fused ring of a 5-membered or 6-membered aromatic ring, which may be substituted.

Specific examples of such $Ar^3$, $Ar^4$, $Ar^5$, $Ar^6$, $Ar^8$, $Ar^9$ and $Ar^{12}$ include a divalent aromatic hydrocarbon ring group (for example, a phenylene group, a naphthylene group, an anthrylene group, a phenanthrylene group, a pyrenylene group and a perylenylene group); and a divalent aromatic heterocyclic group (for example, a pyridylene group, a triazylene group, a pyrazylene group, a quinoxalylene group, a thienylene group and an oxadiazolylene group).

$Ar^7$, $Ar^{10}$ and $Ar^{11}$ each of which constitutes an intermediate portion of the connecting group X may be each a divalent aromatic group the same as in the foregoing $Ar^3$ and the like or a divalent arylamino group. However, when $Ar^7$, $Ar^{10}$ and $Ar^{11}$ each represents a divalent arylamino group, the aryl group thereof is a 5-membered or 6-membered aromatic group, and examples thereof include a phenyl group, a naphthyl group, an anthryl group, a phenanthryl group, a thienyl group, a pyridyl group and a carbazolyl group. These groups may each have a substituent.

In order to enhance the stiffness of a compound and the heat resistance to be caused by this, $Ar^3$ which is the smallest connecting group as the connecting group X is preferably a tri- or more fused ring.

$Ar^4$, $Ar^5$, $Ar^6$, $Ar^8$, $Ar^9$ and $Ar^{12}$ each of which constitutes an end portion of the connecting group X are each preferably a monocycle or a bi- to tri-fused ring, and more preferably a monocycle or a bi-fused ring.

Examples of a substituent which is substituted on the aromatic ring which constitutes the connecting group X include the same groups as those described above as the substituent which can be substituted on each of $R^1$ to $R^8$. Above all, an alkyl group, an alkoxy group, an aromatic hydrocarbon ring group and an aromatic heterocyclic group are especially preferable.

Specific examples of the foregoing carbazole derivative include the following Compounds (4)-1 to (4)-26.

Compound (4)-1
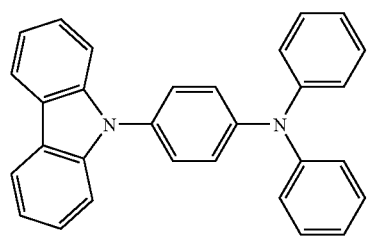
Compound (4)-2
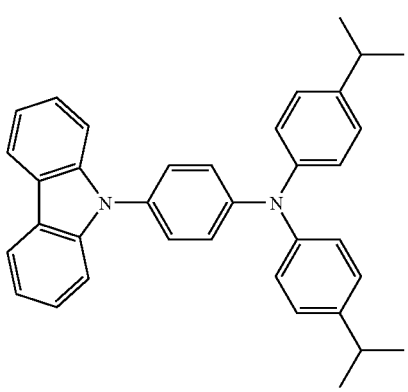
Compound (4)-3
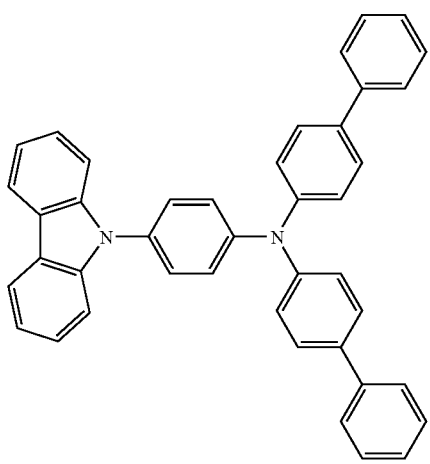
Compound (4)-4
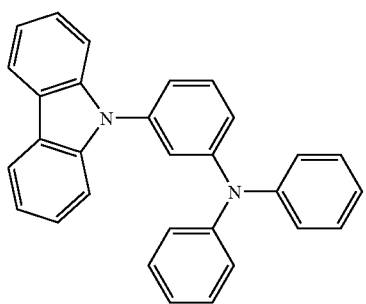
Compound (4)-5
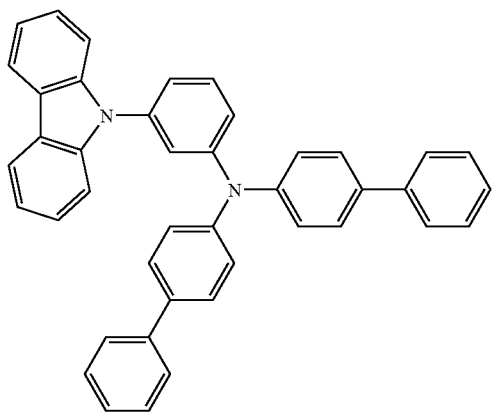
Compound (4)-6
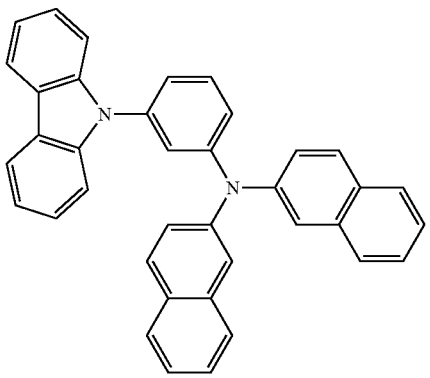
Compound (4)-7
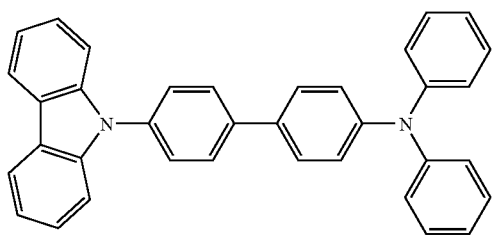
Compound (4)-8
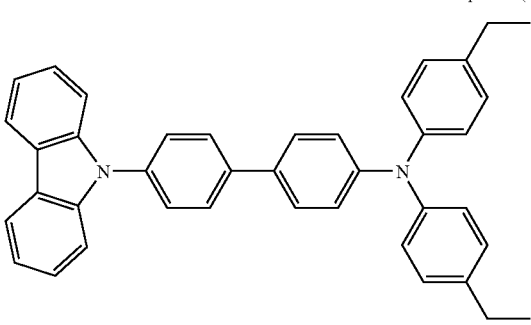

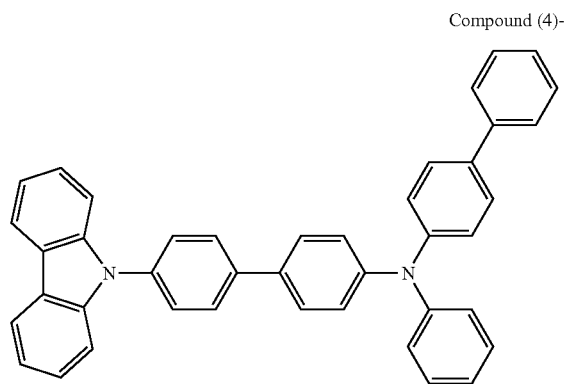
Compound (4)-9
Compound (4)-10
Compound (4)-11
Compound (4)-12
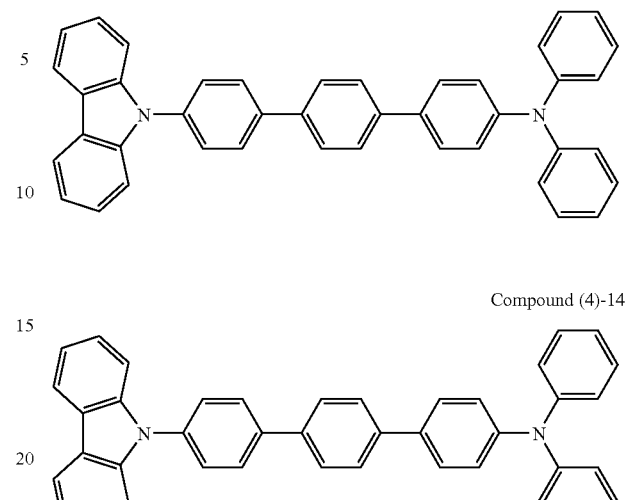
Compound (4)-13
Compound (4)-14
Compound (4)-15
Compound (4)-16
Compound (4)-17

Compound (4)-18
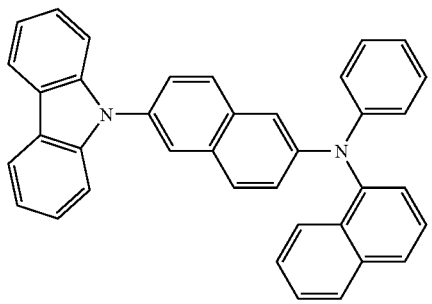

Compound (4)-19
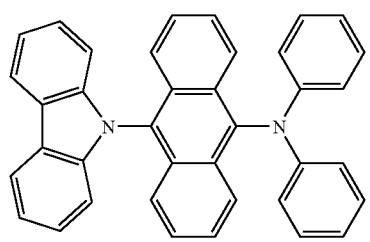

Compound (4)-20
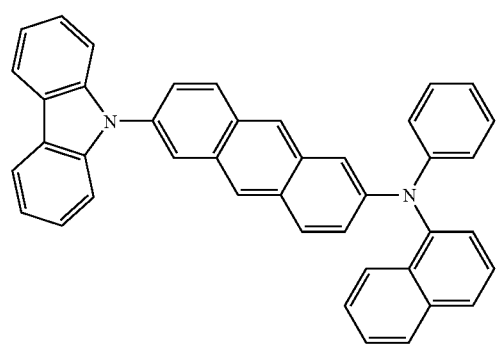

Compound (4)-21
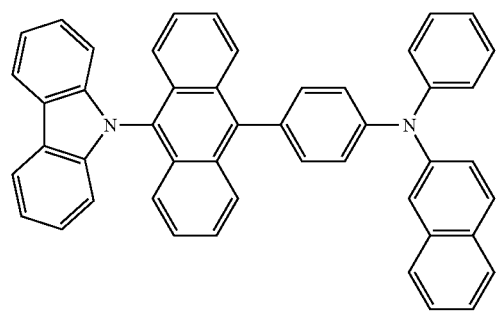

Compound (4)-22
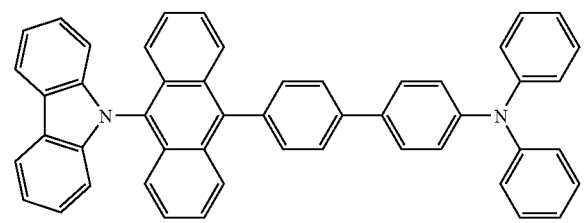

Compound (4)-23
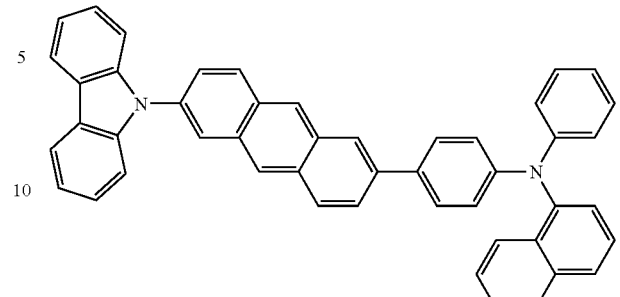

Compound (4)-24
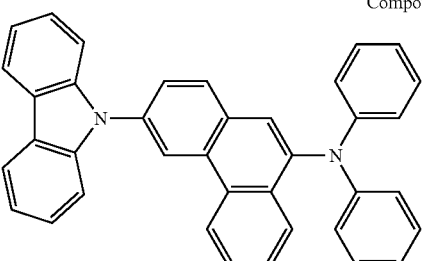

Compound (4)-25
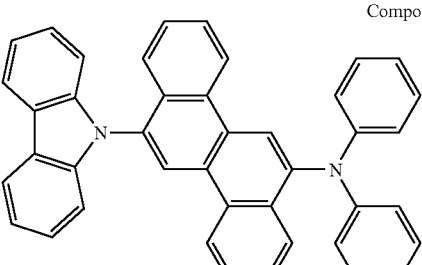

Compound (4)-26
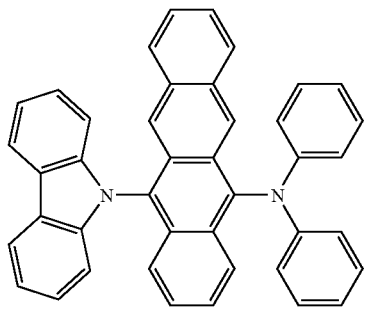

The foregoing second hole transport layer 14b-2 may be configured of plural compounds among the organic materials represented by the foregoing general formulae (2) to (4) and may have a stack structure by itself.

In the organic electroluminescent device 11' in which the foregoing second hole transport layer 14b-2 is provided, especially in the case where the second hole transport layer includes the compound represented by the general formula (3) or (4), it is preferable that the photosensitizing layer 14d contains a compound with hole trapping properties. Examples of the compound with hole trapping properties include aminonaphthalene derivatives, aminoanthracene derivatives, aminochrysene derivatives, aminopyrene derivatives, styrylamine derivatives and bis(azinyl)methene boron complexes. The compound with hole trapping properties is selected among these compounds and used.

As described in detail in the Examples as described later, in the organic electroluminescent device 11' in which the second hole transport layer 14b-2 composed of the foregoing material is provided, it was noted that the initial deterioration of brightness life is greatly improved while maintaining the luminous efficiency and color purity as compared with a configuration provided with a hole transport layer of a single-layer structure which is composed of a material other than those represented by the foregoing general formulae (2) to (4).

Thus, similar to the organic electroluminescent device 11 as described above by referring to FIG. 1, the organic electroluminescent device 11' is able to attain an enhancement of brightness life and a reduction of consumed electric power by the configuration in which the photosensitizing layer 14d is provided. Also, the organic electroluminescent device 11' is able to attain an enhancement of brightness life and a reduction of consumed electric power by specifying the stack structure of the hole transport layer 14b.

<<Diagrammatic Configuration of Display Apparatus>>

Figure 3A:
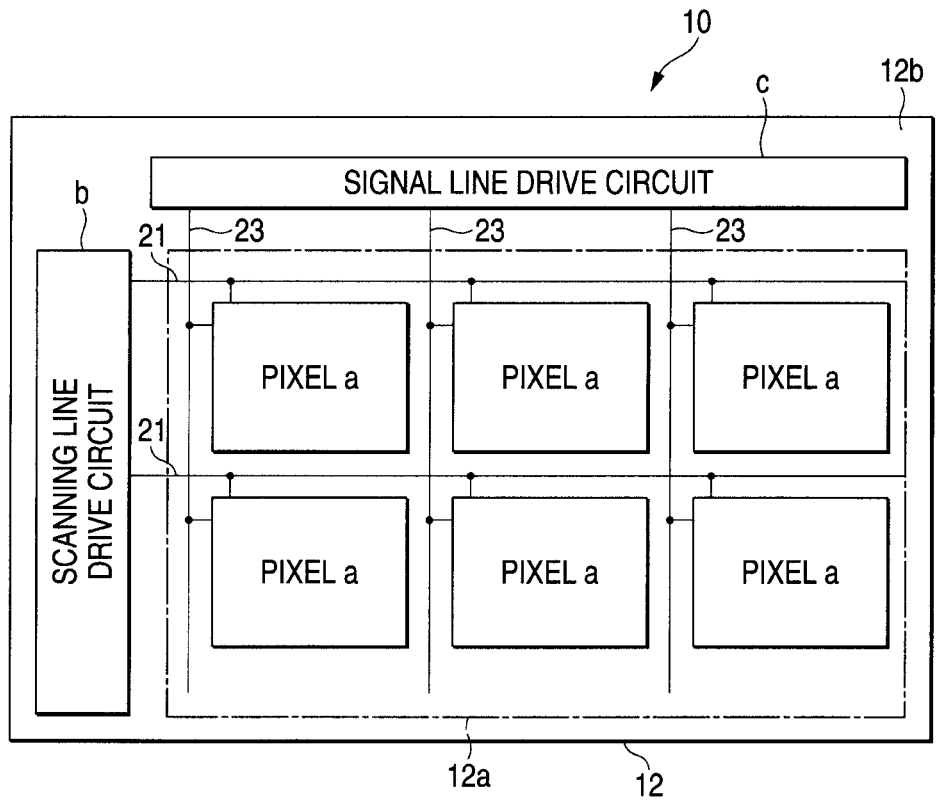
FIGS. 3A and 3B are each a view showing one example of a circuit configuration of a display apparatus according to an embodiment of the present invention.
Figure 3B:
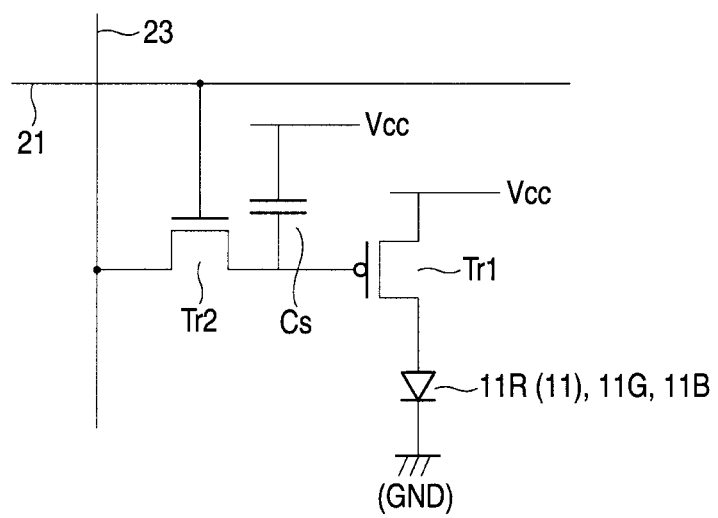

FIGS. 3A and 3B are views showing one example of a display apparatus 10 according to an embodiment of the present invention, in which FIG. 3A is a diagrammatic configuration view; and FIG. 3B is a configuration view of a pixel circuit. Here, an embodiment in which an embodiment according to the present invention is applied to a display apparatus 10 of an active matrix mode using the organic electroluminescent device 11 as a light-emitting device is illustrated.

As illustrated in FIG. 3A, a display region 12a and a circumferential region 12b thereof are set up on the substrate 12 of this display apparatus 10. In the display region 12a, plural scanning lines 21 and plural signal lines 23 are wired longitudinally and laterally, and a pixel array portion in which one pixel a is provided corresponding to an intersection there between is configured. Each pixel a is provided with one of organic electroluminescent devices 11R (11), 11G and 11B. In the circumferential region 12b, a scanning line drive circuit b for scanning and driving the scanning lines 21 and a signal line drive circuit c for feeding a picture signal (namely an input signal) corresponding to the brightness information to the signal lines 23 are arranged.

As illustrated in FIG. 3B, the pixel circuit provided in each pixel a is configured of, for example, one of the respective organic electroluminescent devices 11R (11), 11G and 11B, a drive transistor Tr1, a write transistor (sampling transistor) Tr2 and a storage capacitor Cs. Due to the drive by the scanning line drive circuit b, a picture signal written from the signal lines 23 via the write transistor Tr2 is stored in the storage capacitor Cs; a current corresponding to the amount of the stored signal is fed to each of the organic electroluminescent devices 11R (11), 11G and 11B; and each of the organic electroluminescent devices 11R (11), 11G and 11B undergoes emission with a brightness corresponding to this current value.

The foregoing configuration of the pixel circuit is one example to the last, and the pixel circuit may be configured by providing a capacity device or further providing plural transistors within the pixel circuit as the need arises. Also, a necessary drive circuit is added in the circumferential region 2b corresponding to the change of the pixel circuit.

<<Cross-Sectional Configuration-1 of Display Apparatus>>

Figure 4:
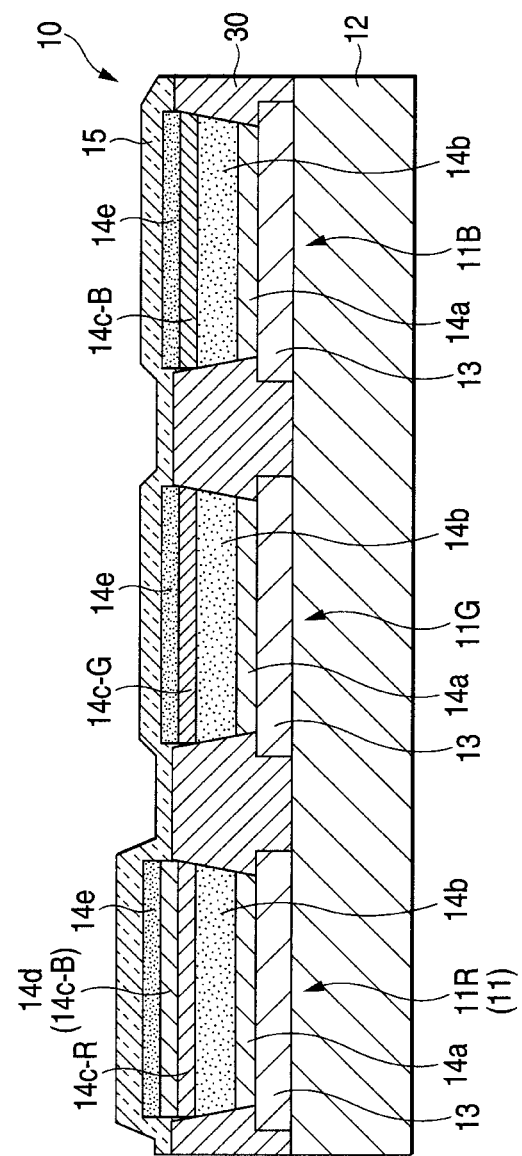
FIG. 4 is a view showing a first example of a cross-sectional configuration of the essential part in a display apparatus according to an embodiment of the present invention.

FIG. 4 is a view showing a first example of a cross-sectional configuration of the essential part in the display region of the foregoing display apparatus 10.

In the display region of the substrate 12 in which the organic electroluminescent devices 11R (11), 11G and 11B are provided, while illustration is omitted, a drive transistor, a write transistor, scanning lines and signal lines are provided so as to configure the foregoing pixel circuit (see FIGS. 3A and 3B), and an insulating film is provided in a state of covering them.

The organic electroluminescent devices 11R (11), 11G and 11B are aligned and formed on the substrate 12 covered by this insulating film. Each of the organic electroluminescent devices 11R (11), 11G and 11B is configured as a device of a top emission type for extracting light from an opposite side to the substrate 12.

The anode 13 of each of the organic electroluminescent devices 11R (11), 11G and 11B is pattern formed in every device. Each of the anodes 13 is connected to the drive transistor of the pixel circuit via a connection hole formed in the insulating film which covers the surface of the substrate 12.

In each of the anodes 13, its surrounding is covered by an insulating film 30, and a center of the anode 13 is exposed in an aperture portion provided in the insulating film 30. The organic layer 14 is pattern formed in a state of covering the exposed portion of the anode 13, and the cathode 15 is provided as a common layer for covering the respective organic layers 14.

Of these organic electroluminescent devices 11R (11) 11G and 11B, in particular, the red light-emitting device 11R is configured as the organic electroluminescent device (11) in the embodiment as described above by referring to FIG. 1. On the other hand, the green light-emitting device 11G and the blue light-emitting device 11B may be each of a usual device configuration.

Namely, in the red light-emitting device 11R (11), the organic layer 14 provided on the anode 13 is, for example, a stack of the hole injection layer 14a, the hole transport layer 14b, a red light-emitting layer 14c-R (14c) using a naphthacene derivative as a host material, the photosensitizing layer 14d prepared by doping a host material with a light-emitting guest material for generating emission of a blue region and the electron transport layer 14e in this order from the side of the anode 13.

On the other hand, the organic layer in each of the green light-emitting device 11G and the blue light-emitting device 11B is, for example, a stack of the hole injection layer 14a, the hole transport layer 14b, light-emitting layers 14c-G and 14c-B of respective colors and the electron transport layer 14e in this order from the side of the anode 13.

The photosensitizing layer 14d in the red light-emitting device 11R (11) is a layer doped with a blue light-emitting guest material and may be, for example, the same configuration (material) as the blue light-emitting layer 14c-B in the blue light-emitting device 11B. Besides the light-emitting layers 14c-R, 14c-G and 14c-B and the photosensitizing layer 14d, each of other layers inclusive of the anode 13 and the cathode 15 may be configured of the same material in each of the organic electroluminescent devices 11R, 11G and 11B and includes each of the materials as described above by referring to FIG. 1.

The thus provided plural organic electroluminescent devices 11R (11), 11G and 11B are covered by a passivation film. This passivation film is provided so as to cover the whole of the display region in which the organic electroluminescent devices 11R, 11G and 11B are provided.

Each of the layers including from the anode 13 to the cathode 15, which configure the red light-emitting device 11R (11), the green light-emitting device 11G and the blue light-emitting device 11B, respectively, can be formed by a dry process, for example, a vacuum vapor deposition method, an ion beam method (EB method), a molecular beam epitaxy method (MBE method), a sputtering method and an organic vapor phase deposition (OVPD) method.

So far as an organic layer is concerned, in addition to the foregoing methods, a wet process, for example, a coating method (for example, a laser transfer method, a spin coating method, a dipping method, a doctor blade method, a discharge coating method and a spray coating method) and a printing method (for example, an inkjet method, an offset printing method, a letterpress printing method, an intaglio printing method, a screen printing method and a microgravure coating method) can be employed for the formation. The dry process and the wet process may be used jointly depending upon the properties of each organic layer and each material.

The organic layer 14 which has been thus pattern formed for every device of the organic electroluminescent devices 11R (11), 11G and 11B is, for example, formed by a vapor deposition method or a transfer method using a mask.

In the thus configured display apparatus 10 of the first example, the organic electroluminescent device (11) of the configuration according to an embodiment of the present invention as described above by referring to FIG. 1 is used as the red light-emitting device 11R. As described previously, this red light-emitting device 11R (11) has high luminous efficiency while keeping the red luminous color. For that reason, it is possible to undergo full-color display with high color expression properties by combining the green light-emitting device 11G and the blue light-emitting device 11B together with this red light-emitting device 11R (11).

Also, by using the organic electroluminescent device (11) with high luminous efficiency, the display apparatus 10 is brought with effects that not only the brightness life can be improved, but a consumed electric power can be reduced. Accordingly, the display device 10 can be suitably used as a flat panel display such as a wall-mounted television set and a plane luminant and is applicable to light sources of copiers, printers, etc., light sources of liquid crystal displays, meters, etc., display boards, marker lamps and the like.

<<Cross-Sectional Configuration-2 of Display Apparatus>>

Figure 5:
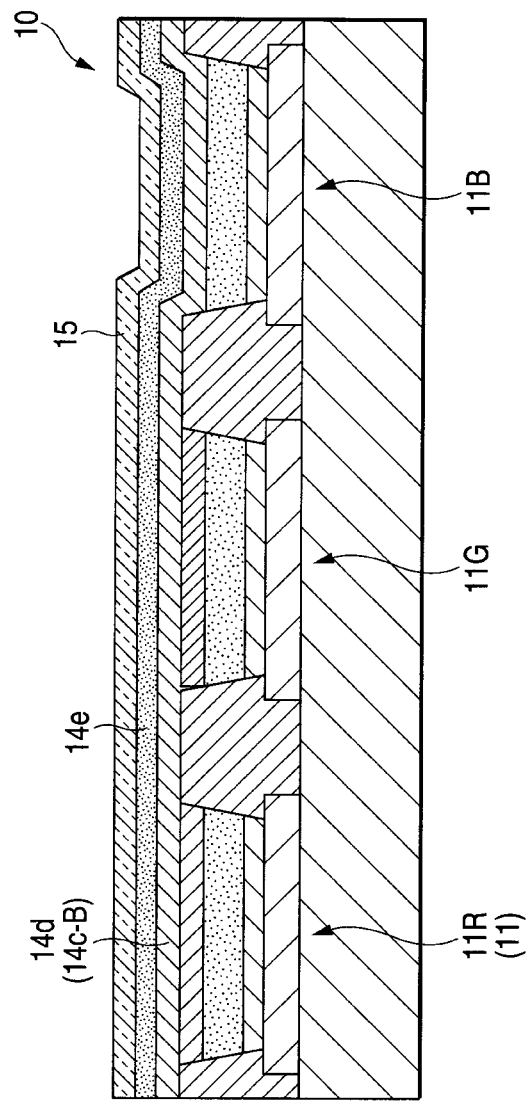
FIG. 5 is a view showing a second example of a cross-sectional configuration of the essential part in a display apparatus according to an embodiment of the present invention.

FIG. 5 is a view showing a second example of a cross-sectional configuration of the essential part in the display region of the foregoing display apparatus 10.

A difference of the display apparatus 10 of the second example as illustrated in FIG. 5 from that of the first example as illustrated in FIG. 4 resides in the matter that the upper layers than the light-emitting layers 14c-R and 14c-G are continuously formed as a common layer in each of the organic electroluminescent devices 11R (11), 11G and 11B, and other configuration may be the same. In that case, the blue light-emitting layer 14c-B, the electron transport layer 14e and the cathode 15 are provided as a common layer over plural pixels.

The blue light-emitting layer 14c-B which is a common layer is provided as the photosensitizing layer 14d in the red light-emitting device 11R (11). On the other hand, blue light-emitting light generated in the portion of the blue light-emitting layer 14c-B provided in the green light-emitting layer 11G is absorbed in the green light-emitting layer 14c-G and contributes to green emission. Also, in that case, in each of the organic electroluminescent devices 11R (11), 11G and 11B, by configuring the structure of the organic layer as a cavity structure for extracting light-emitting light of each color, an enhancement of the color purity of the extracted light-emitting light is attained.

In the thus configured display apparatus 10 of the second example, the same effects as in the first example are obtainable. Also, in particular, the respective upper layers than the blue light-emitting layer 14c-B (photosensitizing layer 14d) can be fabricated collectively relative to the display region by using a large-aperture area mask. Thus, it is possible to attain simplification of the manufacturing steps of the display apparatus 10.

<<Cross-Sectional Configuration-3 of Display Apparatus>>

Figure 6:
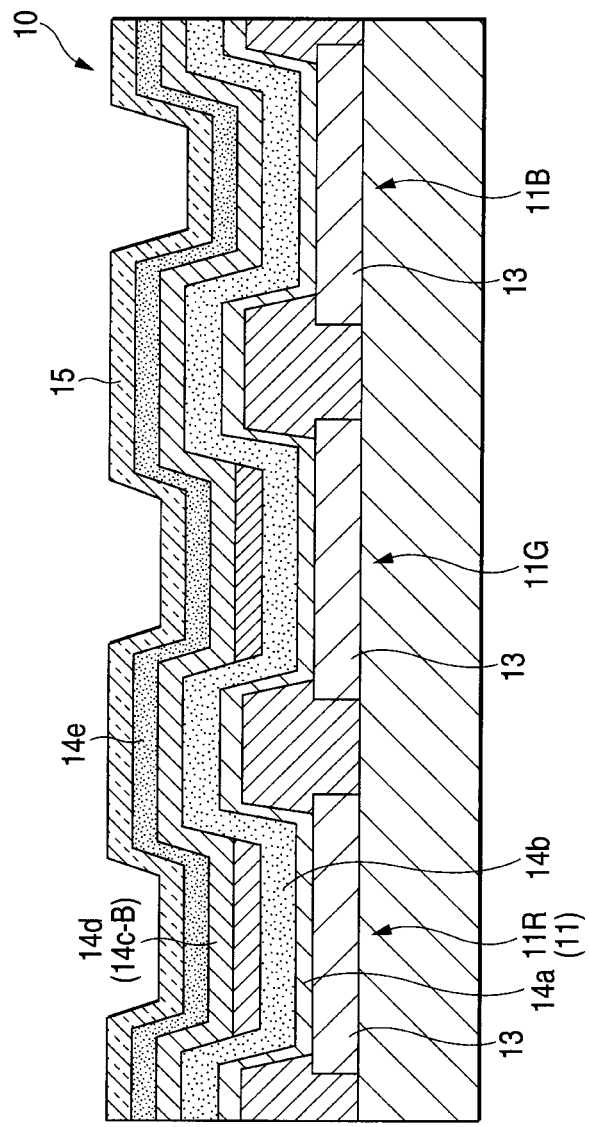
FIG. 6 is a view showing a third example of a cross-sectional configuration of the essential part in a display apparatus according to an embodiment of the present invention.

FIG. 6 is a view showing a third example of a cross-sectional configuration of the essential part in the display region of the foregoing display apparatus 10.

In the display apparatus 10 of the third example as illustrated in FIG. 6, in each of the organic electroluminescent devices 11R (11), 11G and 11B, the layers other than the anode 13 and the light-emitting layers 14c-R and 14c-G are formed as a common layer, and other configuration may be the same as in the first example. Namely, in addition to the blue light-emitting layer 14c-B (photosensitizing layer 14d), the electron transport layer 14e and the cathode 15 which are formed as a common layer in the second example, the hole injection layer 14a and the hole transport layer 14b each of which is a lower layer than the light-emitting layer are also used as a common layer.

Even the thus configured display apparatus 10 of the third example is able to bring the same effects as in the second example. Also, it is possible to attain more simplification of the manufacturing steps as compared with the second example.

In the foregoing first example to the third example, the embodiments in which the present invention is applied to a display apparatus of an active matrix type have been described. However, the display apparatus according to the present invention is also applicable to a display apparatus of a passive matrix type, and the same effects can be obtained.

Figure 7:
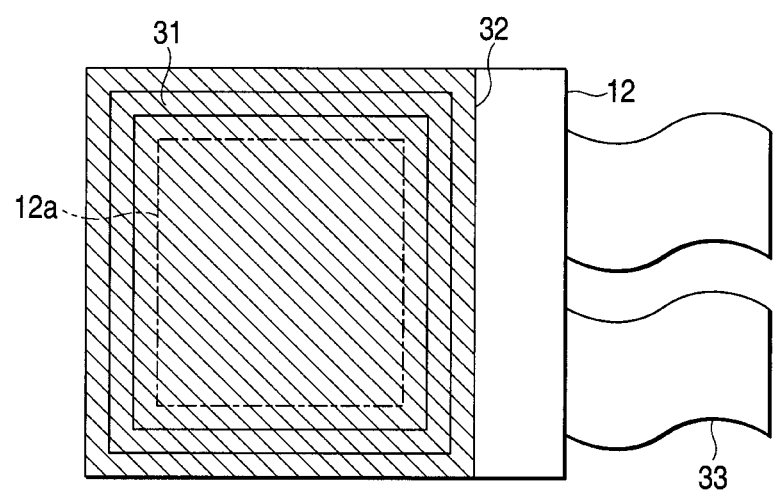
FIG. 7 is a configuration view showing a display apparatus of a module shape of a sealed configuration to which an embodiment according to the present invention is applied.

The display apparatus according to an embodiment of the present invention as described above also includes one of a module shape having a sealed configuration as illustrated in FIG. 7. For example, a display module formed by providing a sealing portion 31 so as to surround the display region 12a which is a pixel array portion and sticking to an opposing portion (seal substrate 32) such as a transparent glass while using this sealing portion 31 as an adhesive is corresponding thereto. In this transparent seal substrate 32, a color filter, a passivation film, a light-shielding film and the like may be provided. In the substrate 12 as the display module having the display region 12a formed therein, a flexible print substrate 33 for inputting or outputting signals or the like to the display region 12a (pixel array portion) from the outside may be provided.

In the foregoing display apparatus, the red light-emitting device 11R may be the organic electroluminescent device 11' as described above by referring to FIG. 2. In that case, the hole transport layer of each of the other green light-emitting device 11G and blue light-emitting device 11B may have the same stack structure as in the red light-emitting device 11R (11').

By using, as the red light-emitting device 11R, the organic electroluminescent device (11') of the configuration according to an embodiment of the present invention as described above by referring to FIG. 2, as described previously, this red light-emitting device 11R (11') is able to suppress the initial deterioration of brightness life in a low level while maintaining the luminous efficiency and color purity. For that reason, by combining the green light-emitting device 11G and the blue light-emitting device 11B together with this red light-emitting device 11R (11'), not only it is possible to undergo full-color display with high color expression properties, but it is possible to attain display in which seizing is prevented.

Also, by using the organic electroluminescent device (11') with high luminous efficiency, the display apparatus 10 is brought with effects that not only the brightness life can be improved, but a consumed electric power can be reduced.

Accordingly, the display device 10 can be suitably used as a flat panel display such as a wall-mounted television set and a plane luminant and is applicable to light sources of copiers, printers, etc., light sources of liquid crystal displays, meters, etc., display boards, marker lamps and the like.

Application Examples

The display apparatus according to an embodiment of the present invention as described above is applicable to display apparatus of electronic appliances in all of fields where a picture signal inputted in an electronic appliance or a picture signal generated in an electronic appliance as an image or a picture image, for example, various electronic appliances as illustrated in FIGS. 8 to 12, for example, a digital camera, a notebook type personal computer, a portable terminal unit such as a portable handset and a video camera. Examples of electronic appliances to which an embodiment according to the present invention is applied are hereunder described.

Figure 8:
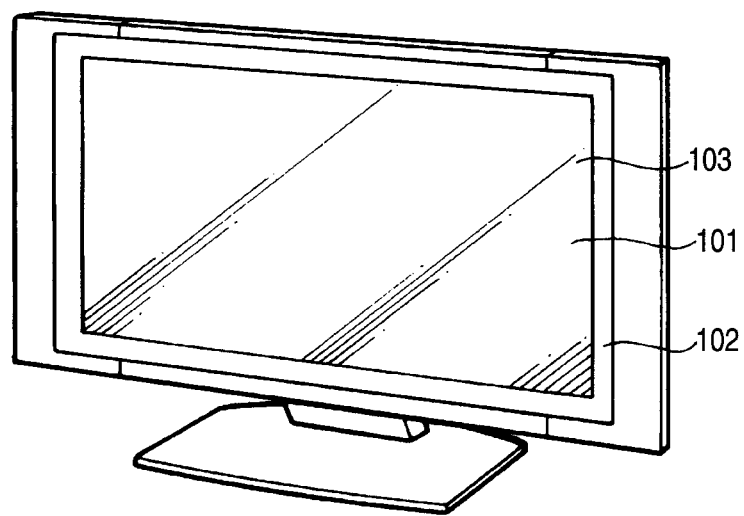
FIG. 8 is an oblique view showing a television receiver to which an embodiment according to the present invention is applied.

FIG. 8 is an oblique view showing a television receiver to which an embodiment according to the present invention is applied. The television receiver according to the present application example includes a picture image display screen portion 101 which is configured of a front panel 102, a filter glass 103 and the like and is prepared by using the display apparatus according to an embodiment of the present invention as the picture image display screen portion 101.

Figure 9A:
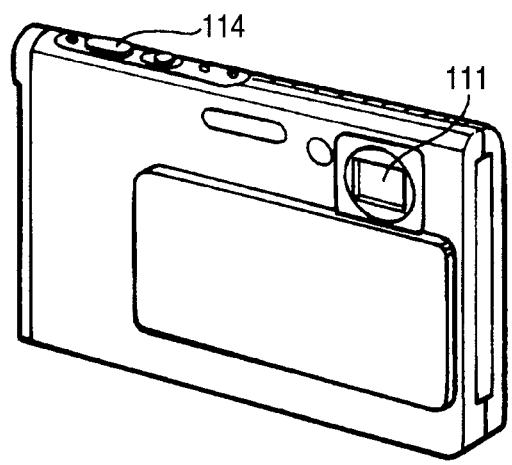
FIG. 9A is an oblique view seen from the front side.
Figure 9B:
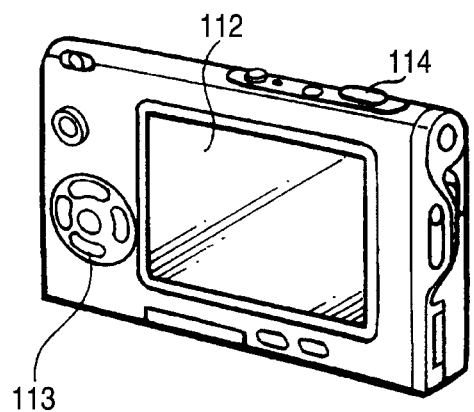
FIG. 9B is an oblique view seen from the rear side.

FIG. 9 is a view showing a digital camera to which an embodiment according to the present invention is applied, in which FIG. 9A is an oblique view seen from the front side; and FIG. 9B is an oblique view seen from the rear side. The digital camera according to the present application example includes a light emission portion 111 for flash, a display portion 112, a menu switch 113, a shutter button 114 and the like and is prepared by using the display apparatus according to an embodiment of the present invention as the display portion 112.

Figure 10:
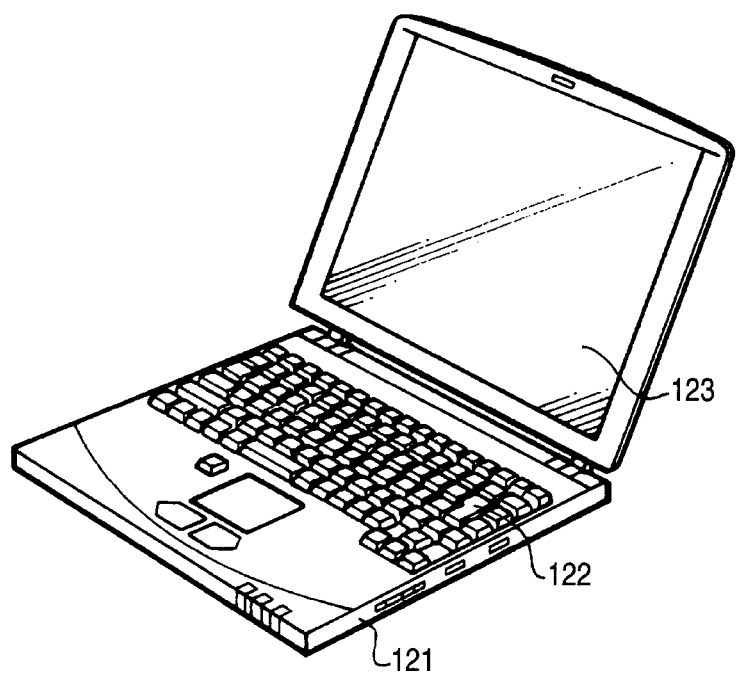
FIG. 10 is an oblique view showing a notebook type personal computer to which an embodiment according to the present invention is applied.

FIG. 10 is an oblique view showing a notebook type personal computer to which the present invention is applied. The notebook type personal computer according to the present application example includes a main body 121, a keyboard 122 to be operated when letters or the like are inputted, a display portion 123 for displaying an image and the like and is prepared by using the display apparatus according to the embodiment of the present invention as the display portion 123.

Figure 11:
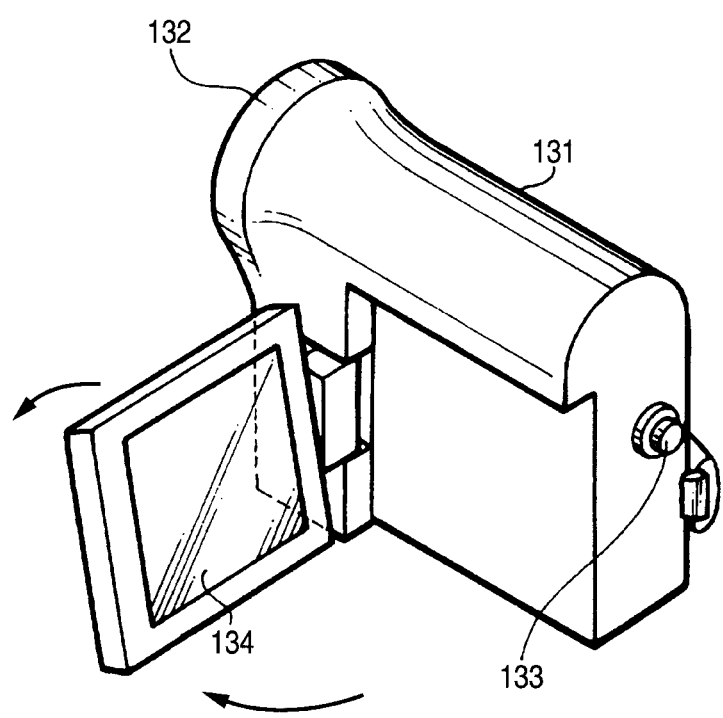
FIG. 11 is an oblique view showing a video camera to which an embodiment according to the present invention is applied.

FIG. 11 is an oblique view showing a video camera to which the present invention is applied. The video camera according to the present application example includes a main body portion 131, a lens 132 for shooting a scene of a subject as positioned at a forward side face, a start/stop switch 133 at the shooting, a display portion 134 and the like and is prepared by using the display apparatus according to an embodiment of the present invention as the display portion 134.

FIGS. 12A to 12G are views showing a portable terminal unit, for example, a portable handset, to which the present invention is applied, wherein FIG. 12A is a front view in an opened state; FIG. 12B is a side view thereof; FIG. 12C is a front view in a closed state; FIG. 12D is a left side view; FIG. 12E is a right side view; FIG. 12F is a top view; and FIG. 12G is a bottom view. The portable handset according to the present application example includes an upper casing 141, a lower casing 142, a connection portion (here, a hinge portion) 143, a display 144, a sub-display 145, a picture light 146, a camera 147 and the like and is prepared by using the display apparatus according to an embodiment of the present invention as the display portion 144 or the sub-display 145.

EXAMPLES

Concrete manufacturing procedures of organic electroluminescent devices of the Examples and Comparative Examples according to the present invention are hereunder described by referring to FIG. 1, and evaluation results thereof are then described.

Examples 1 to 4

Organic electroluminescent devices were prepared by using a perylene derivative as a red light-emitting guest material in a light-emitting layer (see Table 1).

First of all, a cell for organic electroluminescent device for top emission in which an ITO transparent electrode having a thickness of 12.5 nm was stacked on a 190 nm-thick Ag alloy (reflecting layer) as the anode 13 was prepared on the substrate 12 composed of a glass sheet (30 mm×30 mm).

Next, a film composed of m-MTDATA represented by the following structural formula (101) was formed in a thickness of 12 nm as the hole injection layer 14a of the organic layer 14 by a vacuum vapor deposition method (vapor deposition rate: 0.2 to 0.4 nm/sec). The term "m-MTDATA" as referred to herein means 4,4',4"-tris(phenyl-m-tolylamino)triphenylamine.

Structural Formula (101)

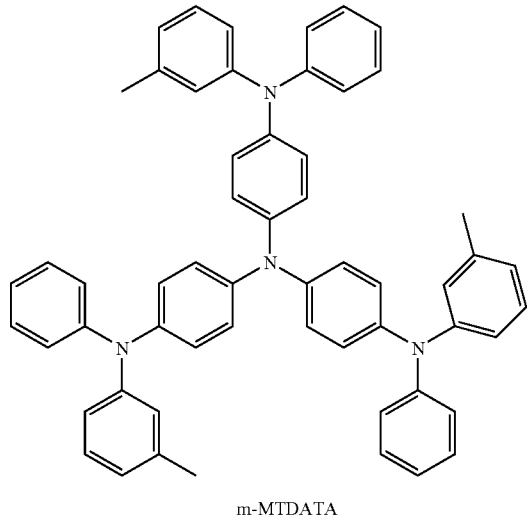

m-MTDATA

Next, a film composed of α-NPD represented by the following structural formula (102) was formed in a thickness of 12 nm as the hole transport layer 14b (vapor deposition rate: 0.2 to 0.4 nm/sec). The term "α-NPD" as referred to herein means N,N'-bis(1-naphthyl)-N,N'-diphenyl[1,1'-bi-phenyl]-4,4'-diamine.

Structural Formula (102)

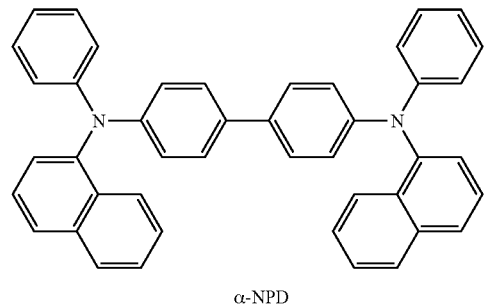

α-NPD

Next, the light-emitting layer 14c was fabricated by vapor deposition in a thickness of 30 nm on the hole transport layer 14b. On that occasion, rubrene of the following Compound (1)-1 was used as a host material, and a dibenzo[f,f']diindeno[1,2,3-cd:1',2',3'-1m]perylene derivative represented by the following Compound (5)-1 was doped thereon as a red light-emitting guest material in a relative thickness ratio of 1%.

Compound (1)-1

Compound (5)-1

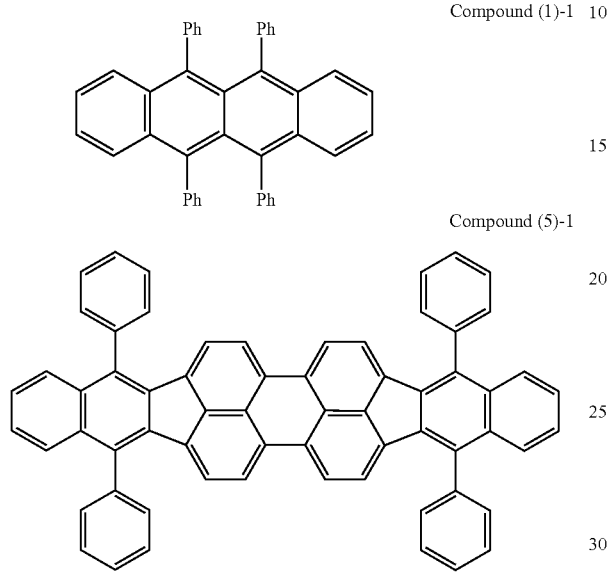

The photosensitizing layer 14d was fabricated by vapor deposition in a thickness of 25 nm on the thus formed light-emitting layer 14c. On that occasion, 9,10-di-(2-naphthyl)anthracene (ADN) represented by the following structural formula (103) was used as a host material, and a styrylamine derivative represented by the following structural formula (104) was doped thereon as a blue light-emitting guest material. The blue light-emitting guest material was doped in a doping amount (relative thickness ratio) of 2%, 5%, 10% and 15% in Examples 1 to 4, respectively.

Structural Formula (103)

ADN

Structural Formula (104)

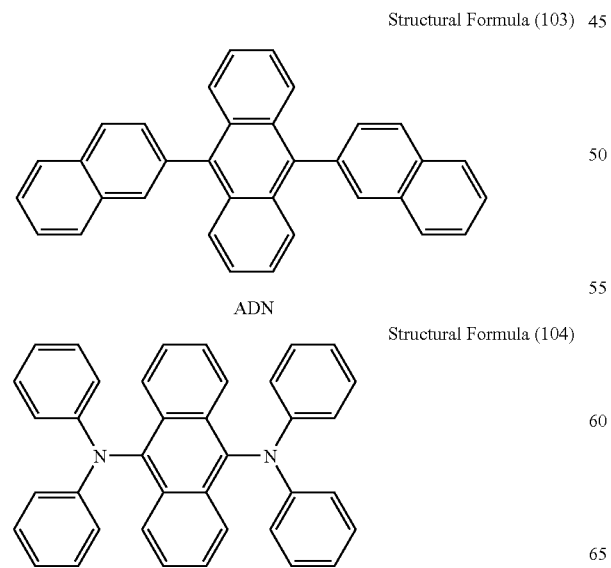

Next, Alq3 (8-hydroxyquinolinealuminum) represented by the following structural formula (105) was vapor deposited in a thickness of 10 nm as the electron transport layer 14e.

Structural Formula (105)

Alq3

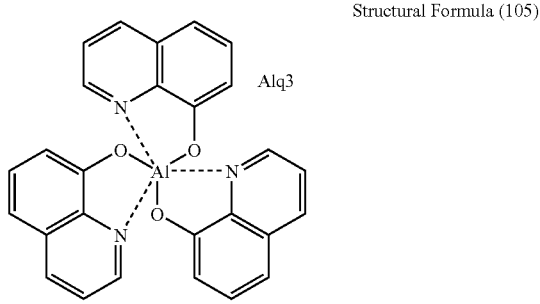

There was thus formed the organic layer 14 composed of a stack of the hole injection layer 14a, the hole transport layer 14b, the light-emitting layer 14c, the photosensitizing layer 14d and the electron transport layer 14e in this order. Thereafter, a film composed of LiF was formed in a thickness of about 0.3 nm as the first layer 15a of the cathode 15 by a vacuum vapor deposition method (vapor deposition rate: 0.01 nm/sec). Finally, a 10 nm-thick MaAg film was formed as the second layer 15b of the cathode 15 on the first layer 15a by a vacuum vapor deposition method.

There were thus prepared the organic electroluminescent devices of Examples 1 to 4.

Examples 5 to 9

In the formation of the photosensitizing layer 14d in the preparation procedures of the organic electroluminescent device as described in Examples 1 to 4, the photosensitizing layer 14d was formed by using each of materials represented by the following structural formulae (106) to (110) as the blue light-emitting guest material. The doping amount of the guest material was 5% in Example 5 and 1% in Examples 6 to 9, respectively in terms of a relative thickness ratio. Other procedures were the same as in Examples 1 to 4.

Structural Formula (106)

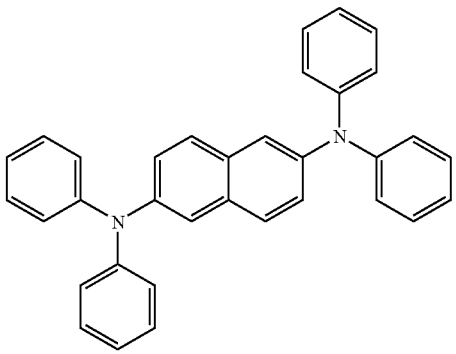

-continued

Structural Formula (107)

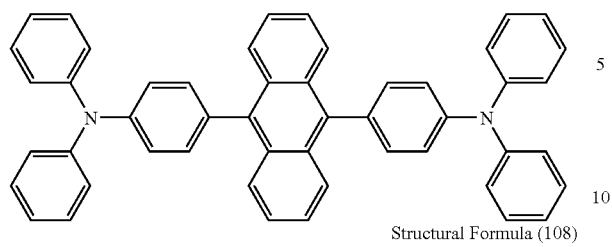

Structural Formula (108)

Structural Formula (110)

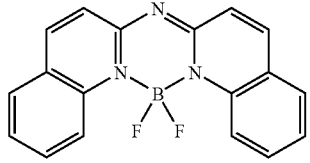

Structural Formula (109)

Comparative Example 1

The formation of the photosensitizing layer 14d in the preparation procedures of the organic electroluminescent device as described in Examples 1 to 4 was not carried out, and instead thereof, the thickness of the electron transport layer composed of Alq3 (8-hydroxyquinolinealuminum) was made thick to an extent of 45 nm. Other procedures were the same as in Examples 1 to 4.

Comparative Example 2

In the formation of the photosensitizing layer 14d in the preparation procedures of the organic electroluminescent device as described in Examples 1 to 4, the photosensitizing layer 14d was formed of only the host material without doping the blue light-emitting guest material. Other procedures were the same as in Examples 1 to 4.

<Evaluation Results>

Each of the organic electroluminescent devices as prepared in the foregoing Examples 1 to 9 and Comparative Examples 1 to 2 was measured with respect to drive voltage (V) at the drive at a current density of 10 mA/cm$^2$, current efficiency (cd/A) and color coordinate (x, y). The results obtained are shown in the following Table 1.

TABLE 1

| | Light-emitting layer 14c | | Photosensitizing layer 14d | | | Drive voltage | Current efficiency | Color coordinate |
|---|---|---|---|---|---|---|---|---|
| | Host | Guest | Host | Guest | Guest ratio | [V] | [cd/A] | (x, y) |
| Example 1 | Rubrene: | Compound | ADN: | Structural | 2.0% | 7.4 | 12.9 | (0.64, 0.34) |
| Example 2 | Compound | (5)-1 | Structural | formula (104) | 5.0% | 7.4 | 13.1 | (0.64, 0.34) |
| Example 3 | (1)-1 | | formula (103) | | 10.0% | 7.6 | 13.2 | (0.64, 0.34) |
| Example 4 | | | | | 15.0% | 7.8 | 11.5 | (0.64, 0.34) |
| Example 5 | | | | Structural formula (106) | 5.0% | 7.5 | 9.5 | (0.64, 0.34) |
| Example 6 | | | | Structural formula (107) | 5.0% | 7.7 | 12.1 | (0.64, 0.34) |
| Example 7 | | | | Structural formula (108) | 7.5% | 7.2 | 12.5 | (0.64, 0.34) |
| Example 8 | | | | Structural formula (109) | 5.0% | 7.7 | 12.7 | (0.64, 0.34) |
| Example 9 | | | | Structural formula (110) | 1.0% | 7.1 | 10.5 | (0.64, 0.34) |
| Comparative Example 1 | | | — | — | — | 7.5 | 6.5 | (0.64, 0.33) |
| Comparative Example 2 | | | ADN | — | — | 7.6 | 0.5 | (0.65, 0.37) |

As shown in the foregoing Table 1, all of the organic electroluminescent devices of Examples 1 to 9 to which the present invention is applied exhibited a high current efficiency at substantially the same drive voltage, the value of which is almost 2 times of that of the organic electroluminescent devices of Comparative Examples 1 to 2 to which the present invention is not applied. This demonstrates that the energy as recombined in the photosensitizing layer 14d which is configured of the host material (ADN) and the light-emitting guest material brings an effect of photosensitization (increase in luminous amount) in the light-emitting layer 14c.

Also, in the organic electroluminescent devices of Examples 1 to 9, nevertheless the photosensitizing layer 14d having a blue light-emitting guest doped in a host was stacked on the red light-emitting layer 14c, red emission of (0.64, 0.34) in the color coordinate of light-emitting light was observed, and influences due to color mixing to be derived from the blue emission were not observed. In particular, in all of the organic electroluminescent devices of Examples 4 to 9 in which the kind of the light-emitting guest material to be doped on the photosensitizing layer 14d was changed, the color coordinate of the light-emitting light was (0.64, 0.34). It was confirmed from this matter that in accordance with the configuration according to an embodiment of the invention, red emission generated in the red light-emitting layer 14c is extracted irrespective of the light-emitting guest material of the photosensitizing layer 14d.

Examples 10 to 13

Organic electroluminescent devices were prepared by using a diketopyrrolopyrrole derivative as a red light-emitting guest material in a light-emitting layer (see the following Table 2).

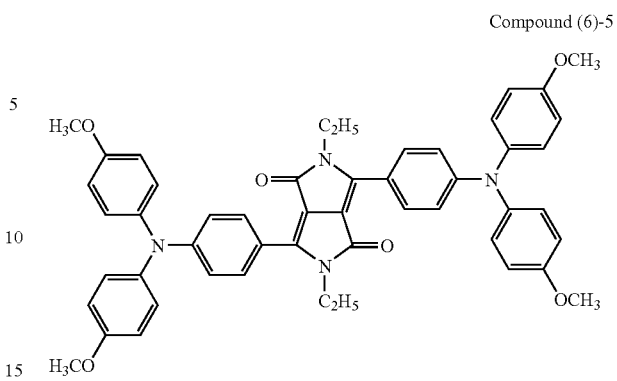

Compound (6)-5

Examples 14 to 18

In the formation of the photosensitizing layer 14d in the preparation procedures of the organic electroluminescent device as described in Examples 10 to 13, the photosensitizing layer 14d was formed by using each of materials represented by the foregoing structural formulae (106) to (110) as the blue light-emitting guest material. The doping amount of the guest material was 5% in Example 14 and 1% in Examples 15 to 18, respectively in terms of a relative thickness ratio. Other procedures were the same as in Examples 10 to 13.

Comparative Example 3

The formation of the photosensitizing layer 14d in the preparation procedures of the organic electroluminescent device as described in Examples 10 to 13 was not carried out,

TABLE 2

| | Light-emitting layer 14c | | Photosensitizing layer 14d | | | Drive voltage | Current efficiency | Color coordinate |
|---|---|---|---|---|---|---|---|---|
| | Host | Guest | Host | Guest | Guest ratio | [V] | [cd/A] | (x, y) |
| Example 10 | Rubrene: Compound (1)-1 | Compound (6)-5 | ADN: Structural formula (103) | Structural formula (104) | 2% | 7.7 | 7.6 | (0.60, 0.35) |
| Example 11 | | | | | 5% | 7.8 | 7.5 | (0.60, 0.35) |
| Example 12 | | | | | 10% | 7.8 | 7.4 | (0.60, 0.35) |
| Example 13 | | | | | 15% | 7.9 | 7.1 | (0.60, 0.35) |
| Example 14 | | | | Structural formula (106) | 5% | 7.5 | 7.3 | (0.60, 0.35) |
| Example 15 | | | | Structural formula (107) | 5% | 7.6 | 7.0 | (0.61, 0.33) |
| Example 16 | | | | Structural formula (108) | 5% | 7.2 | 6.8 | (0.61, 0.34) |
| Example 17 | | | | Structural formula (109) | 5% | 7.7 | 7.2 | (0.61, 0.33) |
| Example 18 | | | | Structural formula (110) | 1% | 7.5 | 6.9 | (0.63, 0.35) |
| Comparative Example 3 | | | — | — | — | 7.9 | 3.5 | (0.60, 0.33) |
| Comparative Example 4 | | | ADN | — | — | 7.9 | 0.3 | (0.61, 0.38) |

In the formation of the light-emitting layer 14c in the preparation procedures of the organic electroluminescent device as described in Examples 1 to 4, a diketopyrrolopyrrole derivative represented by the following Compound (6)-5 was doped as the red light-emitting guest material in a relative thickness ratio of 1%. Other procedures were the same as in Examples 1 to 4.

and instead thereof, the thickness of the electron transport layer composed of Alq3 (8-hydroxyquinolinealuminum) was made thick to an extent of 45 nm. Other procedures were the same as in Examples 10 to 13.

Comparative Example 4

In the formation of the photosensitizing layer 14d in the preparation procedures of the organic electroluminescent device as described in Examples 10 to 13, the photosensitizing layer 14d was formed of only the host material without doping the blue light-emitting guest material. Other procedures were the same as in Examples 10 to 13.

<Evaluation Results>

Each of the organic electroluminescent devices as prepared in the foregoing Examples 10 to 18 and Comparative Examples 3 to 4 was measured with respect to drive voltage (V) at the drive at a current density of 10 mA/cm$^2$, current efficiency (cd/A) and color coordinate (x, y). The results obtained are shown in the foregoing Table 2.

As shown in the foregoing Table 2, all of the organic electroluminescent devices of Examples 10 to 18 to which the present invention is applied exhibited a high current efficiency at substantially the same drive voltage, the value of which is almost 2 times of that of the organic electroluminescent devices of Comparative Examples 3 to 4 to which the present invention is not applied. This demonstrates that the energy as recombined in the photosensitizing layer 14d which is configured of the host material (ADN) and the light-emitting guest material brings an effect of photosensitization (increase in luminous amount) in the light-emitting layer 14c.

Also, in the organic electroluminescent devices of Examples 10 to 18, nevertheless the photosensitizing layer 14d having a blue light-emitting guest doped in a host was stacked on the red light-emitting layer 14c, red emission in the color coordinate of light-emitting light was observed, and influences due to color mixing to be derived from the blue emission were not observed. In particular, in all of the organic electroluminescent devices of Examples 14 to 18 in which the kind of the light-emitting guest material to be doped on the photosensitizing layer 14d was changed, red emission was confirmed, and it was confirmed that the red emission generated in the red light-emitting layer 14c is extracted irrespective of the light-emitting guest material of the photosensitizing layer 14d.

Examples 19 to 22

Organic electroluminescent devices were prepared by using a pyromethene complex as a red light-emitting guest material in a light-emitting layer (see the following Table 3).

device as described in Examples 1 to 4, a pyromethene complex represented by the following Compound (7)-21 was doped as the red light-emitting guest material in a relative thickness ratio of 1%. Other procedures were the same as in Examples 1 to 4.

Compound (7)-21

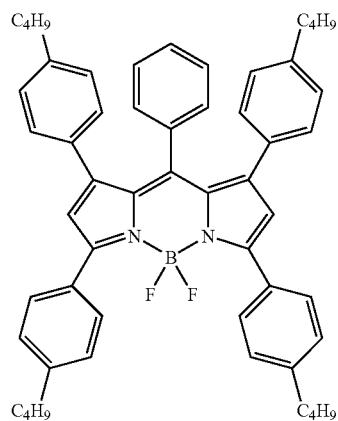

Examples 23 to 27

In the formation of the photosensitizing layer 14d in the preparation procedures of the organic electroluminescent device as described in Examples 19 to 22, the photosensitizing layer 14d was formed by using each of materials represented by the foregoing structural formulae (106) to (110) as the blue light-emitting guest material. The doping amount of the guest material was 5% in Example 23 and 1% in Examples 24 to 27, respectively in terms of a relative thickness ratio. Other procedures were the same as in Examples 19 to 22.

Comparative Example 5

The formation of the photosensitizing layer 14d in the preparation procedures of the organic electroluminescent

TABLE 3

|  | Light-emitting layer 14c | | Photosensitizing layer 14d | | | Drive voltage | Current efficiency | Color coordinate |
|---|---|---|---|---|---|---|---|---|
|  | Host | Guest | Host | Guest | Guest ratio | [V] | [cd/A] | (x, y) |
| Example 19 | Rubrene: | Compound | ADN: | Structural | 2% | 7.8 | 9.2 | (0.67, 0.33) |
| Example 20 | Compound | (7)-21 | Structural | formula (104) | 5% | 7.9 | 9.3 | (0.67, 0.33) |
| Example 21 | (1)-1 |  | formula (103) |  | 10% | 8.0 | 9.5 | (0.67, 0.33) |
| Example 22 |  |  |  |  | 15% | 8.0 | 9.1 | (0.67, 0.33) |
| Example 23 |  |  |  | Structural formula (106) | 5% | 7.5 | 9.0 | (0.64, 0.33) |
| Example 24 |  |  |  | Structural formula (107) | 5% | 7.6 | 8.6 | (0.64, 0.33) |
| Example 25 |  |  |  | Structural formula (108) | 5% | 7.5 | 8.9 | (0.64, 0.33) |
| Example 26 |  |  |  | Structural formula (109) | 5% | 7.7 | 9.0 | (0.64, 0.33) |
| Example 27 |  |  |  | Structural formula (110) | 1% | 7.5 | 8.7 | (0.64, 0.33) |
| Comparative Example 5 |  |  | — | — | — | 8.3 | 3.2 | (0.67, 0.34) |
| Comparative Example 6 |  |  | ADN | — | — | 8.1 | 0.6 | (0.67, 0.34) |

In the formation of the light-emitting layer 14c in the preparation procedures of the organic electroluminescent device as described in Examples 19 to 22 was not carried out, and instead thereof, the thickness of the electron transport layer composed of Alq3 (8-hydroxyquinolinealuminum) was made thick to an extent of 45 nm. Other procedures were the same as in Examples 19 to 22.

Comparative Example 6

In the formation of the photosensitizing layer 14d in the preparation procedures of the organic electroluminescent device as described in Examples 19 to 22, the photosensitizing layer 14d was formed of only the host material without doping the blue light-emitting guest material. Other procedures were the same as in Examples 19 to 22.

<Evaluation Results>

Each of the organic electroluminescent devices as prepared in the foregoing Examples 19 to 27 and Comparative Examples 5 to 6 was measured with respect to drive voltage (V) at the drive at a current density of 10 mA/cm$^2$, current efficiency (cd/A) and color coordinate (x, y). The results obtained are shown in the foregoing Table 3.

As shown in the foregoing Table 3, all of the organic electroluminescent devices of Examples 19 to 27 to which the present invention is applied exhibited a high current efficiency at substantially the same drive voltage, the value of which is 2.5 times or more of that of the organic electroluminescent devices of Comparative Examples 5 to 6 to which the present invention is not applied. This demonstrates that the energy as recombined in the photosensitizing layer 14d which is configured of the host material (ADN) and the light-emitting guest material brings an effect of photosensitization (increase in luminous amount) in the light-emitting layer 14c.

Also, in the organic electroluminescent devices of Examples 19 to 27, nevertheless the photosensitizing layer 14d having a blue light-emitting guest doped in a host was stacked on the red light-emitting layer 14c, red emission in the color coordinate of light-emitting light was confirmed, and influences due to color mixing to be derived from the blue emission were not observed. In particular, in all of the organic electroluminescent devices of Examples 23 to 27 in which the kind of the light-emitting guest material to be doped on the photosensitizing layer 14d was changed, red emission was confirmed, and it was confirmed that the red emission generated in the red light-emitting layer 14c is extracted irrespective of the light-emitting guest material of the photosensitizing layer 14d.

Examples 28 to 31

Organic electroluminescent devices were prepared by using a pyran derivative as a red light-emitting guest material in a light-emitting layer (see the following Table 4).

TABLE 4

|  | Light-emitting layer 14c | | Photosensitizing layer 14d | | | Drive voltage [V] | Current efficiency [cd/A] | Color coordinate (x, y) |
|---|---|---|---|---|---|---|---|---|
|  | Host | Guest | Host | Guest | Guest ratio |  |  |  |
| Example 28 | Rubrene: | Compound | ADN: | Structural | 2% | 7.8 | 5.2 | (0.63, 0.37) |
| Example 29 | Compound | (8)-2 | Structural | formula (104) | 5% | 7.9 | 5.4 | (0.63, 0.37) |
| Example 30 | (1)-1 |  | formula (103) |  | 10% | 7.9 | 5.5 | (0.62, 0.35) |
| Example 31 |  |  |  |  | 15% | 7.7 | 4.9 | (0.63, 0.38) |
| Example 32 |  |  |  | Structural formula (106) | 5% | 7.7 | 4.6 | (0.63, 0.37) |
| Example 33 |  |  |  | Structural formula (107) | 5% | 7.7 | 4.7 | (0.63, 0.36) |
| Example 34 |  |  |  | Structural formula (108) | 5% | 7.8 | 4.8 | (0.63, 0.37) |
| Example 35 |  |  |  | Structural formula (109) | 5% | 7.7 | 4.7 | (0.63, 0.37) |
| Example 36 |  |  |  | Structural formula (110) | 1% | 7.8 | 4.9 | (0.63, 0.37) |
| Comparative Example 7 |  |  | — | — | — | 5.1 | 1.5 | (0.57, 0.42) |
| Comparative Example 8 |  |  | ADN | — | — | 7.9 | 0.2 | (0.57, 0.43) |

In the formation of the light-emitting layer 14c in the preparation procedures of the organic electroluminescent device as described in Examples 1 to 4, a pyran derivative represented by the following Compound (8)-2 was doped as the red light-emitting guest material in a relative thickness ratio of 1%. Other procedures were the same as in Examples 1 to 4.

Compound (8)-2

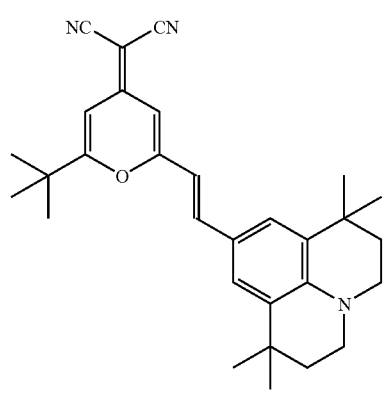

Examples 32 to 36

In the formation of the photosensitizing layer 14d in the preparation procedures of the organic electroluminescent device as described in Examples 28 to 31, the photosensitizing layer 14d was formed by using each of materials represented by the foregoing structural formulae (106) to (110) as the blue light-emitting guest material. The doping amount of the guest material was 5% in Example 32 and 1% in Examples 33 to 36, respectively in terms of a relative thickness ratio. Other procedures were the same as in Examples 28 to 31.

Comparative Example 7

The formation of the photosensitizing layer 14d in the preparation procedures of the organic electroluminescent device as described in Examples 28 to 31 was not carried out, and instead thereof, the thickness of the electron transport layer composed of Alq3 (8-hydroxyquinolinealuminum) was made thick to an extent of 45 nm. Other procedures were the same as in Examples 28 to 31.

Comparative Example 8

In the formation of the photosensitizing layer 14d in the preparation procedures of the organic electroluminescent device as described in Examples 28 to 31, the photosensitizing layer 14d was formed of only the host material without doping the blue light-emitting guest material. Other procedures were the same as in Examples 28 to 31.

<Evaluation Results>

Each of the organic electroluminescent devices as prepared in the foregoing Examples 28 to 36 and Comparative Examples 7 to 8 was measured with respect to drive voltage (V) at the drive at a current density of 10 mA/cm$^2$, current efficiency (cd/A) and color coordinate (x, y). The results obtained are shown in the foregoing Table 4.

As shown in the foregoing Table 4, all of the organic electroluminescent devices of Examples 28 to 36 to which the present invention is applied exhibited a high current efficiency at substantially the same drive voltage, the value of which is 3 times or more of that of the organic electroluminescent devices of Comparative Examples 7 to 8 to which the present invention is not applied. This demonstrates that the energy as recombined in the photosensitizing layer 14d which is configured of the host material (ADN) and the light-emitting guest material brings an effect of photosensitization (increase in luminous amount) in the light-emitting layer 14c.

Also, in the organic electroluminescent devices of Examples 28 to 36, nevertheless the photosensitizing layer 14d having a blue light-emitting guest doped in a host was stacked on the red light-emitting layer 14c, red emission in the color coordinate of light-emitting light was confirmed, and influences due to color mixing to be derived from the blue emission were not observed. In particular, in all of the organic electroluminescent devices of Examples 32 to 36 in which the kind of the light-emitting guest material to be doped on the photosensitizing layer 14d was changed, red emission was confirmed, and it was confirmed that the red emission generated in the red light-emitting layer 14c is extracted irrespective of the light-emitting guest material of the photosensitizing layer 14d.

Examples 37 to 40

Organic electroluminescent devices were prepared by using a styryl derivative as a red light-emitting guest material in a light-emitting layer (see the following Table 5).

TABLE 5

| | Light-emitting layer 14c | | Photosensitizing layer 14d | | | Drive voltage | Current efficiency | Color coordinate |
|---|---|---|---|---|---|---|---|---|
| | Host | Guest | Host | Guest | Guest ratio | [V] | [cd/A] | (x, y) |
| Example 37 | Rubrene: Compound (1)-1 | Compound (9)-21 | ADN: Structural formula (103) | Structural formula (104) | 2% | 7.7 | 7.5 | (0.65, 0.34) |
| Example 38 | | | | | 5% | 7.8 | 7.7 | (0.65, 0.34) |
| Example 39 | | | | | 10% | 7.8 | 7.8 | (0.65, 0.34) |
| Example 40 | | | | | 15% | 8.1 | 7.1 | (0.65, 0.34) |
| Example 41 | | | | Structural formula (106) | 5% | 7.4 | 7.1 | (0.64, 0.34) |
| Example 42 | | | | Structural formula (107) | 5% | 7.7 | 6.8 | (0.64, 0.34) |
| Example 43 | | | | Structural formula (108) | 5% | 7.5 | 6.9 | (0.65, 0.34) |
| Example 44 | | | | Structural formula (109) | 5% | 7.5 | 6.6 | (0.64, 0.34) |
| Example 45 | | | | Structural formula (110) | 1% | 7.7 | 6.9 | (0.64, 0.34) |
| Comparative Example 9 | | | — | — | — | 8.5 | 3.8 | (0.64, 0.34) |
| Comparative Example 10 | | | ADN | — | — | 8.1 | 0.9 | (0.65, 0.38) |

In the formation of the light-emitting layer 14c in the preparation procedures of the organic electroluminescent device as described in Examples 1 to 4, a styryl derivative represented by the following Compound (9)-21 was doped as the red light-emitting guest material in a relative thickness ratio of 1%. Other procedures were the same as in Examples 1 to 4.

Compound (9)-21

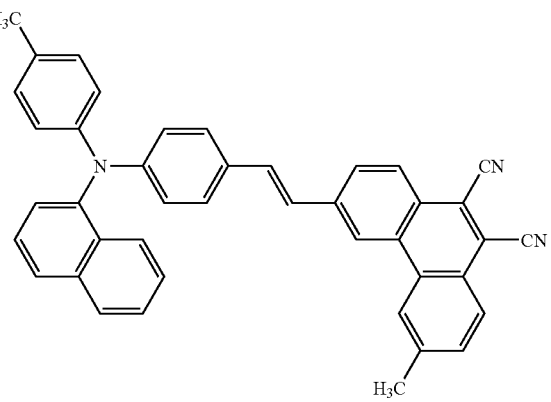

Examples 41 to 45

In the formation of the photosensitizing layer 14d in the preparation procedures of the organic electroluminescent device as described in Examples 37 to 40, the photosensitizing layer 14d was formed by using each of materials represented by the foregoing structural formulae (106) to (110) as the blue light-emitting guest material. The doping amount of the guest material was 5% in Example 41 and 1% in Examples 42 to 45, respectively in terms of a relative thickness ratio. Other procedures were the same as in Examples 37 to 40.

Comparative Example 9

The formation of the photosensitizing layer 14d in the preparation procedures of the organic electroluminescent device as described in Examples 37 to 40 was not carried out, and instead thereof, the thickness of the electron transport layer composed of Alq3 (8-hydroxyquinolinealuminum) was made thick to an extent of 45 nm. Other procedures were the same as in Examples 37 to 40.

Comparative Example 10

In the formation of the photosensitizing layer 14d in the preparation procedures of the organic electroluminescent device as described in Examples 37 to 40, the photosensitizing layer 14d was formed of only the host material without doping the blue light-emitting guest material. Other procedures were the same as in Examples 37 to 40.

<Evaluation Results>

Each of the organic electroluminescent devices as prepared in the foregoing Examples 37 to 45 and Comparative Examples 9 to 10 was measured with respect to drive voltage (V) at the drive at a current density of 10 mA/cm$^2$, current efficiency (cd/A) and color coordinate (x, y). The results obtained are shown in the foregoing Table 5.

As shown in the foregoing Table 5, all of the organic electroluminescent devices of Examples 37 to 45 to which the present invention is applied exhibited a high current efficiency at substantially the same drive voltage, the value of which is almost 2 times or more of that of the organic electroluminescent devices of Comparative Examples 9 to 10 to which the present invention is not applied. This demonstrates that the energy as recombined in the photosensitizing layer 14d which is configured of the host material (ADN) and the light-emitting guest material brings an effect of photosensitization (increase in luminous amount) in the light-emitting layer 14c.

Also, in the organic electroluminescent devices of Examples 37 to 45, nevertheless the photosensitizing layer 14d having a blue light-emitting guest doped in a host was stacked on the red light-emitting layer 14c, red emission in the color coordinate of light-emitting light was confirmed, and influences due to color mixing to be derived from the blue emission were not observed. In particular, in all of the organic electroluminescent devices of Examples 41 to 45 in which the kind of the light-emitting guest material to be doped on the photosensitizing layer 14d was changed, red emission was confirmed, and it was confirmed that the red emission generated in the red light-emitting layer 14c is extracted irrespective of the light-emitting guest material of the photosensitizing layer 14d.

From the foregoing evaluation results of each of the Examples and Comparative Examples, it was confirmed that in the configuration according to an embodiment of the present invention, in which materials selected among known organic materials are used as a host material and a dopant material configuring the red light-emitting layer 14c and the photosensitizing layer 14d containing a blue light-emitting guest of every kind is provided adjacent to this light-emitting layer 14c, it is possible to attain a great enhancement of the luminous efficiency (current efficiency) while maintaining the color purity of red color.

Also, this matter demonstrates that it is possible to realize full-color display with high color reproducibility by configuring a pixel by using a pair of a green light-emitting device and a blue light-emitting device together with this organic electroluminescent device.

Examples 46 to 57

The organic electroluminescent device as described above by referring to FIG. 2 was prepared. Here, in the preparation procedures of an organic electroluminescent device as described in Examples 1 to 4, the hole transport layer 14b having the following stack structure was formed, and other procedures were the same as in Examples 1 to 4. In the photosensitizing layer 14d, the doping amount of a guest material of the structural formula (104) was set up at 5% in terms of a relative thickness ratio similar to Example 2.

That is, in the formation of the hole transport layer 14b, first of all, a film composed of α-NPD represented by the foregoing structural formula (102) was formed as the first hole transport layer 14b-1 in a thickness of 6 nm (vapor deposition rate: 0.2 to 0.4 nm/sec).

Next, films composed of 12 kinds of the following compounds selected among the Compounds (2)-1 to (2)-48 were respectively formed as the second hole transport layer 14b-2 in a thickness of 6 nm in Examples 46 to 57 (vapor deposition rate: 0.2 to 0.4 nm/sec).

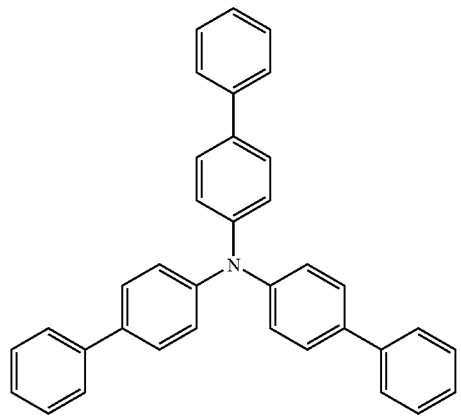

Compound (2)-9

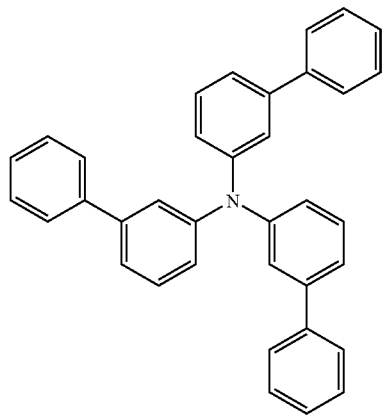

Compound (2)-10

Compound (2)-11
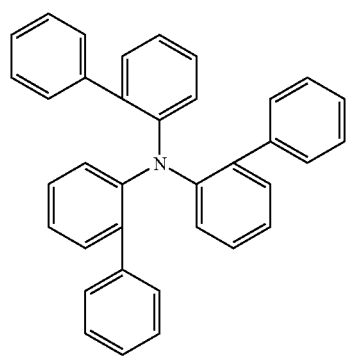
Compound (2)-15
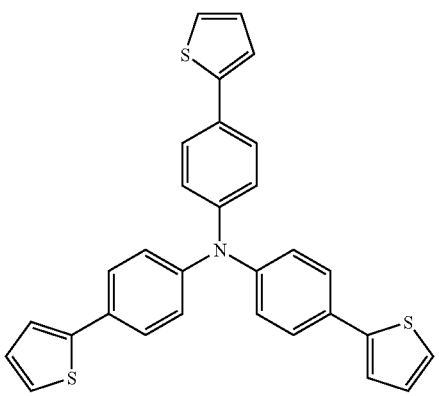
Compound (2)-4
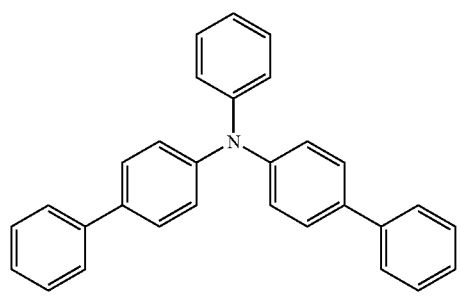
Compound (2)-5
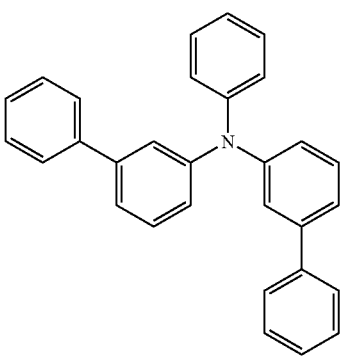
Compound (2)-22
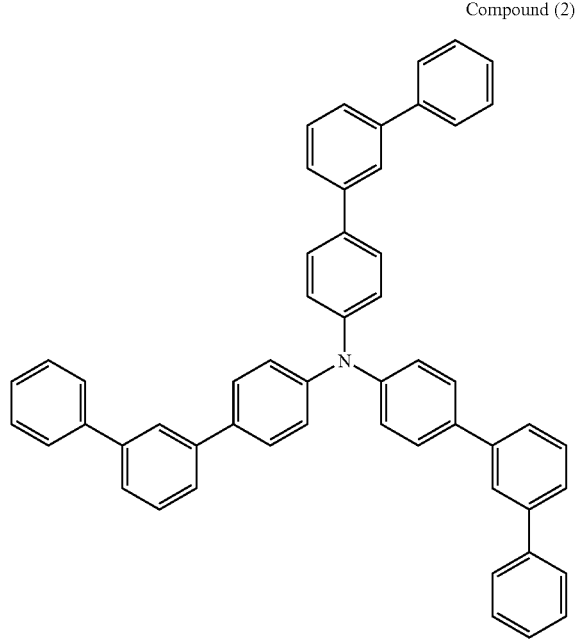
Compound (2)-24
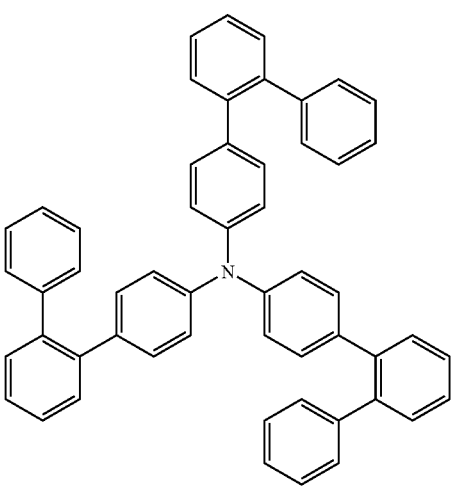

Compound (2)-27
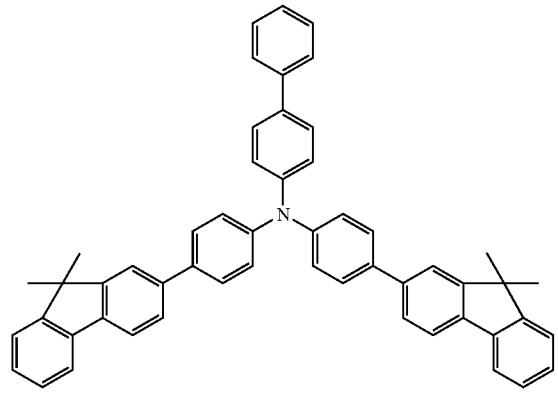
Compound (2)-28
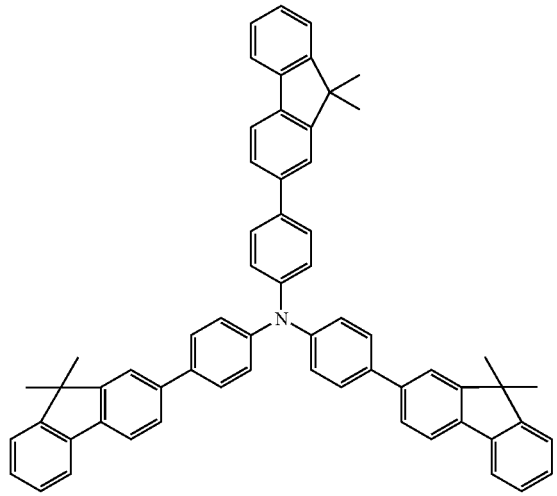
Compound (2)-32
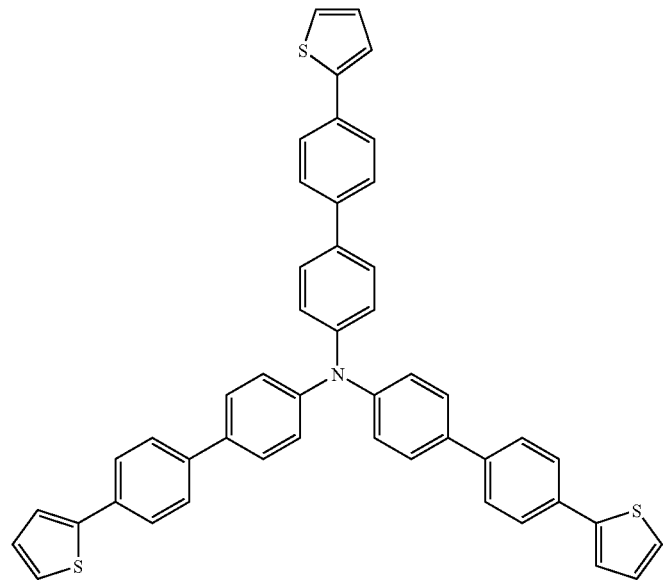

-continued

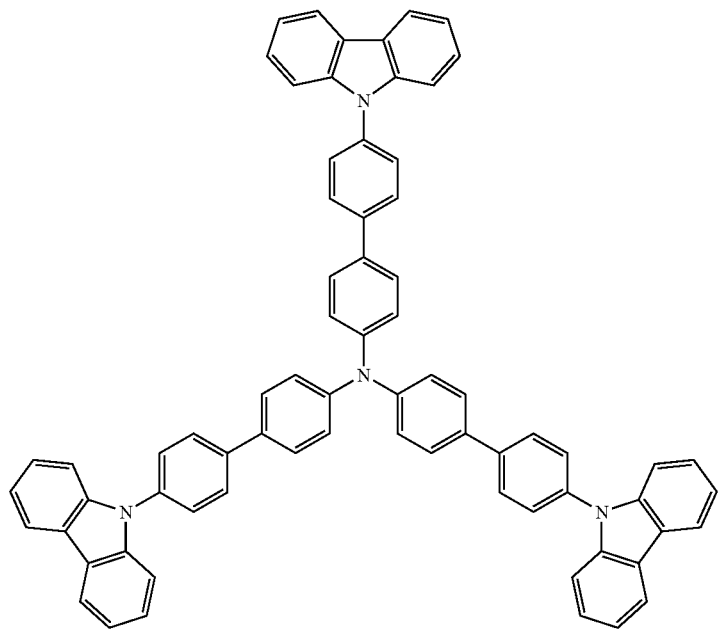

Compound (2)-48

<Evaluation Results>

Each of the organic electroluminescent devices as prepared in the foregoing Examples 46 to 57 was measured with respect to drive voltage (V) at the drive at a current density of 10 mA/cm², current efficiency (cd/A) and color coordinate (x, y). Also, as an index of seizing, a reduction ratio of brightness after a lapse of 100 hours of driving at a current density of 30 mA/cm² and a duty of 75% was measured. These results are shown in the following Table 6. In Table 6, the measurement results of Example 2 having the same configuration as in Examples 46 to 57, except that the hole transport layer 14b is of a single-layer structure in place of the stack structure are also shown.

As shown in Table 6, in all of the organic electroluminescent devices of Examples 46 to 57 in which the hole transport layer 14b is configured as a specified stack structure using the material of the general formula (2), the reduction ratio of brightness after a lapse of 100 hours of driving at a duty of

TABLE 6

|  | Second hole transport layer 14b-2 | Light-emitting layer 14c | | Photosensitizing layer 14d | | Drive voltage (V) | Current efficiency (cd/A) | Color coordinate (x, y) | Reduction ratio of brightness after a lapse of 100 hours |
| --- | --- | --- | --- | --- | --- | --- | --- | --- | --- |
|  |  | Host | Guest | Host | Guest |  |  |  |  |
| Example 46 | Compound (2)-9 | Rubrene: Compound (1)-1 | Compound (5)-1 | ADN: Structural formula (103) | Blue: Structural formula (104) 5.0% | 7.5 | 14.5 | (0.64, 0.34) | 2.1% |
| Example 47 | Compound (2)-10 |  |  |  |  | 7.5 | 14.4 | (0.64, 0.34) | 2.3% |
| Example 48 | Compound (2)-11 |  |  |  |  | 7.2 | 14.1 | (0.64, 0.34) | 2.3% |
| Example 49 | Compound (2)-15 |  |  |  |  | 7.3 | 13.5 | (0.64, 0.34) | 2.6% |
| Example 50 | Compound (2)-4 |  |  |  |  | 7.4 | 13.8 | (0.64, 0.34) | 3.1% |
| Example 51 | Compound (2)-5 |  |  |  |  | 7.4 | 13.8 | (0.64, 0.34) | 3.1% |
| Example 52 | Compound (2)-22 |  |  |  |  | 7.9 | 14.1 | (0.64, 0.34) | 1.9% |
| Example 53 | Compound (2)-24 |  |  |  |  | 7.8 | 14.3 | (0.64, 0.34) | 2.3% |
| Example 54 | Compound (2)-27 |  |  |  |  | 7.4 | 13.8 | (0.64, 0.34) | 2.2% |
| Example 55 | Compound (2)-28 |  |  |  |  | 7.5 | 13.5 | (0.64, 0.34) | 2.4% |
| Example 56 | Compound (2)-32 |  |  |  |  | 7.7 | 13.6 | (0.64, 0.34) | 2.7% |
| Example 57 | Compound (2)-48 |  |  |  |  | 7.5 | 13.7 | (0.64, 0.34) | 2.6% |
| Example 2 | Nil |  |  |  |  | 7.4 | 13.1 | (0.64, 0.34) | 6.5% |

75% is low, while maintaining the current efficiency at substantially the same drive voltage as compared with the organic electroluminescent device of Example 2 in which the hole transport layer 14b is configured in a single-layer structure. This matter demonstrates that the charge balance according to the recombination of a hole and an electron in the light-emitting layer 14c is put in order, thereby bringing an effect for preventing a temporal reduction of the brightness.

Also, in the organic electroluminescent devices of Examples 46 to 57, nevertheless the photosensitizing layer 14d having a blue light-emitting guest doped in a host was stacked on the red light-emitting layer 14c, red emission of (0.64, 0.34) in the color coordinate of light-emitting light was observed, and influences due to color mixing to be derived from the blue emission were not observed. It was confirmed from this matter that in accordance with the configuration according to an embodiment of the invention, red emission generated in the red light-emitting layer 14c is extracted irrespective of the light-emitting guest material of the photosensitizing layer 14d.

In the light of the above, by configuring the hole transport layer 14b as a specified stack structure using the material of the general formula (2) upon application of an embodiment according to the present invention, it was confirmed that the initial deterioration of brightness life can be greatly improved while maintaining the luminous efficiency and color purity.

Examples 58 to 62

The organic electroluminescent device as described above by referring to FIG. 2 was prepared. Here, in the preparation procedures of an organic electroluminescent device as described in Examples 1 to 4, the hole transport layer 14b having the following stack structure was formed, and other procedures were the same as in Examples 1 to 4. In the photosensitizing layer 14d, the doping amount of a guest material of the structural formula (104) was set up at 5% in terms of a relative thickness ratio similar to Example 2.

That is, in the formation of the hole transport layer 14b, first of all, a film composed of α-NPD represented by the foregoing structural formula (102) was formed as the first hole transport layer 14b-1 in a thickness of 6 nm (vapor deposition rate: 0.2 to 0.4 nm/sec).

Next, films composed of 5 kinds of the following compounds selected among the Compounds (3)-1 to (3)-20 were respectively formed as the second hole transport layer 14b-2 in a thickness of 6 nm in Examples 58 to 62 (vapor deposition rate: 0.2 to 0.4 nm/sec).

Compound (3)-4

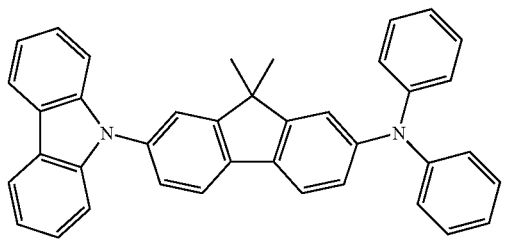

Compound (3)-6

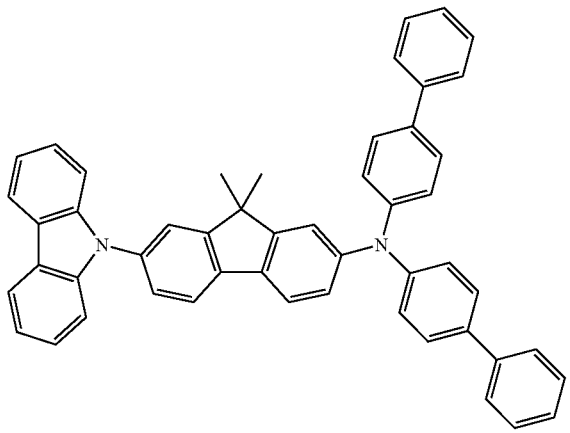

Compound (3)-19

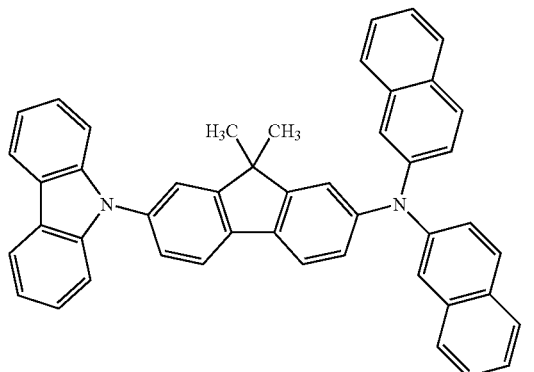

Compound (3)-20

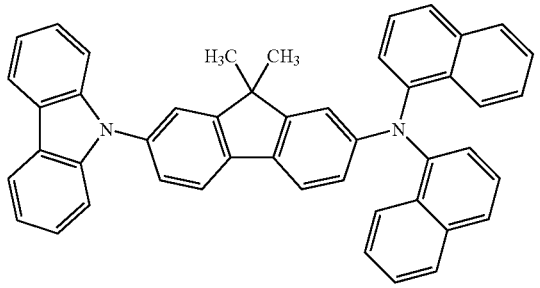

Compound (3)-9

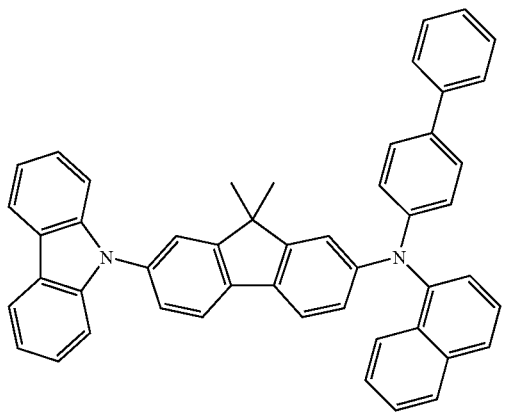

<Evaluation Results>

Each of the organic electroluminescent devices as prepared in the foregoing Examples 58 to 62 was measured with respect to drive voltage (V) at the drive at a current density of 10 mA/cm² current efficiency (cd/A) and color coordinate (x, y). Also, as an index of seizing, a reduction ratio of brightness after a lapse of 100 hours of driving at a current density of 30 mA/cm² and a duty of 75% was measured. These results are shown in the following Table 7. In Table 7, the measurement results of Example 2 having the same configuration as in Examples 46 to 57, except that the hole transport layer 14b is of a single-layer structure in place of the stack structure are also shown.

TABLE 7

| | Second hole transport layer 14b-2 | Light-emitting layer 14c | | Photosensitizing layer 14d | | Drive voltage (V) | Current efficiency (cd/A) | Color coordinate (x, y) | Reduction ratio of brightness after a lapse of 100 hours |
|---|---|---|---|---|---|---|---|---|---|
| | | Host | Guest | Host | Guest | | | | |
| Example 58 | Compound (3)-4 | Rubrene: Compound (1)-1 | Compound (5)-1 | ADN: Structural formula (103) | Blue: Structural formula (104) 5.0% | 7.3 | 13.5 | (0.64, 0.34) | 2.3% |
| Example 59 | Compound (3)-6 | | | | | 7.4 | 14.2 | (0.64, 0.34) | 2.3% |
| Example 60 | Compound (3)-19 | | | | | 7.4 | 14.1 | (0.64, 0.34) | 2.5% |
| Example 61 | Compound (3)-20 | | | | | 7.3 | 13.9 | (0.64, 0.34) | 2.5% |
| Example 62 | Compound (3)-9 | | | | | 7.4 | 13.8 | (0.64, 0.34) | 3.1% |
| Example 2 | Nil | | | | | 7.4 | 13.1 | (0.64, 0.34) | 6.5% |

As shown in Table 7, in all of the organic electroluminescent devices of Examples 58 to 62 in which the hole transport layer 14b is configured as a specified stack structure using the material of the general formula (3), the reduction ratio of brightness after a lapse of 100 hours of driving at a duty of 75% is low, while maintaining the current efficiency at substantially the same drive voltage as compared with the organic electroluminescent device of Example 2 in which the hole transport layer 14b is configured in a single-layer structure. This matter demonstrates that the charge balance according to the recombination of a hole and an electron in the light-emitting layer 14c is put in order, thereby bringing an effect for preventing a temporal reduction of the brightness.

Also, in the organic electroluminescent devices of Examples 58 to 62, nevertheless the photosensitizing layer 14d having a blue light-emitting guest doped in a host was stacked on the red light-emitting layer 14c, red emission of (0.64, 0.34) in the color coordinate of light-emitting light was observed, and influences due to color mixing to be derived from the blue emission were not observed. It was confirmed from this matter that in accordance with the configuration according to an embodiment of the invention, red emission generated in the red light-emitting layer 14c is extracted irrespective of the light-emitting guest material of the photosensitizing layer 14d.

In the light of the above, by configuring the hole transport layer 14b as a specified stack structure using the material of the general formula (3) upon application of the present invention, it was confirmed that the initial deterioration of brightness life can be greatly improved while maintaining the luminous efficiency and color purity.

Examples 63 to 69

The organic electroluminescent device as described above by referring to FIG. 2 was prepared. Here, in the preparation procedures of an organic electroluminescent device as described in Examples 1 to 4, the hole transport layer 14b having the following stack structure was formed, and other procedures were the same as in Examples 1 to 4. In the photosensitizing layer 14d, the doping amount of a guest material of the structural formula (104) was set up at 5% in terms of a relative thickness ratio similar to Example 2.

That is, in the formation of the hole transport layer 14b, first of all, a film composed of α-NPD represented by the foregoing structural formula (102) was formed as the first hole transport layer 14b-1 in a thickness of 6 nm (vapor deposition rate: 0.2 to 0.4 nm/sec).

Next, films composed of 7 kinds of the following compounds selected among the Compounds (4)-1 to (4)-26 were respectively formed as the second hole transport layer 14b-2 in a thickness of 6 nm in Examples 63 to 69 (vapor deposition rate: 0.2 to 0.4 nm/sec).

Compound (4)-10

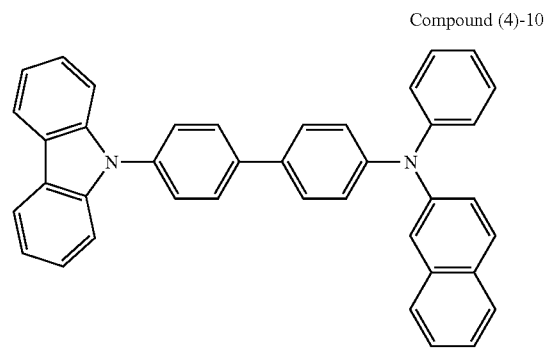

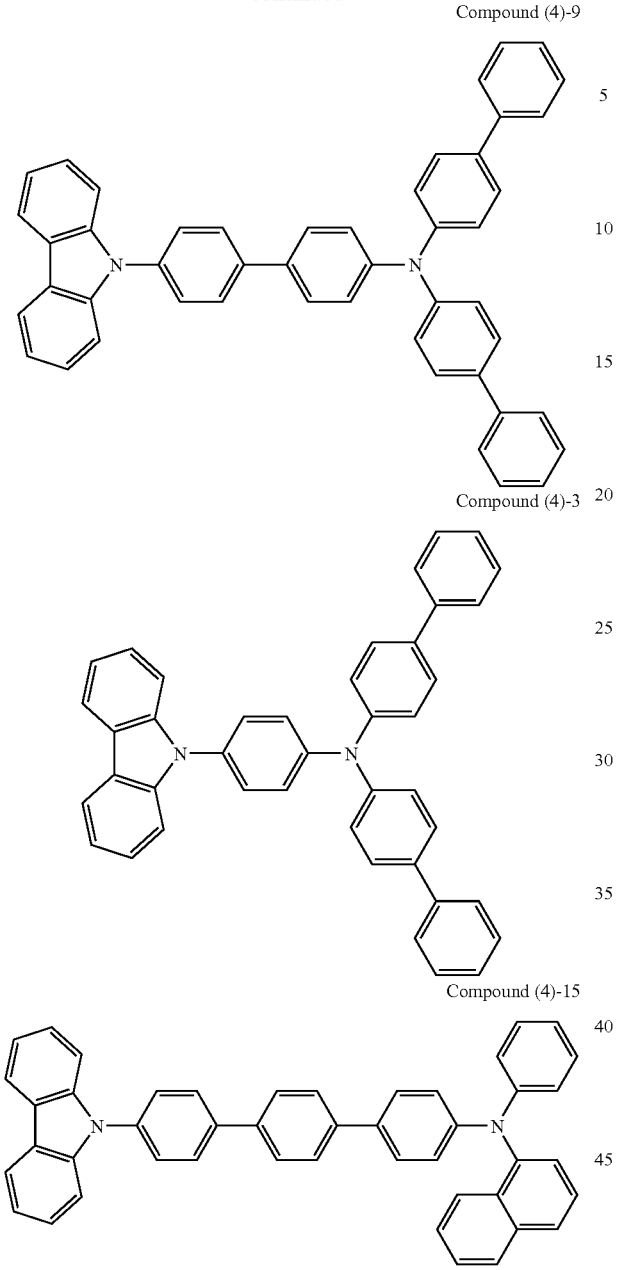

Compound (4)-9

Compound (4)-3

Compound (4)-15

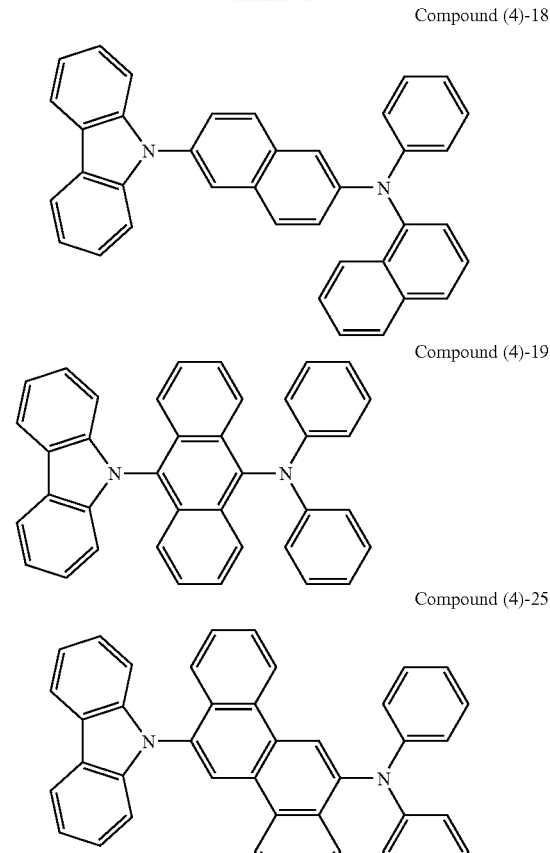

Compound (4)-18

Compound (4)-19

Compound (4)-25

<Evaluation Results>

Each of the organic electroluminescent devices as prepared in the foregoing Examples 63 to 69 was measured with respect to drive voltage (V) at the drive at a current density of 10 mA/cm$^2$ current efficiency (cd/A) and color coordinate (x, y). Also, as an index of seizing, a reduction ratio of brightness after a lapse of 100 hours of driving at a current density of 30 mA/cm$^2$ and a duty of 75% was measured. These results are shown in the following Table 8. In Table 8, the measurement results of Example 2 having the same configuration as in Examples 46 to 57, except that the hole transport layer 14b is of a single-layer structure in place of the stack structure are also shown.

TABLE 8

|  | Second hole transport layer 14b-2 | Light-emitting layer 14c | | Photosensitizing layer 14d | | Drive voltage (V) | Current efficiency (cd/A) | Color coordinate (x, y) | Reduction ratio of brightness after a lapse of 100 hours |
| --- | --- | --- | --- | --- | --- | --- | --- | --- | --- |
|  |  | Host | Guest | Host | Guest |  |  |  |  |
| Example 63 | Compound (4)-10 | Rubrene: Compound (1)-1 | Compound (5)-1 | ADN: Structural formula (103) | Blue: Structural formula (104) 5.0% | 7.6 | 13.7 | (0.64, 0.34) | 2.0% |
| Example 64 | Compound (4)-9 |  |  |  |  | 7.2 | 13.8 | (0.64, 0.34) | 2.1% |
| Example 65 | Compound (4)-3 |  |  |  |  | 7.8 | 13.6 | (0.64, 0.34) | 3.4% |
| Example 66 | Compound (4)-15 |  |  |  |  | 7.5 | 13.9 | (0.64, 0.34) | 2.6% |

TABLE 8-continued

| | Second hole transport layer 14b-2 | Light-emitting layer 14c | | Photosensitizing layer 14d | | Drive voltage (V) | Current efficiency (cd/A) | Color coordinate (x, y) | Reduction ratio of brightness after a lapse of 100 hours |
|---|---|---|---|---|---|---|---|---|---|
| | | Host | Guest | Host | Guest | | | | |
| Example 67 | Compound (4)-18 | | | | | 7.8 | 13.8 | (0.64, 0.34) | 3.1% |
| Example 68 | Compound (4)-19 | | | | | 7.4 | 13.5 | (0.64, 0.34) | 2.9% |
| Example 69 | Compound (4)-25 | | | | | 7.7 | 13.8 | (0.64, 0.34) | 3.8% |
| Example 2 | Nil | | | | | 7.4 | 13.1 | (0.64, 0.34) | 6.5% |

As shown in Table 8, in all of the organic electroluminescent devices of Examples 63 to 69 in which the hole transport layer 14b is configured as a specified stack structure using the material of the general formula (4), the reduction ratio of brightness after a lapse of 100 hours of driving at a duty of 75% is low, while maintaining the current efficiency at substantially the same drive voltage as compared with the organic electroluminescent device of Example 2 in which the hole transport layer 14b is configured in a single-layer structure. This matter demonstrates that the charge balance according to the recombination of a hole and an electron in the light-emitting layer 14c is put in order, thereby bringing an effect for preventing a temporal reduction of the brightness.

Also, in the organic electroluminescent devices of Examples 63 to 69, nevertheless the photosensitizing layer 14d having a blue light-emitting guest doped in a host was stacked on the red light-emitting layer 14c, red emission of (0.64, 0.34) in the color coordinate of light-emitting light was observed, and influences due to color mixing to be derived from the blue emission were not observed. It was confirmed from this matter that in accordance with the configuration according to the embodiment of the invention, red emission generated in the red light-emitting layer 14c is extracted irrespective of the light-emitting guest material of the photosensitizing layer 14d.

In the light of the above, by configuring the hole transport layer 14b as a specified stack structure using the material of the general formula (4) upon application of the present invention, it was confirmed that the initial deterioration of brightness life can be greatly improved while maintaining the luminous efficiency and color purity.

Example 70

A display apparatus using the same organic electroluminescent device as in Example 1 was prepared in the following manner (see FIG. 6).

First of all, the anode 13 was pattern formed on the display region of the substrate 12, and the insulating film 30 provided with an aperture portion for exposing the center of each anode 13 was formed. Next, by using a large-aperture mask provided with an aperture portion corresponding to the entire surface of the display region, the hole injection layer 14a and the hole transport layer 14b were formed in the same procedures as in Example 1.

Next, by using a stripe-like mask provided with an aperture portion corresponding to a forming area of the red light-emitting device (red area), the light-emitting layer 14c (14c-R) was fabricated only in the red area in the same manner as in Example 1. Also, by using a stripe-like mask provided with an aperture portion corresponding to a forming area of the green light-emitting device (green area), the light-emitting layer 14c-G of the green area was fabricated.

Thereafter, by again using a large-aperture mask provided with an aperture portion corresponding to the entire surface of the display region, the blue light-emitting layer 14c-B which also serves as the photosensitizing layer 14d, the electron transport layer 14e and the cathode 15 were fabricated in this order in the same manner as in Example 1.

There was thus obtained a display device in which the organic electroluminescent device to which the configuration according to the embodiment of the present invention was applied was formed as the red light-emitting device in the red area, the green light-emitting device was formed in the green area, and the blue light-emitting device was formed in the blue area, respectively.

Examples 71 to 73

Respective display apparatus using, as a red light-emitting device, the same organic electroluminescent devices as in Examples 46, 58 and 63 using each of the materials of the general formulae (2) to (4) in the second hole transport layer were prepared in the following manner (see FIG. 6).

First of all, the anode 13 was pattern formed on the display region of the substrate 12, and the insulating film 30 provided with an aperture portion for exposing the center of each anode 13 was formed. Next, after forming the hole injection layer 14a by using a large-aperture mask provided with an aperture portion corresponding to the entire surface of the display region, the same hole transport layer 14b as in Example 46 was formed in Example 71; the same hole transport layer 14b as in Example 58 was formed in Example 72; and the same hole transport layer 14b as in Example 63 was formed in Example 73, respectively.

Next, by using a stripe-like mask provided with an aperture portion corresponding to a forming area of the red light-emitting device (red area), the light-emitting layer 14c (14c-R) was fabricated only in the red area in the same manner as in Example 1. Also, by using a stripe-like mask provided with an aperture portion corresponding to a forming area of the green light-emitting device (green area), the light-emitting layer 14c-G of the green area was fabricated.

Thereafter, by again using a large-aperture mask provided with an aperture portion corresponding to the entire surface of the display region, the blue light-emitting layer 14c-B which also serves as the photosensitizing layer 14d, the electron transport layer 14e and the cathode 15 were fabricated in this order in the same manner as in Example 1.

In Example 71, there was thus obtained a display device in which the organic electroluminescent device of Example 46 was formed as the red light-emitting device in the red area, the green light-emitting device was formed in the green area, and the blue light-emitting device was formed in the blue area, respectively.

Also, in Example 72, there was thus obtained a display device in which the organic electroluminescent device of Example 58 to which the configuration according to the embodiment of the present invention was applied was formed as the red light-emitting device in the red area, the green light-emitting device was formed in the green area, and the blue light-emitting device was formed in the blue area, respectively.

Furthermore, in Example 73, there was thus obtained a display device in which the organic electroluminescent device of Example 63 to which the configuration according to the embodiment of the present invention was applied was formed as the red light-emitting device in the red area, the green light-emitting device was formed in the green area, and the blue light-emitting device was formed in the blue area, respectively.

A specified still image was displayed by using each of these display apparatus, and red seizing was evaluated. As a result, the seizing was not confirmed in all of the display apparatus of Examples 71 to 73.

It should be understood by those skilled in the art that various modifications, combinations, sub-combinations and alternations may occur depending on design requirements and other factors insofar as they are within the scope of the appended claims or the equivalents thereof.

What is claimed is:

1. An organic electroluminescent device for emitting red light comprising:
    an anode;
    a cathode; and
    an organic layer comprising (i) a light emitting layer comprising a red fluorescent light-emitting guest material and a first host material, the first host material comprising a polycyclic aromatic hydrocarbon compound having a skeleton with a 4 to 7 membered ring, and (ii) a photosensitizing layer comprising a blue light-emitting guest material and a second host material,
    wherein,
        the light-emitting layer is provided between the anode and the cathode,
        the photosensitizing layer is provided adjacent to and in contact with the light-emitting layer,
        the photosensitizing layer transfers energy to the light emitting layer,
        blue light emitted from the photosensitizing layer is not extracted from the anode or the cathode or from the device,
        the device does not comprise a filter for producing red light from an emission of white light; and
        only red light generated in the light emitting layer is extracted from the device.

2. The organic electroluminescent device according to claim 1, wherein the polycyclic aromatic hydrocarbon compound is selected from the group consisting of pyrene, benzopyrene, chrysene, naphthacene, benzonaphthacene, dibenzonaphthacene, perylene and coronene.

3. The organic electroluminescent device according to claim 1, wherein a compound represented by the following general formula (1) is used as the host material of the light-emitting layer:

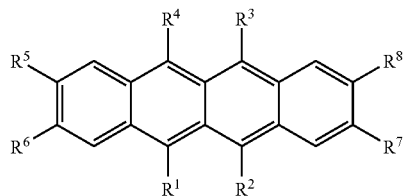

General Formula (1)

wherein $R^1$ to $R^8$ each independently represents hydrogen, a halogen, a hydroxyl group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a cyano group, a nitro group, a substituted or unsubstituted silyl group having not more than 30 carbon atoms, a substituted or unsubstituted aryl group having not more than 30 carbon atoms, a substituted or unsubstituted heterocyclic group having not more than 30 carbon atoms or a substituted or unsubstituted amino group having not more than 30 carbon atoms.

4. The organic electroluminescent device according to claim 1, wherein the photosensitizing layer is provided adjacent to the light-emitting layer and between the light-emitting layer and the cathode.

5. The organic electroluminescent device according to claim 1, wherein red light generated in the light-emitting layer is multiply resonated in any layer between the anode and the cathode and extracted from any one side of the anode or the cathode.

6. The organic electroluminescent device according to claim 1, wherein a perylene derivative, a diketopyrrolopyrrole derivative, a pyromethene derivative, a pyran derivative or a styryl derivative is used as the red light-emitting guest material.

7. The organic electroluminescent device according to claim 1, wherein a hole transport layer provided adjacent to the light-emitting layer has a multilayer structure comprising a first hole transport layer and a second hole transport layer each of which has different materials from each other, the second hole transport layer is adjacent to the light-emitting layer, and the second hole transport layer includes an organic material represented by the following general formula (2):

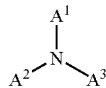

General Formula (2)

wherein $A^1$ to $A^3$ each independently represents an aryl group or a heterocyclic group.

8. The organic electroluminescent device according to claim 1, wherein a hole transport layer provided adjacent to the light-emitting layer has a multilayer structure comprising a first hole transport layer and a second hole transport layer each of which has different materials from each other, the second hole transport layer is adjacent to the light-emitting layer, and the second hole transport layer includes an organic material represented by the following general formula (3):

General Formula (3)

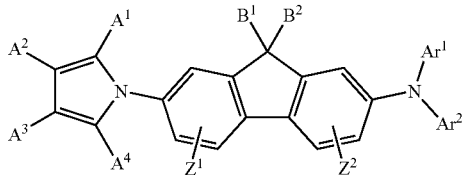

wherein
$A^1$ to $A^4$, $Z^1$ and $Z^2$ each independently represents hydrogen, a halogen, a hydroxyl group, a carbonyl group, a carbonyl ester group, an alkyl group, an alkenyl group, an alkoxyl group, a cyano group, a nitro group or an amino group,
$A^1$ to $A^4$ may constitute a cyclic structure in a site adjacent to each other,
$Ar^1$ and $Ar^2$ each independently represents an aryl group or a heterocyclic group, and
$B^1$ and $B^2$ each represents hydrogen, an alkyl group, an aryl group or a heterocyclic group.

9. The organic electroluminescent device according to claim 1, wherein a hole transport layer provided adjacent to the light-emitting layer has a multilayer structure comprising a first hole transport layer and a second hole transport layer each of which has different materials from each other, the second hole transport layer is adjacent to the light-emitting layer, and the second hole transport layer includes an organic material represented by the following general formula (4):

General Formula (4)

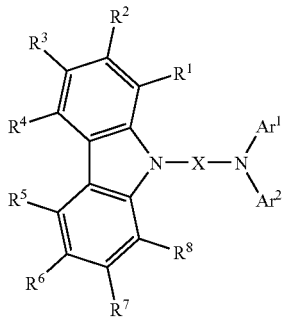

wherein
$Ar^1$ and $Ar^2$ each independently represents an aryl group or a heterocyclic group,
$R^1$ to $R^8$ each independently represents hydrogen, a halogen, an alkyl group, an aralkyl group, an alkenyl group, a cyano group, an amino group, an acyl group, an alkoxycarbonyl group, a carboxyl group, an alkoxy group, an aryloxy group, an alkylsulfonyl group, a hydroxyl group, an amide group, an aryl group or a heterocyclic group and may constitute a cyclic structure in a site adjacent to each other, and
X represents a divalent aromatic ring group.

10. A display apparatus comprising a substrate having thereon a plural number of red light-emitting, organic electroluminescent devices comprising
an anode;
a cathode; and
an organic layer,
wherein,
the organic layer comprises (i) a light emitting layer comprising a red fluorescent light-emitting guest material and a first host material, the first host material comprising a polycyclic aromatic hydrocarbon compound having a skeleton with a 4 to 7 membered ring, and (ii) a photosensitizing layer comprising a blue light-emitting guest material and a second host material,
the light-emitting layer is provided between the anode and the cathode of the red light-emitting, organic electroluminescent devices,
the photosensitizing layer is provided adjacent to and in contact with the light-emitting layer of the red light-emitting, organic electroluminescent devices,
the photosensitizing layer transfers energy to the light emitting layer of the red light-emitting, organic electroluminescent devices,
blue light emitted from the photosensitizing layer is not extracted from the anode or the cathode of the red light-emitting, organic electroluminescent devices or from the red light-emitting, organic electroluminescent devices,
the plural number of red light-emitting, organic electroluminescent devices do not comprise a filter for producing red light from an emission of white light; and
only red light generated in the light emitting layer is extracted from the plural number of red light-emitting, organic electroluminescent devices.

11. The display apparatus according to claim 10, wherein the organic electroluminescent device is provided as a red light-emitting device in a part of plural pixels.

12. The display apparatus according to claim 11, wherein the photosensitizing layer of the organic electroluminescent device covers a plurality of pixels so as to function as a common light-emitting layer.

13. The display apparatus according to claim 11, wherein an organic electroluminescent device for emitting blue light and an organic electroluminescent device for emitting green light are provided together with the red light-emitting device.

* * * * *